United States Patent
Hiramatsu et al.

(10) Patent No.: US 7,295,592 B2
(45) Date of Patent: Nov. 13, 2007

(54) LIGHT SOURCE DEVICE AND OPTICAL COMMUNICATION MODULE EMPLOYING THE DEVICE

(75) Inventors: Takuma Hiramatsu, Tenri (JP); Atsushi Shimonaka, Nara (JP); Naoyuki Morimoto, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 543 days.

(21) Appl. No.: 10/507,003

(22) PCT Filed: Mar. 3, 2003

(86) PCT No.: PCT/JP03/02418

§ 371 (c)(1),
(2), (4) Date: Sep. 8, 2004

(87) PCT Pub. No.: WO03/077389

PCT Pub. Date: Sep. 18, 2003

(65) Prior Publication Data

US 2005/0226636 A1  Oct. 13, 2005

(30) Foreign Application Priority Data

Mar. 8, 2002 (JP) .............................. 2002-063942

(51) Int. Cl.
*H01S 3/08* (2006.01)
(52) U.S. Cl. .................... 372/101; 372/50.23
(58) Field of Classification Search ............... 372/101, 372/50.23
See application file for complete search history.

(56) References Cited

FOREIGN PATENT DOCUMENTS

| | | |
|---|---|---|
| JP | 48-102585 | 12/1973 |
| JP | 59-112665 | 6/1984 |
| JP | 7-99345 | 4/1995 |
| JP | 8-236873 | 9/1996 |
| JP | 8-264885 | 10/1996 |
| JP | 2927044 | 5/1999 |
| JP | 2000-200928 | 7/2000 |
| JP | 2001-148515 | 5/2001 |
| JP | 2001-156378 | 6/2001 |
| WO | 00/33390 | 6/2000 |
| WO | WO 00/33390 | * 6/2000 |

OTHER PUBLICATIONS

Mandel & Wolf, Optical Coherence and Quantum Optics, 1995, Cambridge University Press, Chapter 5, "Radiation From Sources of Any State of Coherence"; pp. 229-333.

* cited by examiner

*Primary Examiner*—Dung (Michael) T. Nguyen
(74) *Attorney, Agent, or Firm*—Nixon & Vanderhye, P.C.

(57) ABSTRACT

A light source device for radiating a stimulated emission from a semiconductor laser to outside via a multiple scattering optical system, which system has a first region located adjacent to the semiconductor laser and a second region that abuts on the first region and reaches the outside. The first region contains scatterers at a higher density than the second region does. The light source device has an amount of near-field pattern speckles $\sigma_{PAR}$ of $3 \times 10^{-3}$ or more. The second region may have a lens portion as a magnifier for at least a principle part of a secondary planar light source formed at an interface between the first and second regions.

21 Claims, 19 Drawing Sheets

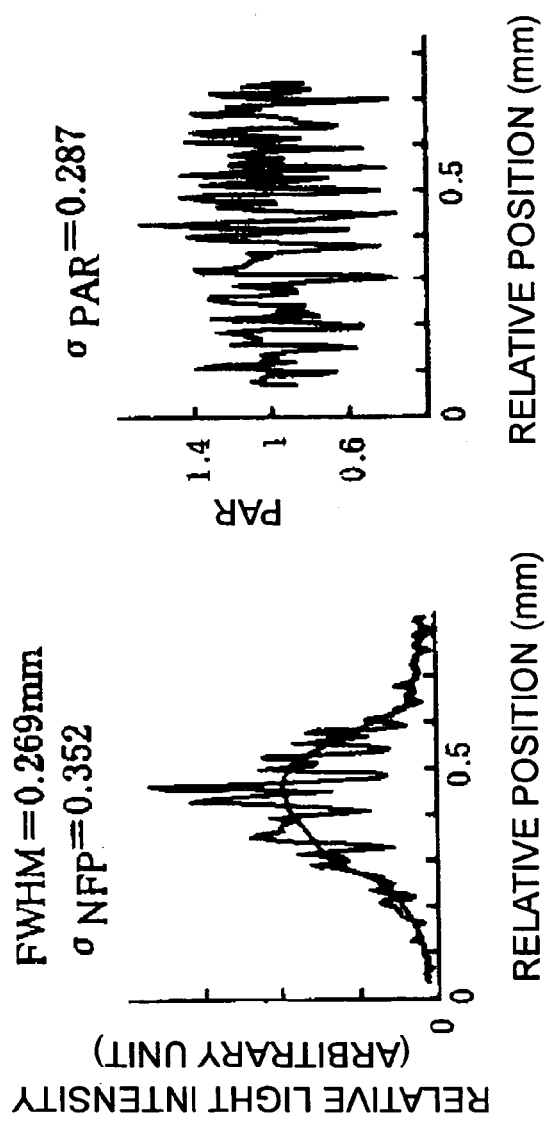

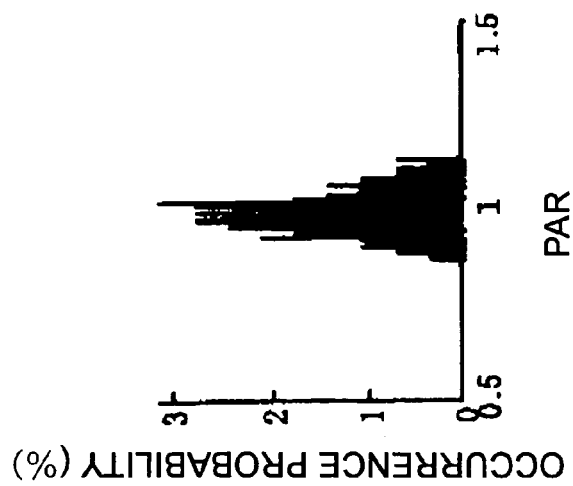
Fig. 3G
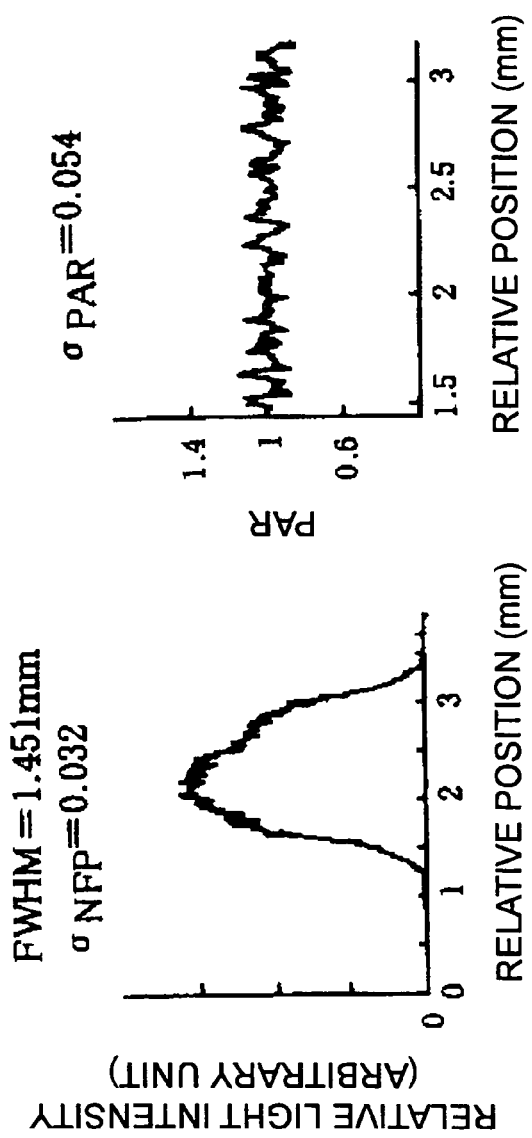
Fig. 3F
Fig. 3E $L = \overline{AB} + \overline{BC}$

LIGHT SOURCE DEVICE AND OPTICAL COMMUNICATION MODULE EMPLOYING THE DEVICE

This application is the US national phase of international application PCT/JP03/02418 filed 3 Mar. 2003, which designated the US and claims priority to JP Application No. 2002-63942 filed 8 Mar. 2002. The entire contents of these applications are incorporated herein by reference.

TECHNICAL FIELD

The present invention relates to a light source device resin-sealed by transfer molding, potting or the like so that the device is provided with an optical lens function, and to an optical communication module that employs the device.

BACKGROUND ART

In recent years, infrared communication modules conforming to the IrDA (Infrared Data Association) standard have been rapidly scaled down in size, and the product of a short distance (20 cm) specification has its lens portion diameter and height reduced to about 1 mm to 2 mm. Concerning the communication speed, there is a gradual increase in speed with regard to IrDA, while compatibilities of a communication distance of several meters with high-speed characteristics of up to about 100 Mbps between a base station where a sufficient quantity of light is provided by arranging parallel twenty or more bullet type LED's and a terminal unit that has a sharp directivity and a tracking function are being established in optical wireless LAN products.

Such the wireless optical communication technique, which also has a problem of directivity and shielding, is expected to develop its applications as a high-speed interface of a palmtop or hand-held type portable terminal unit taking advantage of its high-speed characteristic, secrecy and particularly advantages in terms of cost. However, the high-speed optical wireless LAN (Local Area Network) products generally have a large size and considerably large power consumption. Moreover, there have been not a few attempts to use a comparatively inexpensive semiconductor laser of a near infrared wavelength region for wireless optical communications by making the semiconductor laser eye safe attaching importance to the high-speed performance in the past. However, there have been used comparatively large-scale diffusers and beam-shaping optical systems, and it has been difficult to achieve scaledown in size and low cost equivalent to those of the products conforming to IrDA.

That is, there has not yet been put to practical use a small-sized inexpensive optical communication module necessary for achieving a wireless optical communication system that buries the gap between the two of the existing IrDA and the optical wireless LAN and has a higher-speed wider-range communication area.

DISCLOSURE OF THE INVENTION

Accordingly, an object of this invention is to provide a light source device which, with a simple construction, is capable of obtaining a high light output efficiency while securing eye safety even if a high-power semiconductor light-emitting device is employed, and allowing reduction in power consumption, size and cost to be achieved and suitable for a high-speed optical communication system that covers a wide communication area, and to provide an optical communication module that employs the device.

For the last few years there has been significant progress in the technology of increasing the output of the GaAs-based semiconductor laser of the near infrared region (780-nm band and 980-nm band) used for high-speed CD-R/RW drives and fiber amplifier excitation light sources. At present, there have been achieved a high power on the level of 100 mW to 300 mW of CW (Continuous Wave) and reliability of not shorter than several thousands of hours in single basic transverse mode operation with a narrow stripe width of about 2 μm to 6 μm. Moreover, an InGaN-based semiconductor laser, which has an emission wavelength in the blue or ultraviolet region, has also been developed for practical use, and a high power of not smaller than 30 mW usable as a light source for writing the next-generation optical discs has become able to be stably obtained.

In an application in which a beam is emitted into a free space, the eye safety prescribed by an international safety standard IEC60825-1 and a Japanese standard JIS C6082 and so on must be satisfied. Particularly, in the applications to consumer equipment, there is demanded the Class 1 level eye safety according to which no risk of depriving a human being of his or her eyesight is caused even when the output light from a light source directly enters a human eye via some optical system.

Accordingly, if the eye safe technology for converting the output light of a high-power semiconductor laser like the aforementioned one without loss to a specific apparent light source size is established, then a key device for the next-generation wireless optical communication as previously described is achieved. The present applicant paid attention to the technology of reducing the spatial coherency by three-dimensionally introducing a scattering material into a resin sealed module or a transmission lens as an elemental technology for the purpose.

In the field of a light-emitting diode (LED) that is an incoherent light source, it is well-known that various powder materials (so-called fillers) are mixed in the sealing resin according to the purpose of improving the luminance unevenness, wavelength conversion for a white LED and so on. Good examples can be found in, for example, JP 59-112665 A and JP 2000-200928 A. However, there exists no example in which the scattering material (filler) technology is examined in detail from the viewpoint of reducing the high spatial coherency in a small-sized light source device equipped with a semiconductor laser so long as the present applicant knows.

On the other hand, in the fields of coherent optics and lighting optics, the fact that an identical radiant intensity distribution can be constituted of an arbitrary planar light source having a varied spatial distribution of the degree of coherence is known as "Equivalence Theorem of Planar Source" (refer to, for example, Mandel & Wolf, Optical Coherence and Quantum Optics, 1995, Cambridge University Press, Chapter 5). That is, it is theoretically possible to constitute an optical system so that the angular distribution of the radiant intensity is not different from that of a semiconductor laser by diffusing the output light of the semiconductor laser through some scatterer.

However, it is general to change locally and at random the phase and the scattering angle of incident light of scatterers utilized in applications or implementations in the aforementioned field by utilizing the roughness and configuration of the surface or interface as represented by a diffuser made of a frosted glass or a hologram relief. These are optical elements independent of the light source element and need a separate fixation means and a space therefor. Therefore, the entire light source cannot help becoming bulky (increased in volume). Otherwise, although the techniques of rotating the diffuser around the axis and forming a dynamic diffraction grating by applying ultrasonic waves to a liquid or the like are also utilized, the optical system naturally comes to have a larger scale.

Moreover, when the properties of an optically thick sample tightly stuffed with scatterers such as a biological tissue is analyzed, a forward scattering characteristic is generally examined with a transparent arrangement. Researches on the characteristics of the attenuation of coherent scattering light component, depolarization and so on of individual samples of various types of particles, bloods, tissues and so on as fundamental data have been accumulated. However, there have been scarcely conducted researches for systematically expressing a method for constituting a multiple scattering optical system from the viewpoint of making the coherency of the laser light source effectively disappear in a minute volume as desired in this invention.

There has conventionally been an attempt to reduce the cost by adopting a resin mold package instead of a hermetically sealed CAN package that is the mounting form of an ordinary semiconductor laser. Reference should be made to, for example, JP No. 2927044 and JP 08-236873 A. However, these technologies are based on a major premise that the high spatial coherency originally possessed by the semiconductor laser is retained for applications to the image formation optical systems of optical discs and so on, and the purport, applications and technical backgrounds of them largely differ from those of the multiple scattering optical system to which this invention is directed.

This application discloses various methods for actually manufacturing and putting into practice a small-sized light source device and a component module, which are equipped with a high-power semiconductor laser and able to emit the output light safely to the outside as described hereinabove. According to the construction disclosed in this application, in a module that has an apparent light source size of a diameter of, for example, 1 mm and of which the spatial coherency is sufficiently reduced, there is formed a beam controlled so as to emanate to a free space at a full-width-at-half-maximum radiation angle of 30°. In this case, conforming to the international safety standard IEC 80625-1 Amendment 2, an optical output of a maximum of about 150 mW at CW is permitted in, for example, a wavelength band of 850 nm. In practice, a light source for a wireless optical communication module would be conceivably a high-efficiency subminiature light source which satisfies specification requirements of Class 1 level eye safety, a radiation angle that is wide to some extent and is not too wide (e.g., $60° \geq$ full-width-at-half-maximum radiation angle $\geq 30°$), restrained unnecessary wide-angle radiation (skirt trailing), a peak output of 120 mW at a drive current of not greater than 140 mA, and a module total thickness of not greater than 3 mm.

Accordingly, the present inventors examined in detail a method for using a multiple scattering optical system in which scatterers were dispersed at a high density in a specified region inside a structure in order to constitute a light source device that satisfactorily controlled the radiant intensity distribution while reducing the coherency of the output light from a semiconductor laser inside an extremely minute three-dimensional structure that typically had a dimension of not greater than about one millimeter to several millimeters typically in the axis direction of the output light. Particularly, with regard to the correlation between an optical depth or a mean free path and transport free path in the minute three-dimensional structure depending on the diameter, refractive index and dispersion density of the scatterers, and speckles generated as a consequence of random interference process and further with regard to the upper limit and the lower limit of a practicable dispersion density range, detailed examinations were repetitively carried out to find the conditions that satisfy the Class 1 eye safety. Moreover, comparison to the scattered light optical system using a diffuser and comparison to the case where an LED, an SLD (Super-Luminescent Diode) of a low coherency, or a broad area semiconductor laser is used as a light source device were systematically carried out.

As a result, it was found that the speckles were extremely effectively reduced and compatibilities with the other optical characteristics could be established by using various evaluation methods and constituent means of the optical system disclosed in this invention although a speckle pattern on a serious level could be generated with regard to the eye safety and the uniformity of radiant intensity in the near-field pattern and the far-field pattern in the minute multiple scattering optical system that employed a high-power semiconductor laser provided with the narrow-stripe optical waveguide structure. Conversely, the constituent means of the multiple scattering optical system can also be preferably applied to a light source element other than the high-power semiconductor laser. For example, there can be enumerated a broad area semiconductor laser, a surface emitting laser (VCSEL: Vertical Cavity Surface Emitting Laser) and their array bars, two-dimensional arrays, phased arrays and so on. Furthermore, the constituent means of the multiple scattering optical system can restrain the optical loss to an extremely small level, and this arrangement is therefore effective also in achieving eye safe by enlarging the apparent light source size of the light source element that is a light source element of a comparatively low timewise coherency like SLD and has a light emission spot smaller than that of an ordinary LED (e.g., several hundreds of micrometers square) with an optical waveguide structure.

If a semiconductor laser of a material system capable of oscillating in the so-called intermediate or far infrared region or a quantum cascade structure is employed, it is possible to secure eye safety even if intense near-field pattern speckles remain. However, for communication use, speckles particularly in the far-field pattern possibly become practically a serious problem. Therefore, it is required to sufficiently reduce the speckles of both the far-field pattern and the near-field pattern. Although the far-field pattern speckles also tend to be fundamentally reduced by taking measures for reducing the near-field pattern speckles, the speckles of the far-field pattern might be saturated on the level of some improvement. However, in the case where eye safety is secured, the condition can be regarded practically allowable unless a disturbance (speckle amplitude fluctuation) that falls below the halfpower occurs at an angle within a range of the half-value angle (radiation angle at which the halfpower of peak intensity is achieved) of the radiant intensity.

With regard to the speckles of the near-field pattern, an optical system made cloudy with the scattering material, which at first glance seems to have a low light-concentrating property at a glance and provokes a feeling of security, might therefore rather jeopardize the human body. Moreover, even in the case where a diffuser or a hologram optical element designed comparatively smartly is employed, it is not easy to make the speckles completely disappear.

For reference, FIG. 16 shows the construction of an optical system in which the spatial coherency of a semiconductor laser is reduced by employing so-called the diffuser seen in JP 08-264885 A. As shown in FIG. 16, a semiconductor laser 1600 is fixed on a stem 1601 by die bonding, and electrical connection is achieved by wire bonding. Then, a cap 1602 that covers the stem 1601 equipped with the semiconductor laser 1600 is provided with a sealing member 1603 that serves as a diffuser in place of an ordinary low-reflectance coated glass. One surface of the sealing member 1603 is formed into an appropriate roughened surface to reduce the spatial coherency of outgoing light from the semiconductor laser 1600. The diffuser is thinly formed by using the etching and hologram technologies for a transparent semiconductor substrate, constituting a small-sized light source device. The near-field pattern and the far-field pattern of this light source device were evaluated by a method as described later, and there was some case where the speckles of the far-field pattern can be produced within a permissible range. However, a wide-angle component greater than the half-value angle was large in the radiant intensity distribution (FFP), and the radiant intensity on the axis was reduced by 20 percent or more at maximum with respect to the FFP of an ideal Gaussian configuration. Furthermore, it was discovered that extremely large speckles were generated in the near-field pattern and satisfying the Class 1 eye safety was difficult even when the scattering plane of the diffuser was improved.

According to the construction of FIG. 16, the stimulated emission from the semiconductor laser 1600 reaches the scattering plane of the sealing member 1603 via a sealing gas region 1604 where the light is neither absorbed nor scattered and is radiated as scattered light 1605 into a free space. When the diffuser of which the surface is roughened is employed, the scattering frequency that the laser beam undergoes is extremely few and typically about one to a few times at most. Therefore, the spatial coherency is not lost at least in a local region on the level of the particle size of the roughened surface of the sealing member 1603, and remarkable speckles are generated in the near-field pattern by interactions inside the particles or between adjoining particles. Moreover, when the diffuser of which the surface is roughened is employed, the apparent light source size is geometrically determined by the radiation angle characteristic of the laser element and the distance to the scattering plane. Therefore, it becomes practically difficult to enlarge the size to the desired size in a small-sized light source device of which the dimensions of portions are prefixed. Conversely, if it is tried to obtain a large light source size, the distance between the laser element and the scattering plane cannot help being made large.

If the output light from a minute light source that has such near-field pattern speckles is incident on an eyeball via (or not via, depending on the situation) some optical system, then the concentration of local power or energy density is incurred by the minute structure of the speckles included in the image focused on the retina, possibly causing retina thermal injury peculiar to the laser light source. Therefore, it is desired to scale down the size of the structure of the speckle pattern to a level lower than the natural movement of the eyeball in a fixation state and reduce the timewise and spatial coherency until the disturbance amplitude becomes unable to be obviously observed.

In general, the human eyeball is involuntarily moving without stopping even when staring at one point. Three components of flick (one leap in an interval of about 0.03 seconds to 5 seconds at an angle of about 20 minutes), drift (drift at about 0 to 30 minutes per second) and tremor (tremor at about 15 minutes at 30 Hz to 100 Hz) are generally called the flicks. The position of the image on the retina is quivering several tens of times per second with an amplitude of about several tens of micrometers as a high-frequency component, and the quantity of this movement agrees with the fact that recognizing the contrast of parallel stripes of several tens of lines or more per millimeter in terms of spatial frequency is generally difficult.

In the light intensity spatial distribution of the typically observed speckles in a perilous state, minute structures of a sharp fall to or below 1/e (e: base of natural logarithm) of the maximum value thereof are spatially two-dimensionally distributed at random. Particularly, when numbers of minute peak spots that have a span equivalent to the amount of movement (not smaller than about 10 µm) of the image on the retina due to the vibration components of about 100 Hz or up to about 0.1 mm are contained in the near-field pattern, the energy density per unit area at each spot becomes increased to, for example, five or more times the average value, possibly exerting serious influence on the retina.

Under the situation in which the light source size is enlarged by taking some measures for reducing the spatial coherency against the laser light source, an essential difference concerning eye safety from that of LED is narrowed down to the above-mentioned point. When a beam from a certain light source is concentrated on the retina via some light concentrating optical system, the image spot size is strongly influenced by the chromatic aberration of the light concentrating system. Actually, the reason why light having a wide continuous spectrum range of LED or the like cannot be concentrated on the neighborhood of the wavelength limit is largely ascribed to the influence of the chromatic aberration as well as low spatial coherency. Although the latter is not considered by the current safety standard and is hard to formulate, the means and effects of this invention, which is mainly intended for a laser light source, suffer no alteration. It is a matter of course that the invention can also be suitably used for enlarging the light-emitting spot of an LED where no speckle occurs and a light source element (e.g., SLD) that has another optical waveguide structure without loss.

The situation, in which the near-field pattern of a single plane light source includes speckles as described above, differs from a consideration for an array light source by IEC60825-1 standard or the like in the following points. That is, the optical power included in each individual speckle spot shares only a small rate to the total output from the laser or the optical power possessed by the entire planar light source. An increment in the local energy density or power density at each spot is expressed by the ratio of a local maximum value of PAR (Peak-to-Average Ratio) to the peak spot area. Therefore, if a reduction in each individual speckle spot size to or below the level of the aforementioned tremor and a reduction in the amplitude of fluctuation from the expected value (=1) of PAR typically to or below the level of one hundredth are made compatible, it is possible to secure the Class 1 level eye safety equivalent to that of an LED light source that has the same apparent size.

The features of the objective minute multiple scattering optical system of this invention and the problems to be solved are listed as follows.

First of all, a first feature is that light incident on the multiple scattering optical system can be regarded almost as a beam emitted from a point light source. With regard to the entire light source device, there is supposed the construction of an integrated body including a light source and also its exterior as a microoptical system formed on a resin substrate, a lead frame or a stem. Therefore, it is not permitted to carry out optical operation for reducing the spatial coherency so as to make a beam incident on a multiple scattering region after the beam diameter is expanded to or larger than several millimeters by means of a beam expander, as generally carried out in an ordinary coherent optical system.

As a second feature, an extremely small optical system of which the geometrical distance from the light source to the exterior is about one millimeter to several millimeters in a multiple scattering optical system is thought of. Therefore, it is not permitted to constitute an optical system arbitrarily elongated in the optical axis direction in order to increase the scattering frequency. Moreover, it is difficult to adopt a construction that has difficulties or impossibilities in the formation of integrated components such as movable sections and composite lens systems. In addition, the fact that the accuracies of processes and constituent elements tend to be insufficient due to the small size of the entire optical system also adds difficulties to the solution of the problems.

As a third feature, the light source element to be employed should preferably be a high-power semiconductor laser of a single transverse mode having a comparatively narrow stripe width of about 1 μm to 10 μm. By employing such a light source, a remarkable reduction in the current consumption and a high power that has conventionally been impracticable can be made compatible with high speed in comparison with the case where a light source of LED, SLD or the like of a low coherency having a continuous wavelength spectrum distribution is employed.

However, in the case where the ordinary narrow-stripe semiconductor laser operates at or above the milliwatt level, the spectral linewidth is typically about 10 MHz, and the coherence length (maximum optical path difference interferable by two light waves divided in amplitude) is about several tens of meters. During high-power operation of not smaller than several tens of milliwatts, the line width is generally narrowed in proportion to the reciprocal of the output. However, according to circumstances, it is sometimes the case where the spectral linewidth is extended to or greater than about 10 MHz and the coherence length becomes equal to or smaller than about several meters due to the effects of the nonlinearity of hole burning (local gain saturation due to the nonuniformity of the electric field intensity distribution in the cavity) in the axis direction or the stripe transverse direction ascribed to interactions between longitudinal modes, gain saturation and a standing wave effect. Anyway, the coherence length of an ordinary laser, in which no compulsory frequency modulation is carried out by an external cavity or the like, is far longer than the dimensions of the optical system supposed in this invention.

In order to make the speckle pattern essentially disappear in solving the aforementioned problems, the sufficient condition is to provide a state in which the distribution of the scattering optical path length in the multiple scattering region is made sufficiently longer than the coherence length peculiar to the semiconductor laser, and the scattered light component outputted from the multiple scattering optical system timewisely loses coherence. This does not always mean that the total length itself of the optical system is required to be longer than the coherence length. That is, it is possible to extend the actual scattering optical path length (or its average value) a few times or several tens of times the geometrical length by higher-order multiple scattering or to intentionally extend the line width of the semiconductor laser by some technique.

However, even if the timewise coherence of the semiconductor laser itself is reduced to a certain extent by adopting a special device structure, the reduction does not contribute to the improvement of eye safety in the situation that it is still spatially regarded almost as a point light source. On the other hand, it is not easy to extend the total optical path to or longer than the coherence length of the semiconductor laser even when the spatial coherency is reduced by adopting a minute multiple scattering optical system as in this invention and repeating wave front splitting. If the parameters of the volume of the scattering region, the type, size, dispersion density and so on of the scatterers are changed, then the speckle pattern accomplishes drastic transfiguration according to the change in the scattering optical path length distribution, and accordingly, a means to control this is needed.

As described hereinabove, there exists no reference document that clarifies the problems possibly occurring in controlling the timewise and spatial coherency and the radiant intensity of a semiconductor laser intended for a static multiple scattering optical system in which scatterers are dispersed at a high density in an extremely minute region inside a three-dimensional structure and specifies a concrete indicator and an optimization example of the parameters of the scatterer, the influence of the reflective surface included in the scattering optical path and the design of the entire multiple scattering optical system so long as the present applicant knows. This invention discloses various means for extending the scattering optical path length or various means for more effectively reducing the spatial coherency in a minute multiple scattering optical system and achieves a speckle reduction sufficient for securing eye safety.

In the multiple scattering optical system of the minute three-dimensional structure, there is a variety of parameters of its portions, and the optimization of the parameters is accompanied by difficulties more serious than in the case of a single diffuser or the like. For example, if the scatterer density is increased throughout the entire multiple scattering optical system in order to remove the aforementioned problems of speckles, then the skirt component trailing outwardly of the half-value angle significantly appears in terms of the radiant intensity to the outside, and the operating power is significantly increased, consequently losing the practicability of the light source device. Moreover, when the scatterer density is too high, the transmitted light toward the optical axis direction is shielded, and an output usable as a light source cannot sometimes be sufficiently obtained. This invention provides various means for not only restraining the speckles of the near-field pattern and the far-field pattern to a level that poses no problem but also adjusting the angular distribution of the radiant intensity of light emitted to the outside via a multiple scattering optical system without impairing the optical output usable as a light source device.

Next, individual means for achieving the multiple scattering optical system that sufficiently restrains the problems of speckles while irreversibly expanding the near-field pattern and has the desired optical characteristics in a minute light source device that releases stimulated emission of light from the semiconductor laser to the outside via the multiple scattering optical system that is integrated with a semiconductor laser by surrounding the laser are disclosed, and the operation of the means will be described.

In order to accomplish the above object, the present invention provides a light source device having a light source element from which output light is emitted to outside via a multiple scattering optical system, wherein the multiple scattering optical system includes at least a first region that is located adjacent to the light source element, and a second region that abuts on the first region and reaches the outside, of the first and second regions, at least the first region contains scatterers, a density of the scatterers in the first region is higher than a density of scatterers in the second region, and the light source device has an amount of near-field pattern speckles $\sigma_{PAR}$ that is within a range of:

$$\sigma_{PAR} \geq 8 \times 10^{-3}.$$

The light source element may preferably have an optical waveguide structure. The second region may have a lens portion. Alternatively, the second region may preferably serve as a magnifier for at least a principal portion of a secondary planar light source formed at an interface between the first region and the second region.

According to the light source device of the above-mentioned construction, by generating mainly in the first region the multiple scattering that sufficiently reduces the spatial coherency of the output light from the light source element and controlling the angular distribution characteristic of the radiant intensity mainly by the magnifier of the second region, the optimization of each portion can be separately carried out. Concretely, in a typical situation in which coherent light is emitted with a full width at half maximum of approximately 5° to 20° (junction direction) and about 10° to 40° (layer direction) into the base material of the first region located adjacent to the semiconductor laser from, for example, a high-power semiconductor laser, the scatterers having an appropriate scattering characteristic are dispersed at an appropriate density so that in the first region the light undergoes sufficient of multiple scattering of a frequency of not smaller than a few times as a transport optical depth described in detail later. With this arrangement, the wave front of the laser beam is divided into an extremely large number of parts and efficiently diffused even inside a minute volume, and the crossing angle between scattering paths statistically expands. Therefore, a local peak, which has an expansion of about 0.01 mm to 0.1 mm that possibly causes a problem particularly for eye safety, is scaled down and made indistinct in the near-field pattern. The probability distribution of the amplitude of PAR (Peak-to-Average Ratio) is regarded as a Gaussian distribution, and the deviation $\sigma$ of PAR is reduced to an extremely low level of not greater than $10^{-1}$ or not greater than $10^{-2}$. As described above, through the sufficient multiple scattering in the first region located adjacent to the semiconductor laser, a single secondary planar light source expanded to a finite size is formed at the interface between the first region and the second region, and a global spatial coherency is lost when the secondary planar light source is viewed as a whole. The laser beam radiated from the secondary planar light source is made incident on the second region with an almost complete Lambertian radiant intensity distribution as a consequence of the multiple scattering.

Further, the lens portion should desirably be provided so as to form an enlarged virtual image of the object (planar light source in this case) placed in the vicinity of the front focal point as a magnifier for at least the principal portion of the secondary planar light source. That is, when the secondary planar light source is observed from outside, the light source side focal point of the magnifier is located deeper than the secondary planar light source so that the second region forms an erected virtual image of the secondary planar light source. Typically, the interface between the first and second regions is arranged shifted ahead of the focal point on the optical axis so that at least the principal portion of the secondary planar light source settles inside the solid angle covering a span from the focal point to the lens portion of the second region.

As described above, by constituting the second region in contact with the first region, the probability of the occurrence of local overlap of optical paths at a low angle can be reduced through the process of converting the near-field pattern of the secondary planar light source into the far-field pattern in the second region while expanding the near-field pattern by the multiple scattering and efficiently collecting also the scattered components to a wide angle. Therefore, a beam pattern that has a high uniformity of radiant intensity and satisfactory sharpness is formed while restraining the speckles of the near-field and far-field patterns even when a semiconductor laser is employed as the light source element, and a preferable optical characteristic and the securing of eye safety can be made compatible even in a minute multiple scattering optical system.

As described above, the output light from the light source element has its spatial coherency reduced through the first region and its radiant intensity distribution finally shaped in the lens portion owned by the second region and then emitted to the outside. A free space is normally supposed as the outside of this second region. That is, the final output light can be emitted into a space such as the atmosphere, a vacuum chamber or the cosmic space free from an object that interrupts the optical path. Otherwise, if the lens portion can achieve the desired beam shaping, the second region may be made of a medium that has another refractive index, such as various resins, plastics, water and so on. Moreover, the outside of the second region may be subjected to some modification, which is not described in detail in the present specification, such as shaping of the outside itself of the second region or an enclosure of the second region by a frame, a container or the like. Even when the output light leaks as a consequence of the removal or damage of such things, the eye safety of the light source device can be secured quite similarly.

Moreover, this light source device can be suitably used for a wireless optical communication module that incorporates a near infrared high-power semiconductor laser, a small-sized video projector that incorporates a blue-violet to ultraviolet semiconductor laser formed into a white light source by means of scatterers that have a wavelength conversion function and so on.

In this light source device, the scatterer density allowed to be included in the second region of the multiple scattering optical system should preferably be not greater than 1/10 of the density of the scatterers included in the first region. Moreover, a filler material different from the scatterers of the first region may be dispersed at a density deviating from the above-mentioned density range so long as the material does not have the function of scattering the output light from the light source element. Anyway, it is preferable that the output light from the light source element undergoes scattering at most only a few times in average or does not undergo scattering at all in the second region. With this arrangement, a beam optical system, in which the operation of the multiple scattering region is effected mainly in the first region and of which the uniformity is satisfactory with the unnecessary skirt restrained from trailing outwardly of the half-value angle of the radiant intensity, is constituted compatibly with the securing of eye safety.

In one embodiment, assuming that a size parameter q, which represents a relation between a particle size mode Ds of the scatterers and a center wavelength λ in a base material of the first region of the light source element, is expressed by:

$$q=(2\pi/\lambda)\cdot(Ds/2),$$

then the particle size mode Ds of the scatterers is within a range that allows the size parameter q to fall within a range of approximately 1-50, and at least the first region includes a portion where the scatterers are dispersed at a high density so that an average nearest neighbor distance of the scatterers becomes equal to or smaller than twenty times the particle size mode Ds of the scatterers.

It is known also from a classic scattering theory that a scattering characteristic of a comparatively high isotropy and a large cross-sectional area can be obtained in a boundary between Rayleigh scattering and Mie scattering. However, through detailed examinations of the speckle pattern in the multiple scattering optical system, it was found to be preferable for the scatterers of which the asymmetry of the scattering amplitude was small (backscattering components was few although the isotropy was high) and in which scattering preferable for constituting the first region was made possible to typically have a size parameter q of 1 to 5 and particularly mainly about 1 to 10. Otherwise, in the construction of a certain kind of minuter multiple scattering optical system, it is sometimes preferable that the size parameter q is mainly about 10 to 50 for an intentional increase in the forward scattering components. Moreover, it is sometimes preferable to disperse scatterers that have different materials or particle size distributions in mixture so that a plurality of particle size distribution peaks are provided within the above-mentioned range. It was found to be sufficiently effective to set the size parameter q like this for a light source element that had a continuous wavelength spectrum expansion of several tens of nanometers like SLD, a semiconductor laser that oscillated in multiple modes over several tens of nanometers or the like. That is, by setting the size parameter q to the center wavelength of the output light, the spatial coherency can be reduced extremely effectively, and the near-field pattern can be irreversibly expanded.

With regard to the absolute value Δn of the refractive index difference between the scatterers and the medium in the first region, mainly used scatterers should provide typically a value of not smaller than 0.1 or more and desirably a value of not smaller than 0.15. In some cases, preferable result can be obtained by mainly using scatterers with which the refractive index difference Δn is not smaller than about 0.05 in a certain kind of multiple scattering optical system. Furthermore, it is preferable to select the size parameter q such that the product Δn·q falls within a range of approximately 2 to 8 and especially assumes a value near 3. Since the angular distribution of the scattering amplitude of each individual scatterer does not strongly depend on the refractive index difference Δn, there is given a criterion to select the desirable particle species that have a small asymmetry of the scattering amplitude and also a comparatively small amount of backscattering components.

The parameters of the scatterers will be described together with the embodiments. The above-mentioned numerical limitations are caused mainly from difficulties in the minuteness of the multiple scattering optical system or a high-density uniform dispersion there and include an essential problem that should be solved inclusive of the construction of the entire multiple scattering optical system.

Furthermore, it is desired to set the scattering mean free path to about 10 μm or less in order to obtain the aforementioned sufficient multiple scattering inside the first region, which typically has an optical axis direction dimension L of one millimeter to several millimeters, in the multiple scattering optical system. As a general rule, the scattering cross-sectional area as of a single scatterer is obtained from the scattering theory, and the scattering mean free path l can be estimated from:

$$l=1/(\sigma s\cdot Ns)$$

(where Ns represents the number of scatterers per unit volume, or the number density), i.e., from the dispersion density (volume ratio or weight ratio).

Accordingly, the ratio L/l is made a parameter as an average or mean scattering frequency to be an index with a satisfactory attenuation of a ballistic straight light component in the optimization process of the multiple scattering region. On the other hand, according to the scattering angle θ and the phase function p(θ) of the single body of the scatterer, an asymmetry factor g (mean cosine) is obtained from:

$$g = \langle\cos\theta\rangle = \int_0^\pi \cos\theta \cdot p(\theta)\cdot 2\pi\sin\theta\, d\theta,$$

$$\text{where } \int_0^\pi p(\theta)\cdot 2\pi\sin\theta\, d\theta = 1$$

and the transport average or mean free path $l_{AVE}$ can be defined by:

$$l_{AVE}=l/(1-g)$$

By using this relation and making the transport optical depth $L/l_{AVE}$ a parameter, there can be provided an index of collapsing process of coherency due to the propagation of light in the optical axis direction inside the multiple scattering region. Particularly, in this light source device, it was discovered that the combinational conditions of the portions that reduced the speckles to an extremely low level and satisfied the Class 1 eye safety was able to be extracted by employing the scatterers satisfying the desirable size parameter q and using the transport optical depth $L/l_{AVE}$ as an index.

In this case, the multiple scattering optical system of this light source device can be desirably constituted by the aforementioned method on the basis of the fact that the scattering mean free path l is reduced as the scatterer density or the volume ratio is increased so long as the scatterers are spatially distributed at random. Typically, a preferable manufacturing condition can be found within a dispersion density range of about 0.5 vol % to 30 vol %. However, in the case of high density scatterers in which the scatterers can be brought in direct contact with one another, an undesirable phenomenon of possibly occurs from the viewpoint of speckle reduction. One cause is a problem of the secondary cohesion of the particles, and the other cause is the fact that the randomness is reduced due to the dense structure of the spatial distribution of the scatterers. It is important for managing the actual manufacturing process to clarify the necessary minimum dispersion density within the desired range of the scatterer particle size in order to efficiently reduce the spatial coherency by means of an optical system that is as minute as possible.

Accordingly, it was found that, by distributing the average nearest neighbor distance of the scatterers mainly dispersed in the first region so that the distance falls within about twenty times the particle size mode Ds of the scatterers, eye safety was able to be secured by generating multiple scattering a few times to several hundreds of times as the aforementioned transport optical depth $L/l_{AVE}$ in a millimeter-order extremely minute multiple scattering optical system.

In one embodiment, the first region employs a gel-like or rubber-like material as the base material.

According to the light source device of the above-mentioned embodiment, by using a gel-like material or a rubber-like material (elastomer or the like) of which the hardness after hardening is specified by the so-called penetration and JIS A hardness, the material is hardened as the first region. With this arrangement, the change with a lapse of time of the scattering characteristic due to the subsidence of the scatterers or the like is prevented, and the first region can be stably retained even when the second region is formed through the press-fitting process of resin sealing or the like as in the transfer molding process.

Moreover, by using a gel-like or rubber-like material as the base material, easily available various scatterers can be preferably uniformly dispersed also by means of a simple kneading and dispersing device that does not have a strong shear force. That is, by dispersing the scatterers having the size parameter q within a range of 1 to 50 within a density range of not greater than about 0.5 vol % to 30 vol % in the gel-like or rubber-like material, there can be found a manufacturing condition capable of obtaining a satisfactory dispersion condition in which the average nearest neighbor distance is made within about twenty times the particle size mode Ds. Typically, a volume ratio of 1 vol % to 15 vol % of the scatterers with respect to the base material is extremely effective for speckle reduction. Moreover, particularly the polymer particles, such as acrylic, styrenic, and modified silicone particles, sometimes have an extremely preferable characteristic as the scatterer of this invention, and it is possible to secure an appropriate refractive index difference and a satisfactory dispersibility to the general silicone-based gel and elastomer.

Particularly, the silicone gel, which has a comparatively high flowability before hardening and a sufficient flexibility after the hardening, is more preferable as the scattering base material. A silicone gel, which has a viscosity of not higher than about 6000 mPa·s before hardening, can be used extremely suitably for the inexpensive dispersion and kneading device of, for example, a vessel-rotating type mixer or the like. Moreover, it is preferable to increase the deviation of the particle size distribution of the scatterers dispersed at a high density within the desirable range of the size parameter in order to keep appropriate the hardness (softness) after the hardening of base material and to obtain a uniform monodispersion.

As described above, by arranging the gel-like or rubber-like material, in which the scatterers are properly dispersed at a high density and an appropriate flowability is possessed, adjacent to the light source element and hardening the material with its volume and three-dimensional configuration shaped into the desired states, there can be obtained an extremely preferable characteristic of the first region of the multiple scattering optical system. That is, it becomes possible to efficiently lose the spatial coherency of the output light in the minute volume of the neighborhood of the light source element.

In addition to the aforementioned effects, the following various effects can be obtained. That is, a stress depending on a difference in the thermal expansion coefficient that the light source element receives from other portions of the optical system is alleviated by employing the gel-like or rubber-like material as the base material, and the reliability during the high-power operation can be secured with an improved heat radiation property. Above all, when a semiconductor laser is employed, it becomes possible to generate a coherent backscattering peak occurring on the optical axis, i.e., return light to the laser emitting end surface of the semiconductor laser and control the quantity of light to a certain extent by means of scatterers (particularly by dispersion density). Typically, it was found that the timewise coherency of the semiconductor laser itself was able to be reduced by moderately promoting the increase in the spectral linewidth or the longitudinal multimode of the semiconductor laser within a range of a scattering volume ratio (dispersion density) of about 1 vol % to 30 vol %. However, there is a tendency that it is difficult to produce a high power due to typically the instability of laser oscillation caused by the intense hiding power of the scattering region when the dispersion density of the scatterers exceeds 30 vol %.

In one embodiment, the light source device includes a recess portion having a wall surface and a bottom surface that define the first region, wherein a metal layer is formed on at least part of the wall surface and/or of the bottom surface, and the light source element is directly or indirectly fixed to the bottom surface, and a surface of the metal layer formed on the at least part of the wall surface and/or of the bottom surface of the recess portion serves as a reflective surface to scattered light of the output light from the light source element.

According to the light source device of the above-mentioned embodiment, by providing the recess portion that has the wall surface and the bottom surface defining the configuration of the first region, the dimensions of the volume, the three-dimensional configuration and so on of the first region can be distinctly defined even when the first region for sufficiently reducing the timewise or spatial coherency is constructed of the gel-like or rubber-like fluid material. That is, a secondary planar light source, which has a high uniformity of intensity distribution and of which the size is definite, can be obtained by controlling the scatterer density of the first region.

Moreover, particularly the metal layer constitutes at least part of the wall surface and/or of the bottom surface of the recess portion, whereby the multiply scattered light generated in the first region that is formed and retained inside it is guided as a wave toward the second region through a dispersion port provided by the opening of the recess portion although the light is confined in the first region as a whole. Through this process, the effect that the spatial coherency is particularly remarkably reduced is produced.

In order to obtain the effect of making definite the light source size by improving the intensity distribution uniformity of this light source device and the effect of efficiently reducing the spatial coherency without impairing the output light, the reflectance of light incident on the metal layer of the recess portion is desired to be high with respect to every incidence angle. In general, the smaller the refractive index (complex refractive index real part), the smaller the critical angle of the total reflection is. Also, the greater the extinction coefficient (or the absolute value of the complex refractive index imaginary part), the higher the reflectance is obtained even within the critical angle. Therefore, the typically preferable materials that constitute the metal layer of the recess portion are the metals of gold, silver, copper and so on.

Particularly, when the silicone gel is served as the base material of the first region and the metal layer is made of silver, there can be obtained a total reflection critical angle of smaller than 10° and a large reflectance of not smaller than 90% within the critical angle with respect to the visible and infrared light. Therefore, it is practically extremely preferable to form the metal layer of the recess portion by an Ag-based plating process or an Ag paste process, and it is also preferable to carry out a plating process containing magnesium for the same reasons. In this case, there is no problem of the optical characteristic even if the surface of the metal layer is covered with a very thin natural oxide or the like, and it is needless to say that satisfactory electrical continuity can be obtained by the normal process of die bonding, wire bonding or the like.

In one embodiment, the metal layer on the at least part of the wall surface and/or of the bottom surface that define the first region is continuously formed so that substances other than the metal are not exposed in a principal portion positioned within reach of the scattered light spatially distributed in the first region.

That is, not only when the metal layer is constructed of a single layer but also when the metal layer is constructed of a plurality of layers to form a composite recess portion, the single metal layer or the plurality of metal layers are continuously formed so that other material not exhibiting the total reflection characteristic is not brought in direct contact with the principal portion. By thus constituting the first region, the scattered light spatially distributed in the first region can be effectively prevented from leaking in directions other than the optical axis direction. Therefore, the function of improving the intensity distribution uniformity of the light source device and making definite the light source size possessed by the first region and the function of efficiently reducing the spatial coherency can be obtained without causing the loss of the optical output.

In one embodiment, the surface of the metal layer formed on at least part of the wall surface of the recess portion serves as a reflective surface that changes an optical axis direction of an outgoing beam of the light source element toward an interface between the first and second regions, and the size parameter q of the first region falls within a range of approximately 1 to 15.

According to the light source device of the above-mentioned embodiment, the scattering optical path length can be extended by bending the optical axis of the first region one or more times as a whole by the surface of the metal layer formed on at least part of the wall surface of the recess portion for the generation of an increased amount of scattering. Moreover, at least initial scattering (irregular reflection) is caused by the reflection surface obtained through a simple process without considering the mirror surface of wavelength accuracy. Therefore, a multiple scattering operation sufficiently reducing the speckles can be obtained by a multiple scattering optical system of smaller dimensions (size), which meets the earnest demand for reduction in size.

In this case, the probability of the existence of a light ray approximately parallel to the optical axis of the magnifier of the second region is relatively increased immediately after the conversion of the optical axis in the first region. Therefore, the scatterers mainly dispersed in the first region should desirably have a comparatively small particle size of a size parameter q within a range of 1 to 15 and particularly within a range of 1 to 10, so that the asymmetry factor g (mean cosine) is apart from one (1) and becomes close to or in excess of the complete Lambertian value (2/3). With this arrangement, an optical output capable of being utilized as a light source can be efficiently obtained by effectively attenuating the ballistic straight light component and restraining the backscattering component. The scatterers should preferably have a refractive index difference $\Delta n$ of not smaller than 0.1 and particularly not smaller than 0.15 with respect to the base material of the first region in making compatible the requirement for the angle dependence of the scattering amplitude with the standardization scattering cross-sectional area. As described in detail later, the value of g and the difference of $\Delta n$ can be absorbed to a certain extent by the setting of the dispersion density, and the desired characteristics can be obtained by setting the values within, for example, the aforementioned range. In particular, the range of the size parameter q is important.

The construction mainly including the scatterers of a comparatively small particle size is able to most easily secure eye safety and obtain satisfactory light source characteristics free from the influence of the optical loss due to the hiding power or the like of the scatterers so long as a combination of the base material capable of high density dispersion with a kneading device can be utilized. Moreover, a general end surface emitting type semiconductor laser capable of achieving high power operation can be mounted in the form of a simple die bonding, and therefore, a light source device that has the aforementioned characteristics can be manufactured at extremely low cost.

As a modification example the first region, it is acceptable to mix and disperse scatterers of a relatively large particle size of a size parameter q deviating from the range of approximately 1 to 15 with the aforementioned scatterers serving as main scatters (maximum in terms of number density). The scatterers are dispersed so that the average nearest neighbor distance of all the scatterers falls within approximately twenty times the mode diameter of all the scatterers, or the mode diameter Ds of the scatterers mainly dispersed. With this arrangement, the dispersion condition, which improves the output efficiency while satisfying eye safety and simplifies the dispersion process, is found. Moreover, it is also desirable to constitute the first region as a laminate constructed of two or more layers by spatially separating the scatterers that have different parameters or spatially changing the dispersion density of the same scatterers in the first region of which the configuration is determined by the recess portion, instead of carrying out the mixed dispersion. A sufficient speckle reducing effect can be obtained while restraining the hiding power by constituting the first region of a plurality of portions (or layers) and changing the volumes of the portion mainly intended for the operation of dividing the coherent wave front into a plurality of portions and the portion mainly intended to generate scattering of a high symmetry a plurality of times. Forming the first region into a multilayer would be disadvantageous from the viewpoint of the total cost although the difficulties in optimizing the dispersion process are reduced.

In one embodiment, the surface of the metal layer formed on at least part of the wall surface of the recess portion serves as a reflective surface that changes an optical axis direction of an outgoing beam of the light source element a plurality of times, and the size parameter q of the first region falls within a range of approximately 10 to 50.

According to the light source device of the above-mentioned embodiment, by providing a construction in which the outgoing beam (i.e., direct wave) of the light source element reaches the opening of the recess portion after two to five times of reflection when it is assumed that a specific inclination angle is given to the principal portion of the wall surface of the recess portion and no scatterer exists, the scattering optical path length can be set large. This arrangement is able to maintain the output efficiency high while effectively generating multiple scattering in a comparatively small volume particularly when the thickness in the optical axis direction of the second region is thin and to achieve speckle reduction by remarkably improving the uniformity of the secondary planar light source formed at the interface with the second region.

Moreover, in the above-mentioned construction, the size parameter q of the scatterers mainly dispersed in the first region is within a range of approximately 10 to 50 and particularly within a range of 15 to 40. That is, the scatterers should preferably have a comparatively large particle size and an asymmetry factor g exceeding 0.9. With this arrangement, the near-field pattern can be more effectively uniformed by the multipath reflection on the wall surface and the multiple scattering of the scatterers that have a comparatively intense forward scattering characteristic, and the size of the apparent light source can easily be expanded. A scatterer of a comparatively low refractive index difference $\Delta n$ may be employed, and acrylic organic particles, $SiO_2$, other metal oxides and so on can be suitably used in association with the base material of the silicone base. For example, the size parameter q of 10 to 50 with respect to the near infrared semiconductor laser that oscillates with a wavelength of 900 nm in the air corresponds to a particle size Ds of about 1 μm to 7 μm. When the scatterers of such a comparatively large particle size are mainly dispersed, a minute multiple scattering optical system can easily be constituted by a simpler kneading and dispersion process. Moreover, the aforementioned construction is able to mount an end surface emitting type semiconductor laser capable of achieving high power operation in the form of a simple die bonding and to manufacture the light source device that has the desired characteristics at low cost.

Of course, in the above-mentioned construction, $TiO_2$ of a large refractive index difference or the like can be suitably used as the main scatterers so long as the scatterers are particles of a comparatively large particle size. However, inorganic oxide based particles of a large particle size having a high refractive index difference tends to become extremely expensive. In a construction in which the combination of multipath reflection and multiple scattering is used, it is extremely preferable to mix and disperse the main scatterers of a comparatively low refractive index difference (typically about $0.05 \leq \Delta n \leq 0.2$) and a large particle size (generally $q \geq 10$) together with the subordinate scatterers of a high refractive index difference (generally $\Delta n \geq 0.2$) and a small diameter (generally $q \leq 10$) like the aforementioned $TiO_2$. By setting the average nearest neighbor distance including all the scatterers within the range of approximately twenty times the particle size mode, or the mode Ds of the scatterers mainly dispersed and blending the scatterers at a comparatively low density within the permissible range from the viewpoint of speckle reduction, the uniformity of the secondary planar light source and the output efficiency can be made compatible with speckle reduction.

It is acceptable to constitute the first region as a laminate constructed of two or more layers by spatially separating the scatterers that have different parameters or changing the dispersion density of the same scatterers in the first region instead of carrying out the mixed dispersion. For example, it is acceptable to constitute the greater part of the region located adjacent to the light source element (e.g., semiconductor laser) in the first region of a layer in which scatterers of a comparatively large particle size are dispersed at a density of 10 vol % and provide a layer in which scatterers of a comparatively small diameter and a high refractive index difference are dispersed at a density of 1 vol % in the upper portion of the layer. Even if the uppermost layer of the first region is a polydispersion including an agglomerate, there can be found a dispersion condition that the preferable speckle reducing effect, light output efficiency and the flattening of the near-field pattern are made compatible. The construction of the first region can be thus optimized by constituting the first region of a plurality of layers or portions and changing the volumes (or volume ratio) of the portion mainly intended for the operation of dividing the coherent wave front into a plurality of portions and the portion mainly intended to generate highly balanced scattering a plurality of times, whereas it becomes disadvantageous from the viewpoint of the total cost.

In one embodiment, an opening of the recess portion has a diameter larger than that of the bottom surface, and assuming that a ratio of a depth to the diameter of the bottom surface of the recess portion is given as an aspect ratio, r, and an angle made between a normal line of the wall surface of the recess portion and the optical axis of the outgoing beam of the light source element is θ [deg], then a condition expressed by:

$$\max\{2r, 3\} \leq \theta \leq 20r$$

is satisfied.

According to the light source device of the above-mentioned embodiment, the diameter of the opening of the recess portion is larger than that of the bottom surface. By satisfying the above-mentioned condition, speckle reduction can be achieved by maintaining a high output efficiency while effectively generating multiple scattering and remarkably improving the uniformity of the secondary planar light source formed at the interface with the second region.

Moreover, the angle θ should preferably be provided with a lower limit. That is, when there is multiple scattering of which the optical depth exceeds several hundreds of times, the optical output tends to become hard to take out as a consequence of its being hidden. The phenomenon of light being not reflected on but absorbed into the metal layer constituting the wall surface statistically becomes unignorable when the frequency of incidence on the wall surface of the recess portion becomes extremely large, and efficiently guiding light to the second region tends to become difficult. To solve it, it was found that the problem of an excessive increase in the average frequency of the multiple scattering is practically avoidable by setting $2r \leq \theta$. According to the combination of a typical metal that constitutes the outermost surface of the wall surface of the recess portion with a silicone-based gel or other resin-based material typical as the base material of the first region, the critical angle of total reflection becomes about 5° to 20°. In a typical construction example of the multiple scattering optical system, it was found that the problem of the excessive increase in the average frequency of incidence on the metal layer within the critical angle was practically avoidable by setting $3 \leq \theta$ [deg]. Therefore, by setting $\max\{2r,3\} \leq \theta$, i.e., by setting the angle θ equal to or greater than $(2r)°$ or 3° whichever is larger, the problem of difficulty in efficiently guiding light to the second region is solvable.

By making the wall surface of the recess portion have a completely ideal geometric configuration, the angle θ might simply be obtained by a geometric calculation. However, in this light source device, it is important to constitute all the elements of the multiple scattering optical system by simpler means. For example, when the constituent elements of the recess portion are formed by the process of drilling a resin substrate by a body of rotation, indentation or punching of a columnar or polygonal pillar or the like, deviation from the ideal configuration and dimensions often occurs particularly in the neighborhoods of the bottom surface and the opening. The aforementioned numeric limitations of $\theta \leq 20r$ and further $\max\{2r,3\} \leq \theta$ were obtained by evaluating the non-defective product yield in consideration of the actual manufacturing processes as described above.

In one embodiment, at least part of the wall surface of the recess portion forms a cylinder whose top and bottom have approximately same sectional configurations, and assuming that a ratio of a depth to a diameter of the cylinder of the recess portion is given as an aspect ratio, r, and an angle made between a normal line of the wall surface of the recess portion and the optical axis of the outgoing beam of the light source element is $\theta$ [deg], then a condition expressed by:

$$\max\{a\tan(r/5), 3\} \leq \theta \leq a\tan(r/2)$$

is satisfied.

According to the light source device of the above-mentioned embodiment, in at least one principal portion of the wall surface constituting the recess portion in the first region as a structure for converting the optical axis direction of the outgoing beam of the light source element a plurality of times, the cross-sectional configurations of the opening portion and the bottom surface portion are almost the same cylindrical configurations. Assuming that the aspect ratio (depth/diameter in the optical axis direction of the light source element) of the recess portion is r and an angle made between the normal line of the wall surface and the original optical axis of the light source element is $\theta$ [deg], it is acceptable to satisfy the relation:

$$a\tan(r/5) \leq \theta \leq a\tan(r/2)$$

and arrange at least the principal portion of the wall surface that constitutes the recess portion relatively inclined with respect to the optical axis of the outgoing beam of the light source element. Although the angle $\theta$ can take an extremely small value depending on the value of the aspect ratio, it is desirable to provide the angle $\theta$ of not smaller than 3° in order to avoid the problem of the excessive increase in the average frequency of incidence on the metal layer within the critical angle as already described. Moreover, it is needless to say that the recess portion is not always required to have a circular cross-sectional configuration, the configuration is desired to be axisymmetric to the optical axis of the light source element, and that the mutually opposed sides should be parallel to each other in a cross section that includes the axis of the wall surface configuration of the recess portion and the optical axis of the light source element.

In the above-mentioned construction, the size parameter q of the scatterers mainly dispersed in the first region may be within the range of approximately 10 to 50 and particularly within the range of 15 to 40. That is, the scatterer should preferably have a comparatively large particle size and an asymmetry factor g close to one. With this arrangement, the near-field pattern is more effectively uniformed by the multipath reflection on the wall surface and the multiple scattering of the scatterers that have a comparatively intense forward scattering characteristic, and the size of the apparent light source can easily be expanded. Moreover, a scatterer of a comparatively low refractive index difference $\Delta n$ can also be employed.

As described hereinabove, it is preferable to mix and disperse the main scatterers of a comparatively low refractive index difference (typically $0.05 \leq \Delta n \leq 0.2$) and a large particle size ($q \geq$ approx. 10) together with the subordinate scatterers of a comparatively high refractive index difference ($\Delta n \geq$ approx. 0.2) and a small diameter ($q \leq$ approx. 10) within the permissible range from the viewpoint of the speckle reduction in allowing the speckle reduction with an improved dispersion uniformity while improving the uniforming of the secondary planar light source and the output efficiency. Otherwise, it is also acceptable to constitute the first region of a laminate constructed of two or a plurality of layers by arranging the scatterers that have different parameters spatially separately or changing the dispersion density instead of carrying out the mixed dispersion.

In one embodiment, the light source element is a semiconductor laser.

By applying the eye-safe means of an extremely small optical loss as described above, the electric power efficiency of various conventional light source devices that employ an LED for the light source element can be improved by at least two to three times or more. Furthermore, according to the eye-safe means in the minute region, the original response of the laser is not impaired in at least a frequency region of not higher than about several gigahertz. Therefore, a small-sized, light-weight low-cost transceiver for wireless optical communications, which has not existed, can easily be provided.

In one embodiment, the semiconductor laser has an active layer including an InGaAs layer on a GaAs substrate and an emission wavelength within a range of from 880 nm to 920 nm inclusive.

According to the light source device of the above-mentioned embodiment, the light in the wavelength band of 880 nm to 920 nm induced and emitted from the semiconductor laser that has the active layer including the InGaAs layer on the GaAs substrate has a wavelength close to the peak sensitivity wavelength of a Si photodiode which is a typical photodetector, and this light source device is suitable as a transmission means for optical communications. Moreover, the threshold current and the temperature characteristic of the semiconductor laser are remarkably improved in comparison with those of the semiconductor light-emitting device of the 780-nm band or the like. Therefore, this light source device allows achievement of an optical communication module which satisfies the Class 1 eye safety for wireless optical communications and concurrently is inexpensive and excellent in electrical and optical characteristics.

Moreover, particularly, by constituting the layers that have a high optical density, such as, for example, a quantum barrier layer and a light guide layer located adjacent to the InGaAs layer or a light guide layer provided besides the active layer, of at least one of a ternary layer or a quaternary layer expressed by $In_XGa_{1-X}As_YP_{1-Y}$ ($0 \leq X < 1$, $0 < Y < 1$) to thereby make those layers Al free, it becomes possible to provide an eye-safe light source device of which the output can be made highest in the wavelength band of 880 nm to 920 nm. Therefore, by employing this light source device, there can be constituted an optical communication module that satisfies the Class 1 eye safety and concurrently is irrespective and excellent in electrical and optical characteristics for wireless optical communications.

In one embodiment, the semiconductor laser has spatial fluctuations in at least one of its composition or its layer thickness.

According to the light source device of the above-mentioned embodiment, by forming a pseudo gain grating by intentionally carrying out island-shaped three-dimensional growth particularly for remarkably generating its thickness distribution during the crystal growth of the active layer and other layers of the semiconductor laser, the spectral linewidth during the laser operation can be extended. Moreover, by forming a pseudo refractive-index grating by carrying out growth for intentionally causing local compositional fluctuations during the crystal growth of the quantum well barrier layer, the light guide layer and so on, the spectral linewidth can be extended. Therefore, the semiconductor laser, which has the fluctuations in the composition or the layer thickness, is effective for speckle reduction.

Moreover, in one embodiment, the semiconductor laser has the active layer including the InGaAs layer on the GaAs substrate and includes a ternary layer or a quaternary layer expressed by $In_XGa_{1-X}As_YP_{1-Y}$ ($0 \leq X<1$, $0<Y<1$), and at least one of the layers has fluctuations in at least one of the composition and the layer thickness.

According to the light source device of the above-mentioned embodiment, the following remarkable effects can be obtained by employing the active layer including the InGaAs layer, further employing a GaAsP ternary material or the InGaAsP quaternary material as a quantum well barrier layer or employing an InGaAsP quaternary material that has lattice matching with GaAs, as a light guide layer.

That is, by forming a pseudo gain-coupled grating by intentionally carrying out island-shaped three-dimensional growth particularly for remarkably generating its thickness distribution during the crystal growth of the InGaAs layer formed as a quantum well, the spectral linewidth during the laser operation can be extended. Moreover, by forming a pseudo index-coupled grating by carrying out growth for intentionally causing local compositional fluctuations during the crystal growth of the GaAsP layer or the InGaAsP layer formed as a quantum well barrier layer or a light guide layer, the spectral linewidth can be extended. It was confirmed from the results of observing the visibility (criteria representing a contrast of interference fringes and so on) through interference experiments that the timewise coherency of the output light emitted from the semiconductor laser having the pseudo grating of an obscure phase in its cavity was able to be reduced by one or more orders of magnitude in comparison with that of ordinary high-power semiconductor lasers. Therefore, the semiconductor laser, which has such fluctuations in the composition or layer thickness, is preferably concurrently used as other constituent elements of this high-power light source device together with the first region and the second region of the multiple scattering optical system.

In one embodiment, at least part of a wire directly or indirectly connected to the semiconductor laser exists in the second region.

According to the light source device of the above-mentioned embodiment, by virtue of the arrangement that at least part of the wire directly or indirectly connected to the semiconductor laser exists in the second region, the wire is peeled off together with the second region and disconnected if the second region is damaged or peeled off. Consequently, the electrification to the semiconductor laser is interrupted, so that the laser beam of the coherency maintained at a high level can be prevented from directly entering the user's eyes. Although the above-mentioned operation is effective also when damage occurs during the operation of the light source device, it is needless to say that similar operation is effected on an attempt to use the light source device after the damage has once occurred.

In one embodiment, assuming that a transport mean free path of the scatterers is $l_{AVE}$ and a dimension in the optical axis direction of the first region is L, then a transport optical depth $L/l_{AVE}$ is approximately 1 to 100.

In one embodiment, the amount of near-field pattern speckles $\sigma_{PAR}$ is within a range expressed by:

$$\sigma_{PAR} \leq 3 \times 10^{-1}.$$

In one embodiment, the light source element has an optical waveguide structure.

Moreover, an optical communication module of this invention is characterized in that the aforementioned light source device is used as a the transmission means.

According to the optical communication module, by employing the light source device as the transmission means and further employing, for example, an Si photodiode as a light reception means, there can be provided an optical communication module that satisfies the Class 1 eye safety and concurrently is most inexpensive and excellent in electric optical characteristics for wireless optical communications. Moreover, particularly in an optical communication module, the first region of the multiple scattering optical system is formed as a minute region located adjacent to the light source element (semiconductor laser). Therefore, even when the device is integrated with or formed into an integrated module with a photodiode, the reception system does not suffer the disadvantages of sensitivity degradation and so on. Therefore, by forming an optical communication module by a combination of an inexpensive Si photodiode with the light source device of this invention, there can be provided an optical communication module that concurrently achieves a small size and low cost equivalent to those of the existing IrDA transceiver and a high-speed property and a wide communication area equivalent or superior to those of the existing optical wireless LAN product and is optimum for wireless optical communications.

BRIEF DESCRIPTION OF THE DRAWINGS

FIGS. 3A, 3B, 3C, 3D, 3E, 3F and 3G are graphs comprehensively showing data concerning the near-field pattern of the above eye-safe light source device;

BEST MODE FOR CARRYING OUT THE INVENTION

The outline of the basic construction of the multiple scattering optical system of this invention will be described first with reference to FIG. 1, and thereafter, typical examples, speckle pattern reduction examples and the evaluation criteria and so on for securing eye safety in the embodiments of the light source device of this invention will be described.

Figure 1:
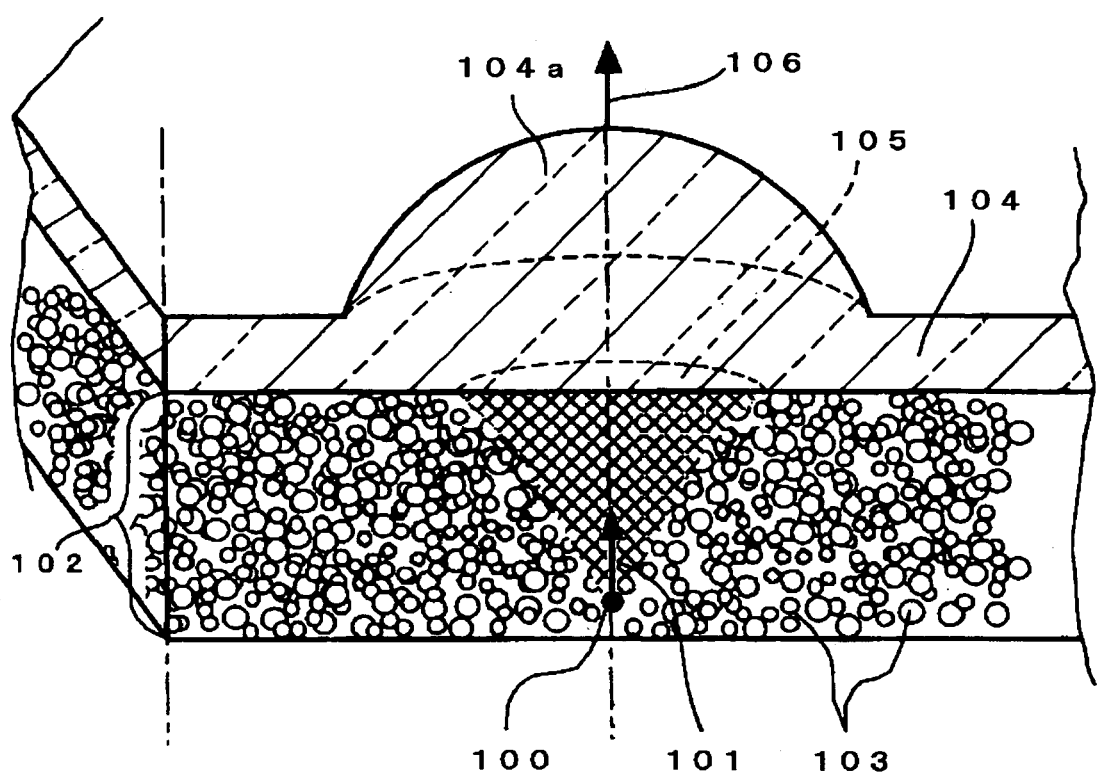
FIG. 1 is a view for explaining the outline of the multiple scattering optical system of an eye-safe light source device as the light source device of this invention.

As shown in FIG. 1, an optical output from a semiconductor laser (not shown) is emitted typically from a micrometer-order spot 100 and has a directivity in the direction of an optical axis 101. Scatterers 103 are uniformly distributed at a high density in a first region 102 located adjacently so as to surround the scatterers. In FIG. 1, stimulated emission of light with timewisely and spatially high coherency from the semiconductor laser travels entirely in the direction of an optical axis 106 of a second region 104 while being scattered by undergoing multiple scattering in this first region 102. Then, a spot 105, which becomes a single secondary planar light source, is formed at the interface with the second region 104.

The multiple scattering in the region 102 is a random and static process, and the distribution of the degree of spatial coherence at the interface between the first region 102 and the second region 104 reflects the original angular distribution of the radiant intensity of the semiconductor laser, the constituent elements (combination of the base material and the scattering material) of the first region 102, the dimensions of the portions and so on. The spot 105 has globally lost the spatial coherency when viewed as the entire spot 105 so as not to cause a problem from the viewpoint of eye safety. Moreover, the spot 105 is formed to have a finite expansion smaller than the diameter of the lens portion 104a that serves as a magnifier at the interface between the first region 102 and the second region 104 so as to be regarded as a secondary planar light source that has an almost uniform near-field pattern. As the result of the multiple scattering in the first region 102, luminous fluxes radiated in all directions from the elements of the secondary planar light source have their own far fields behaving like almost complete Lambertian.

The second region 104 on which the scattered light from the secondary planar light source is incident is provided with a lens portion 104a that has an optical axis 106 in which the distance between the free space and the interface and the interface configuration are determined on the basis of the refractive index of the media so as to operate as a magnifier at least for the principal portion (e.g., a region that has an intensity of not smaller than $1/e^2$ of peak intensity) of the spot 105. A focal point on the light source side of the lens portion 104a is arranged on the light source element (semiconductor laser) side of the interface in order to form an erected virtual image of the spot 105 when the light source element (semiconductor laser) is observed from the free space side and to reduce the probability that the output light from the spot 105 intersects at a low angle inside the second region 104. Moreover, there is almost no need to consider the distortion of the virtual image in the applications supposed by this invention.

As described above, the light source device of this invention is a light source device in which the stimulated emission from, for example, a semiconductor laser is emitted into the free space via a multiple scattering optical system and is constituted so that the multiple scattering optical system is constructed of the first region 102 that is adjacent to the semiconductor laser and the second region 104 that is adjacent to the first region 102 and reaches a free space, the first region 102 contains scatterers at a density higher than that of the second region 104, and the second region 104 has a magnifier for at least a principal portion of the secondary planar light source formed at the interface between the first and second regions 102 and 104. Typically, it is assumed that the thickness in the optical axis direction of the first region 102 is about 1 mm to 3 mm and the thickness in the optical axis direction of the second region 104 is within a range of about 2 mm to 10 mm depending on the configuration of the lens portion 104a. FIG. 1 is a conceptual diagram for explaining the outline of the objective optical system of this invention, and various concrete numerical values described later are applied to the detailed parameters of portions, such as the scatterers, the overall dimensions and so on.

Although the eye-safe light source device in which the first region 102 has a tabular construction is shown in FIG. 1, there is provided no constituent element for limiting the configuration of the first region 102 to about the expansion of the spot 105 in the intraplanar direction. For example, a tabular first region can easily be formed by providing a frame that has an expansion larger than the supposed spot size in the surroundings of the semiconductor laser mounted on a resin substrate and dripping liquid, gel or rubber material in which scatterers are dispersed into this frame or in a similar manner. However, according to the construction, an element or the like having another function cannot be adjacently arranged, and a size reduction in the planar direction becomes difficult. A reduction in the light concentrating efficiency possibly occurs if the first region is formed additionally on a photodetector such as a photodiode to be combined as a module capable of transmission and reception, and accordingly, there arises a necessity for avoiding the arrangement adjacent to the light source section.

An eye-safe light source device that serves as the light source device of this invention and an optical communication module that employs the device will be described in detail below on the basis of the embodiments shown in the drawings.

FIRST EMBODIMENT

Dissimilarly from FIG. 1, the first region is also allowed to have a sufficient thickness and intraplanar expansion by directly dripping an appropriate amount of substance that has a comparatively high viscosity in which scatterers are distributed only at the periphery of the semiconductor laser chip.

Figure 2:
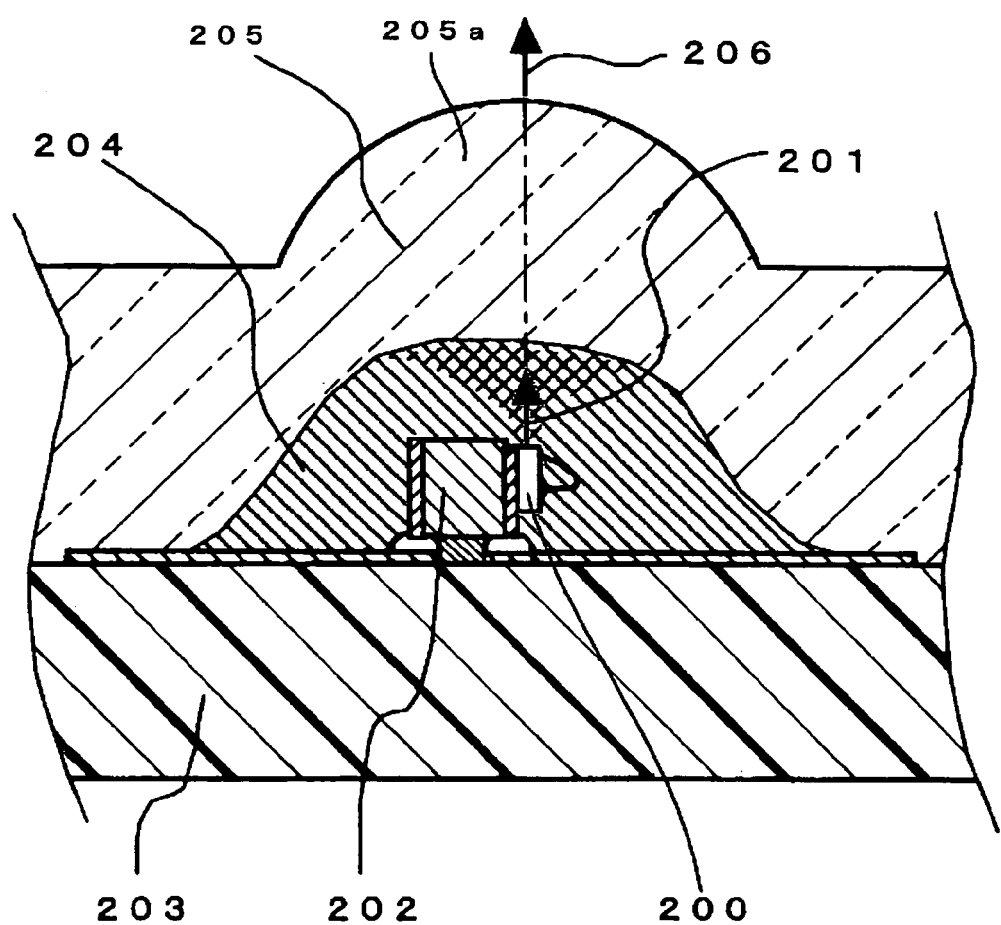
FIG. 2 is a sectional view showing the construction of the eye-safe light source device of a first embodiment of this invention.

FIG. 2 is a sectional view showing the construction of an eye-safe light source device that serves as the light source device of the first embodiment of this invention.

As shown in FIG. 2, a semiconductor laser 200 is die-bonded and wire-bonded to a submount 202 (details are not shown) and mounted on a resin substrate 203 via this submount 202. The optical axis 201 of the semiconductor laser 200 approximately coincides with the optical axis 206 of a lens portion 205a that serves as the magnifier of the second region 205. After the mounting of the semiconductor laser 200 on the submount 202, a paste-like silicone gel having a high viscosity of 30000 cP (30 Pa·s) in which the scatterers are dispersed at a high density and a comparatively large amount of hardening material is blended is dripped so as to cover the submount 202 on which the semiconductor laser 200 is mounted. Then, through a gel hardening process at 150° for one hour, a first region 204 as shown in FIG. 2 is formed. Subsequently, the device is sealed in the form of an eye-safe light source device with the second region 205 through a transfer molding process with a general thermosetting type epoxy resin, completing the multiple scattering optical system constructed of the first and second regions 204 and 205. It is easy to obtain the modification example of the construction of the eye-safe light source device not only when the resin substrate 203 is employed but also when a lead frame is employed without interposition of the submount.

Here is described an example of difficulty in constituting the multiple scattering optical system of this invention if a substance other than the gel-like or rubber-like substance is used as the base material of the first region 204. Although monodispersion of particles in a silicone oil of a low viscosity is comparatively easy, it is impossible to fix the dimensions of the first region since the silicone oil cannot be hardened. Moreover, the dispersed scatterers subside, and the scattering characteristic changes with a lapse of time. Moreover, if the oil is retained by using some frame, there disadvantageously occurs the outflow of the greater part of the oil during the transfer molding process for forming the second region or transubstantiation during the thermosetting process.

In the eye-safe light source device of this first embodiment, a thickness from the surface of the resin substrate 203 to the top portion of the first region 204 can be changed in a range of from about 1 mm to 4 mm. Moreover, in this eye-safe light source device, a distance from the surface of the resin substrate 203 to the top of a lens portion 205a of the second region 205 is set to 4.0 mm, and the radius of the lens portion 205a is set to 2.0 mm. Particles of various material systems described later were used as the scatterers of the first region 204, the mode Ds of the particle size was changed within a range of a size parameter q of 0.05 to 50 every produced module (eye-safe light source device), and a refractive index difference $\Delta n$ between the scatterers and the base material was changed to be from 0.02 to 1 or more. In this case, the size parameter q is expressed by:

$$q = (2\pi/\lambda) \cdot (Ds/2)$$

(where Ds represents the particle size mode of the scatterers, and $\lambda$ represents the emission wavelength of the semiconductor laser in the silicone gel). Moreover, a dispersion density was changed within a range of 0.01 vol % to 50 vol % in terms of true specific gravity. The amount of speckles of numbers of eye-safe light source devices that included the first region 204 of different scattering characteristics was thus evaluated.

The particle powder and the dispersion process thereof are described here in detail. Powders having a specified particle size distribution mode Ds within the range of the size parameter q are prepared. Typically, an aggregation (agglomerate) of particles (primary particles) that become the scatterers of which the particle size is controlled is supplied as a dry powder in the form of containing a large amount of air. The more preferable particles as the powder to be dispersed in the first region in this invention are subjected to surface processing appropriate for making easy dispersion in a dispersion base material (base material of the first region) in a state in which the powder is once scaled down in size to the primary particles in the manufacturing process of the powder to reduce the surface energy thereof.

When the powder is dispersed at a high density in the base material, the most preferable scatterers can be obtained typically by carrying out the two-step dispersion processes as follows. First of all, the powder is stiffly kneaded at a high density of 70% to 90% or more by powder percentage by weight as a masterbatch of the scatterers. In this process, the agglomerate contained in the dry powder is effectively pulverized. Further, through the process of wetting the powder by continuously replacing the contained air with the base material and the kneading process of mixing and dispersing the powder into the base material, the primary particles can be brought into a uniformly distributed state. For this series of processes, there is normally used a kneading machine, which has a comparatively large size and is able to apply a strong shearing force, such as a one-axis or two-axis screw extruder, kneader, homogenizer or the like.

Next, the masterbatch is kneaded (or mixed and agitated) while being diluted with the dispersion base material, and the scatterers at the desired scatterer density can be obtained. In this dilution process, satisfactory scatterers that contain no agglomerate can be produced at an arbitrary density even if a comparatively simple type kneading machine such a kneading mixer that employs a small-sized kneader or blade, a small-sized homogenizer or bead mill, a vessel-rotating type desktop mixer or the like. Particularly, when dilution is the main purpose, a high-speed vessel-rotating type mixer in which the generation of air bubbles is restrained is preferable.

The range of parameter of the powder produced for trial purposes for the eye-safe light source device covers not only the range in which the preferable scatterers can be obtained through the aforementioned two-step dispersion processes but also an extremely high density range or an extremely small particle size range such that the formation of an agglomerate or cluster cannot be avoided due to the performance of the disperser even in the case of the primary particle powder that has undergone the aforementioned surface processing. By comprehensively evaluating these factors, the construction of the multiple scattering optical system that can be actually easily manufactured can be extracted.

Figure 3A:
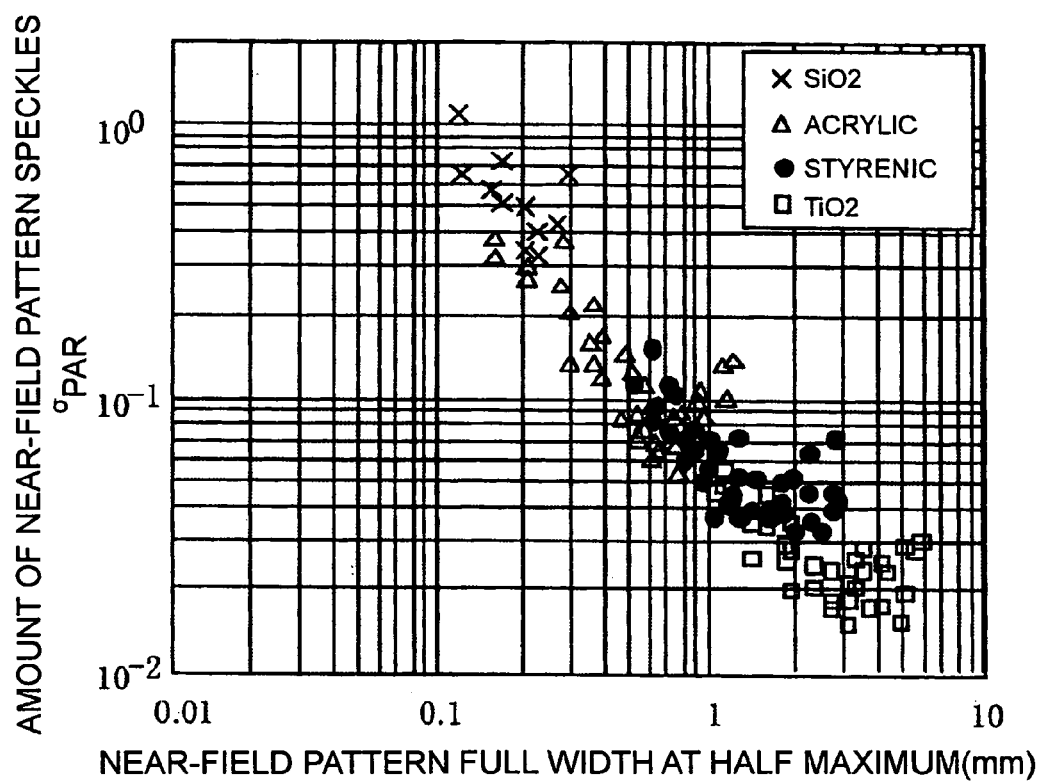

FIG. 3A shows the relation between the full width at half maximum and the amount of speckles obtained from the observation results of the near-field pattern in the aforementioned various eye-safe light source devices. FIGS. 3B through 3D show measurement examples and analysis examples at the data points at which the speckles are remarkable, and FIGS. 3E through 3G show measurement examples and analysis examples at the data points at which the speckles are sufficiently reduced. These near-field patterns are obtained by observing the secondary planar light source formed at the interface between the first region and the second region by means of a CCD camera (resolving power: about 4 μm) from the outside of the multiple scattering system and scanning the light intensity distribution in a direction (X) approximately perpendicular to the optical axis. Although the curve of the raw data and the curve of the average intensity distribution overlap with each other and lacks distinctness, the smoother curve represents the average intensity distribution.

Although the detail will be described later, FWHM represents the average full width at half maximum, and $\sigma_{NFP}$ represents the amount of speckles based on the residual from the average intensity distribution in FIGS. 3B and 3E. Moreover, in FIGS. 3C and 3F, $\sigma_{PAR}$ represents the amount of speckles based on PAR (Peak-to-Average Ratio).

The resolving power of the CCD camera used here is required to be higher than the typical amount of flicks of the eyeball, whereas an extremely high resolution is not significant for the consideration of eye safety. If a sharp speckle structure having a size of about 0.5 μm (half wavelength) remarkably exists in the near-field pattern of the multiple scattering optical system that employs a laser element of an emission wavelength of 1 μm, the arrangement means that optical paths mutually intersecting in opposite directions occupy the major part in the local region and the optical paths eccentrically exist in a certain plane. Such the phenomenon cannot occur after passing the extremely higher-order multiple scattering in terms of the theory of probability. Moreover, it is impossible that a minute structure finer than the half wavelength is generated from the coherent interference pattern itself. Therefore, it is an appropriate selection to evaluate the eye safety of the objective multiple scattering optical system of this invention by using the resolving power of about 1 μm to 10 μm possessed by an ordinary CCD.

In order to perform the quantitative evaluation of the speckles, $\sigma_{PAR}$ (or $\sigma_{NFP}$) can be defined as a value on the vertical axis of FIG. 3A, i.e., the amount of speckles of the near-field pattern. First of all, a discrete one-dimensional light intensity distribution I ($X_i$; Y=Yj) scanned in the X-direction with a certain Y=Yj is standardized on an X-Y plane (CCD imaging plane) ($1 \leq i \leq N$). Next, a smooth spatial distribution J (Xi; Y=Yj) that has undergone a smoothing process by, for example, polynomial approximation is obtained for I (Xi; Y=Yj). Further, a residual $\rho_i$=I($X_i$; Y=Yj)−J($X_i$; Y=Yj) at each measurement point $X_i$ is obtained for all of N points with respect to this average value curve J($X_i$; Y=Yj) in which the speckles are virtually averaged. The standard deviation $\sigma_{NFP}$ of the residual $\rho_i$ at each measurement point $X_i$ is expressed as follows.

$$\sigma_{NFP} = \sqrt{\frac{1}{N}\sum_{i=1}^{N}|\rho_i|^2 - \left|\frac{1}{N}\sum_{i=1}^{N}\rho_i\right|^2}$$

It is to be noted that the expected value throughout the spatial axis (X-direction) of the residual ρi at each measurement point $X_i$ is zero. Moreover, a ratio I ($X_i$; Y=Yj)/J($X_i$; Y=Yj), i.e., the standard deviation $\sigma_{PAR}$ of a curve to average value PAR (Peak-to-Average Ratio) is obtained as follows.

$$\sigma_{PAR} = \sqrt{\frac{1}{N}\sum_{i=1}^{N}\left|\frac{I(X_i; Y=Y_j)}{J(X_i; Y=Y_j)}\right|^2 - \left|\frac{1}{N}\sum_{i=1}^{N}\frac{I(X_i; Y=Y_j)}{J(X_i; Y=Y_j)}\right|^2}$$

It is to be noted that the expected value throughout the spatial axis of PAR (X-direction) is one.

In this case, as a method for deriving the average value curve J($X_i$, Y=Yj), it is possible to average a plurality of parallel scan images I($X_i$; Y=Yk);k=j±1, 2, 3, ... adjacent to the I($X_i$; Y=Yi) at each point $X_i$ or to use an average value of all the data points located within a specified radius from each point ($X_i$, Yi) in two dimensions. Such the averaging operation is carried out by using a statistically sufficient number of data points including at least an expansion on the level of the correlation size of speckles at each individual measurement point $X_i$ and limiting the data points within a range in which the influence of the configuration or the size of the entire near-field pattern is not exerted. By carrying out this operation while scanning throughout I($X_i$; Y=Yj), the average value curve J($X_i$; Y=Yj) is obtained.

Among the aforementioned averaging methods, particularly the method of averaging a plurality of peripheral data points or data rows can become a more preferable method for an image including a discontinuous change that cannot be expressed by a polynomial expression when there is a shadow of the wire bonding from the surface of the semiconductor laser. Moreover, it is also possible to take the ensemble average from numbers of equivalent samples. Moreover, it becomes possible to systematically evaluate various multiple scattering optical systems of which the distribution forms of the average value curve J($X_i$; Y=Yj) are quite different from one another by the devising of evaluating the amount of speckles of I($X_i$; Y=Yj) by limitation to $1/e^2$ or higher or 1/e or higher or within the range in which an intensity not lower than the halfpower is possessed from the peak intensity of the average value curve J($X_i$; Y=Yj) or the like.

Particularly, it is preferable to assume the probability distribution of the amplitude of the PAR and its deviation $\sigma_{PAR}$ as indexes as described below as an evaluation method for reliably considering eye safety. FIGS. 3C, 3D, 3F and 3G show the corresponding PAR's and also their amplitude histograms.

According to the construction of the multiple scattering optical system, in the parameter region in which the speckles are reduced comparatively satisfactorily, the spatial structure of the speckles is scaled down in size to a level smaller than the typical amount of flicks (several tens of micrometers), and the occurrence probability of the amplitude of PAR comes to exhibit a Gaussian distribution. Typically, PAR appears within about ±0.06 around the expected value of one. In FIG. 3F, PAR is within about 1±0.03. As is apparent from the figure, when the amount of speckles is evaluated by a CCD that has the finite resolving power, an upper limit value $PAR_{max}$ at which the occurrence probability of the PAR amplitude becomes zero is easily found. Moreover, the so-called deviation $\sigma_{PAR}$ can also be obtained directly from a PAR amplitude distribution or by Gaussian-fitting of it.

By obtaining the $PAR_{max}$ or the amount of speckles $\sigma_{PAR}$, eye safety is secured as follows. In detail, it is possible to consider the maximum value of power or energy increment per unit area due to the disturbance of light intensity regardless of the details of the structure unit (minute spot size) of the observed residual speckles. For example, if $PAR_{max}=0.06$, then the maximum value of PAR in the near-field pattern becomes about +6% also in a sample arbitrarily extracted from a lot of manufactured same eye-safe light source devices. Similar consideration is possible when the amount of speckles $\sigma_{PAR}$ is used. According to various optical characteristics of the apparent light source size, emission wavelength, angular distribution of the radiant intensity and so on possessed by the eye-safe light source device, AEL (Acceptable Emission Limit) or an optical output upper limit P assuming that no speckle exists can be determined conforming to the international safety standard or the like. Further, by providing a margin $\alpha$, the upper limit value $P_{LIM}$ of the optical output of the eye-safe light source device is set as:

$$P_{LIM}=P/(1+PAR_{max}+\alpha).$$

For example, assuming that $\alpha=4\%$, then the upper limit value $P_{LIM}$ of the optical output is about 90% of P, and the output upper limit value as a product specification is rendered not greater than $P_{LIM}$.

According to the construction of the multiple scattering optical system disclosed in this invention, simple constituent elements and manufacturing processes can be adopted so that the margin $\alpha$ becomes equal to or lower than approximately 10% anticipating the reproducibility of the manufacturing processes and a change with a lapse of time. Moreover, it is also possible to set the specification value of the output upper limit value and select non-defective articles by $3\sigma_{PAR}$ to $6\sigma_{PAR}$ similarly to the normal process control and quality control. As a result of taking the statistics of not only the constructions of the aforementioned multiple scattering optical systems but also all the constructions disclosed in this invention with regard to the relation between $PAR_{max}$ and $\sigma_{PAR}$, its average value $<PAR_{max}>$ was about $3\sigma_{PAR}$, and its maximum value $\max\{PAR_{max}\}$ was about $5\sigma_{PAR}$.

As described above, it is reasonable enough to set a margin from $PAR_{max}$ and so on to design and manufacture an eye-safe semiconductor laser module as a light source device. It becomes a good criterion to typically set $\sigma_{PAR}$ to a small value of about 3% to 8% as the speckle upper limit value for securing the Class 1 level eye safety. Moreover, the relation between the amounts of speckles $\sigma_{NFP}$ and $\sigma_{PAR}$ has a positive correlation that depends on the overall configuration or the full width of the near-field pattern and exhibits a similar behavior with respect to the parameter change of the portions of the multiple scattering optical system. Therefore, it is also possible to verify the multiple scattering optical system by the amount of speckles $\sigma_{NFP}$ and control the manufacturing processes.

Moreover, it is also possible to perform evaluation based on another way of thinking for eye safety. Normally, with respect to an incoherent light source, the apparent size is defined as the size of the region that includes 63% ($=1-1/e$) of the overall light intensity. In contrast to this, in the case of a light source including speckles, assuming that, for example, the upper limit value of the speckle deviation at which the probability of including no speckle disturbance falling below 1/e of the peak intensity becomes 99.9999% is $\sigma_{LIM}$ ($\geq \sigma_{PAR}$), then it is possible to set an upper limit value $\sigma_{LIM}=0.09$ in consideration of the integral value of the Gaussian distribution. As described in the aforementioned several examples, the Class 1 level eye safety can be secured by performing quality control of the actual manufacturing processes or products by feeding the requirement for the light source near-field pattern based on some models of eye safety back to the statistical amount of PAR. Of course, when it is determined that the safety factor is insufficient by the safety of the manufacturing processes and so on, it is possible to produce products that reliably guarantee the Class 1 eye safety by redesigning the multiple scattering optical system for expanding the light source size so as to strictly satisfy the margin for $6\sigma_{PAR}$ or increasing the margin a to limit the upper limit value $P_{LIM}$ of the optical output or taking another measure.

For the sake of simplicity, the data shown in FIG. 3A includes only the examination results of the use of the single body of the scatterers of $SiO_2$ (x: absolute value of refractive index difference $\Delta n$ is about 0.02), acrylic polymer (Δ: absolute value of refractive index difference $\Delta n$ is about 0.09), styrenic polymer (•: absolute value of refractive index difference $\Delta n$ is about 0.19) and $TiO_2$ (□: absolute value of refractive index difference $\Delta n$ is about 0.9) with silicone gel used as a dispersion base material. In this case, the horizontal axis of FIG. 3A represents the full width at half maximum of the near-field pattern, and the parameters, which change this, are the height of silicone gel (204 shown in FIG. 2) after being hardened and the particle size, refractive index and dispersion density of each scatterer. As shown in FIG. 3A, as a general tendency, by increasing the height of the silicone gel and reducing the particle size or increasing the density of the scatterers, the speckles are reduced when the optical depth or the transport optical depth is increased. Although no detailed description is provided for the comparison of individual data, the following matters have become clear.

With regard to the combination of the thickness in the optical axis direction of the first region in which the transport optical depth (=geometrical dimension L/transport mean free path $l_{AVE}$) becomes a few times to several tens of times or, in particular, one to ten times with the filler from the distribution of the particle size mode Ds with respect to an identical scatterer, a multiple scattering optical system capable of obtaining the Class 1 level eye safety can be constituted without significantly impairing the output efficiency. Moreover, the effect of sufficiently reducing the speckles cannot be obtained when the dispersion density is smaller than 1 vol % and conversely when the dispersion density largely exceeds 30 vol % for every scatterer. Particularly, when the dispersion density is not smaller than 30 vol %, the speckles tend to increase although the light source size itself is expanded. Furthermore, the speckles cannot be sufficiently reduced in the entire dispersion density range when the particle size mode Ds or its size parameter q is not smaller than 20 even in the case of a metal oxide ($TiO_2$ or the like) of which the refractive index difference is comparatively large. Moreover, when the size parameter q falls below one, there are the tendencies that the hiding power is intense and the output efficiency is reduced, the monodispersion itself is also extremely difficult and the control of the scattering characteristic is difficult. Moreover, in the case of $SiO_2$ of an extremely small refractive index difference, it is difficult to constitute a multiple scattering optical system capable of obtaining eye safety with a thickness in the optical axis direction within several millimeters.

As described above, it was found to be preferable to provide a region in which the size parameter q of the scatterers mainly dispersed in the first region is within a range of approximately 1 to 15, the asymmetry of the scattering amplitude is small and the backscattering component is not remarkable for the construction of the multiple scattering optical system of FIG. 2. Furthermore, by employing a scatterer that has a refractive index difference of about $\Delta n \geq 0.15$ to the base material of the first region and setting the size parameter q so that the product $\Delta n \cdot q$ of the refractive index difference $\Delta n$ and the size parameter q falls within a range of approximately two to eight (particularly about three), sufficient multiple scattering was able to be generated within a shorter geometrical distance (optical path length without multiple scattering) with the asymmetry of the scattering amplitude reduced and the scattering cross-sectional are maximized.

In this case, it is needless to say that the desirable relation of the refractive index difference $\Delta n$ should be satisfied for the emission wavelength of the employed semiconductor laser when the scatterer is selected in this invention. However, there is caused no serious problem even when the refractive index with respect to the sodium D line (about 589 nm) easily available is used as a criterion for selection as the specifications of various powder materials. The proper material as the scatterer of this invention is the one that has a bandgap wavelength sufficiently shorter than the laser emission wavelength and does not absorb the laser beam. When a material that does not absorb light in the visible region (the aforementioned 589 nm) is employed in the near infrared region as the scatterer of this invention, there occurs no large error of the refractive index difference $\Delta n$ in the same normal dispersion region.

Moreover, it was found to be possible to carry out a dispersion process practicably and simply with a criterion that particularly the average distance between the nearest neighbor scatterers falls within twenty times the parameter Ds for the scatterer that satisfied the aforementioned requirements. In this case, the parameter of the particle size mode Ds of this invention should be applied to each individual particle species in any situation in a case where the particles are monodispersed, a case where particle species having a plurality of particle size distributions are dispersed in mixture, a case where a secondary particle or an agglomerate of fractal cluster or the like is generated, a case where these are polydispersed and so on. It is preferable that the mode Ds is obtained in consideration of the outside diameter itself of the agglomerate and the size parameter q corresponding to it satisfies the aforementioned range of approximately 1 to 15 for a dispersion system including an agglomerate that has a certain outside diameter but internally has a gap. In the case of the agglomerate of the same outside diameter size, the one that is sufficiently smaller than the wavelength and is constructed of primary particles of a smaller particle size is rather able to obtain a satisfactory result for speckle reduction because of a scarce appearance of a minute structure in the dispersion amplitude of the agglomerate.

Moreover, the dispersion density by the volume ratio does not always become a complete definition. This corresponds to a case where monodispersion to the base material (gel or rubber or elastomer) is hard to obtain and an agglomerate of secondary particles is generated, a case where the influence of the amount of oil absorption is large or the like. With regard to the former case of the particles that agglomerate as secondary particles, it is acceptable to consider that the relation of the average nearest neighbor distance is the desirable condition as it is if the outside diameter is in the desirable range between agglomerates. On the other hand, with regard to the latter case of the large influence of oil absorption, it is possible to constitute a satisfactory multiple scattering region so long as the volume ratio converted by using the specific gravity (true specific gravity) of the scatterer (crystal) itself after a sufficient dispersion process (after volume reduction almost disappears) is within a range of approximately 1 vol % to 30 vol %. When a dispersion charge amount is determined by the apparent specific gravity (apparent specific gravity including air in the gap portion) ordinarily used as the specifications of the dry powder, there occurs an error with respect to the estimated value of the average nearest neighbor distance due to the true specific gravity. However, it is not difficult to confirm that the distance between scatterers is within about 20 time the average particle size mode Ds by actual observation with a confocal laser microscope or the like after dispersion and the hardening processes. Therefore, it is possible to find the desirable dispersion density by adjusting the manufacturing processes. It is needless to say that advertency and devising in the actual dispersion process like the deaerating process of air bubbles and so on sometimes become important in order to control the scattering characteristic of the first region.

Here is described another example of difficulties in constituting the multiple scattering optical system of this invention when a substance other than the gel-like or the rubber-like substance is used as the base material of the first region. For example, it is also possible to use epoxy resin as the base material. In comparison with silicone-based gel and elastomer, the dispersion of particles is comparatively easy, whereas the refractive index with respect to the sodium D line generally has a high value of not smaller than 1.53. Therefore, when the absolute value of the refractive index difference $\Delta n$ becomes equal to or smaller than about 0.05 also with respect to either acrylic or styrenic particles taken as the general organic particles among the various scatterers previously enumerated. When epoxy resin is applied to the base material of the first region, the desirable scattering characteristic cannot be obtained due to a shortage of refractive index difference (on the same level as $SiO_2$ of FIG. 3A). On the other hand, the organic particles can easily be reduced in cost and increased in particle size, and these organic particles are extremely effective in the multiple scattering optical system of this invention in which a scatterer of a comparatively large diameter described later is effective. However, it is extremely inefficient in the actual manufacturing processes to selectively use a plurality of base materials in the stage in which the construction of the multiple scattering optical system is selected or optimized, and it is difficult to say that the material is most preferable as the base material of the first region of the multiple scattering optical system of this invention.

The construction of the eye-safe light source device shown in FIG. 2 is preferably used in a case where a combination of the base material that permits the high-density dispersion of the scatterers of a comparatively small particle size and a kneading device can be used or in a case where an eye-safe light source device that is less demanded to reduce the size is manufactured. On the other hand, according to the construction of the eye-safe light source device shown in FIG. 2, although the manufacturing processes are simple, it is difficult to control the thickness in the optical axis direction of the first region and the size of the secondary planar light source, and it is comparatively difficult to particularly efficiently expand the size of the secondary planar light source. Moreover, if it is tried to improve the flowability of the base material that constitutes the first region and facilitate the handling after high-density dispersion, it is difficult to control the configuration and the scatterer density of the first region, and this possibly causes a problem of manufacturing yield. Therefore, it is sometimes the case where the aforementioned construction is hard to adopt when an eye-safe light source device, in which the required specification of the optical output is high and a large margin cannot be taken for AEL (Acceptable Emission Limit), is designed and manufactured. Accordingly, an eye-safe light source device that solves such a problem will be described in the following second embodiment.

SECOND EMBODIMENT

Figure 4:
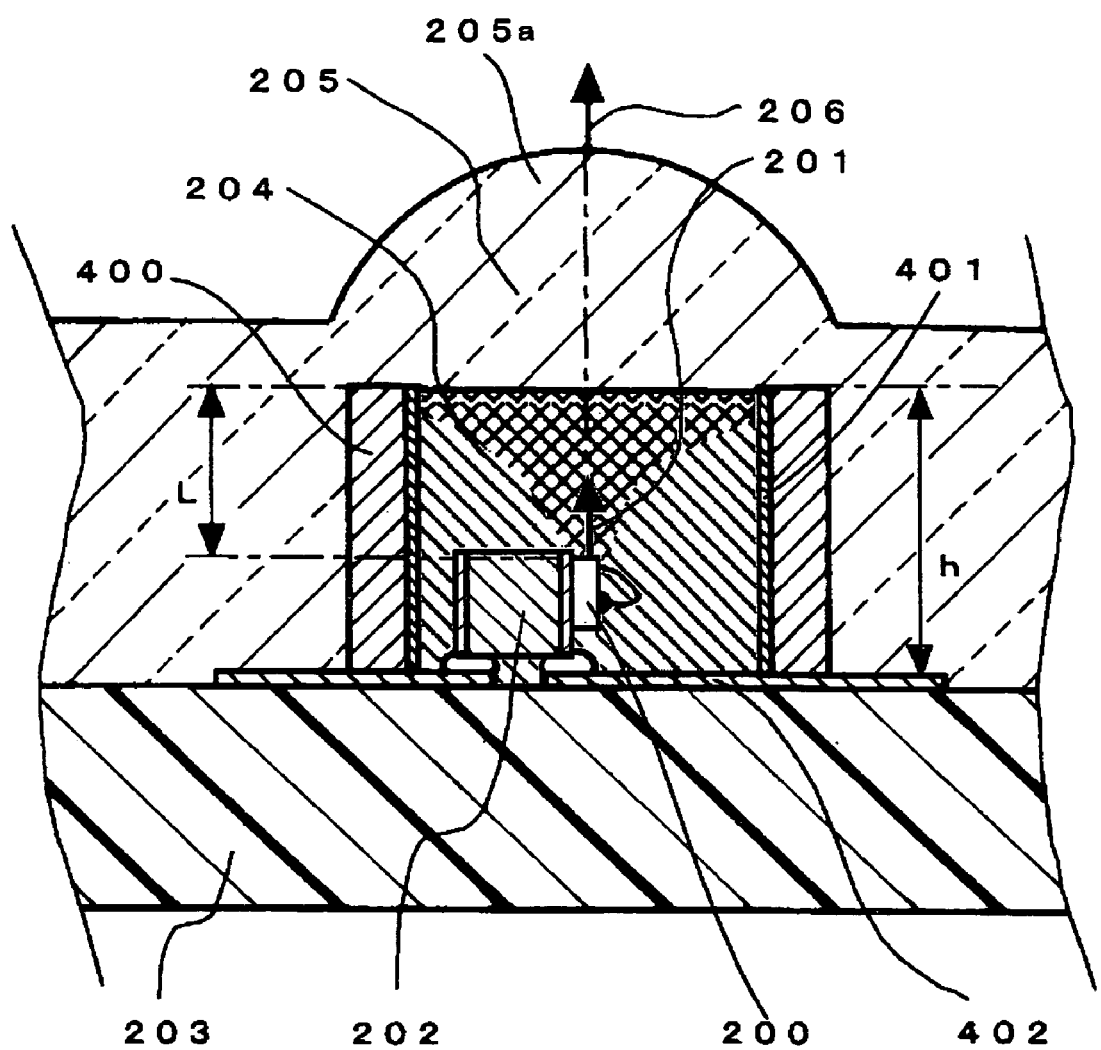
FIG. 4 is a sectional view showing the construction of the eye-safe light source device of a second embodiment of this invention.

FIG. 4 is a sectional view showing the construction of an eye-safe light source device as the light source device of the second embodiment of this invention. In FIG. 4, the same components as those of the eye-safe light source device shown in FIG. 2 of the first embodiment are denoted by the same reference numerals.

As shown in FIG. 4, a semiconductor laser 200 is vertically placed on a resin substrate 203 via a submount 202, and thereafter, a cylinder 400 (inside diameter: 1.1 mm, height h=2 mm) is fixed with a silver paste so as to surround the submount 202 on which the semiconductor laser 200 is mounted. As described above, there is formed a recess portion 210 in which the inner surface of the cylinder 400 is served as a wall surface and the surface of the resin substrate 203 is served as a bottom surface. A metal layer 401 is formed by Au plating on the inner peripheral surface of the cylinder 400. An Au plating wiring pattern 402 is formed on the resin substrate 203. A principal portion of the outermost surface of the recess portion 210 is provided by a metal layer constructed of the metal layer 401 of the cylinder 400 and the Au plating wiring pattern 402 on the resin substrate 203.

Furthermore, scatterers with the base material made of silicone gel of the first region 204 are injected into the recess portion 210 and made to have a fixed configuration. Through a subsequent gel hardening process, the configuration and the scattering characteristic are satisfactorily maintained. As schematically shown in FIG. 4, a laser beam, which travels in the optical axis direction 206 of the lens portion 205a that serves as the magnifier of the second region 205 while being diffused by multiple scattering, is reflected upon reaching the wall surface of the recess portion 210, and scattered light travels toward the second region 205 as a whole while being confined in the first region 204. The principal portion of the outermost surface of the recess portion 210 means a plane brought in contact with this three-dimensional diffusion region. With this construction, the opening of the cylinder 400 becomes a light dispersion port from the first region 204, and a laser beam, which has undergone sufficient multiple scattering, is guided to the second region 205. As a result, a secondary planar light source, which has a configuration similar to the opening of the recess portion 210, is formed at the interface between the first region 204 and the second region 205 existing in the vicinity of the opening of the cylinder 400. The multiple scattering optical system is constituted of the first region 204 and the second region 205.

Figure 5A:
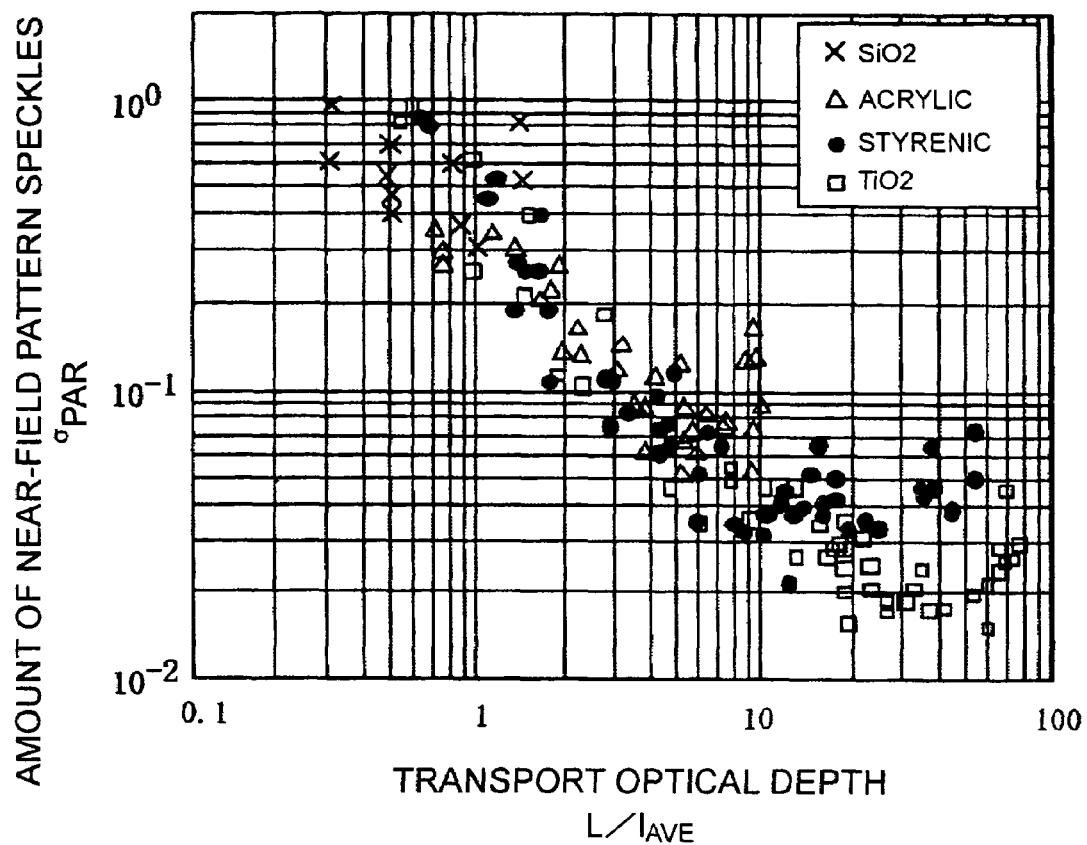
FIGS. 5A, 5B, 5C and 5D are graphs comprehensively showing data concerning the near-field pattern of the above eye-safe light source device.
Figure 5B:
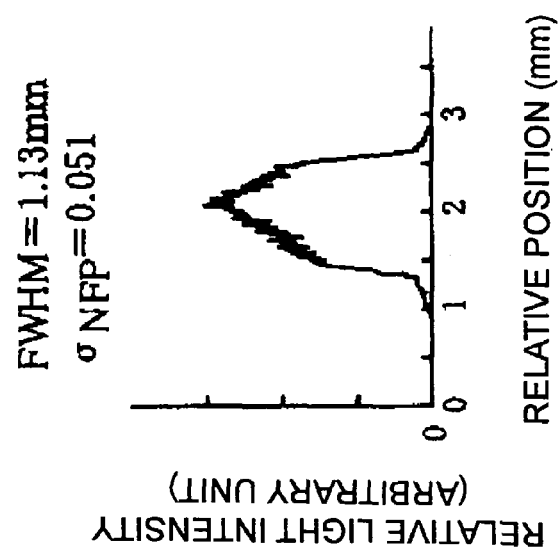
Figure 5C:
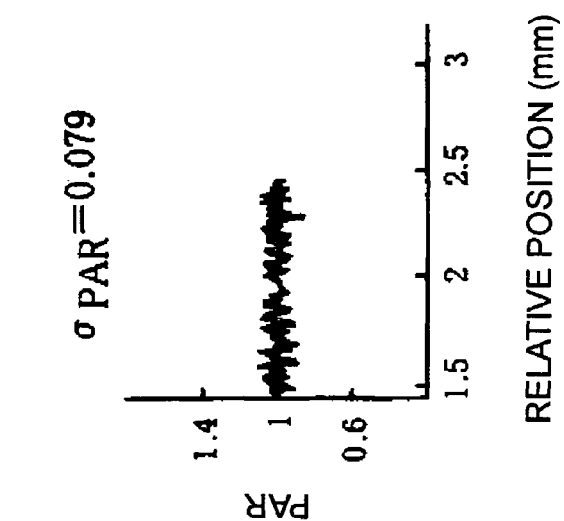
Figure 5D:
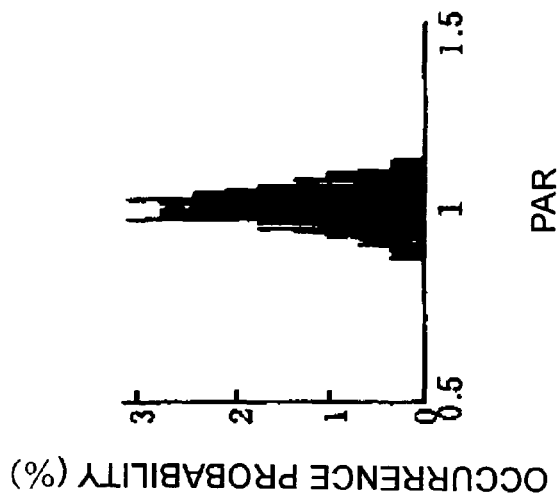

FIG. 5A shows the results of evaluating the amount of speckles $\sigma_{PAR}$ of the near-field pattern with respect to a number of eye-safe light source devices obtained by variously changing the height h of the cylinder 400 and changing the scatterer parameters and density in a wide range similarly to FIG. 3A in the construction of FIG. 4. Moreover, FIGS. 5B, 5C and 5D show a satisfactory near-field pattern, PAR and PAR histogram. The two-dimensional configuration of the near-field pattern has a sharp cutoff skirt portion reflecting the cross-sectional configuration of the cylinder 400 (shown in FIG. 4). Therefore, the light source size can be clearly defined, and the reproducibility in the manufacturing stage is drastically improved. Therefore, an eye-safe light source device can be produced at low cost with high yield. Moreover, if the geometrical length of the first region has almost the same value as that of the light source device shown in FIG. 2, it becomes possible to more effectively reduce the speckles by virtue of the arrangement that the multiple scattering region is surrounded by the recess portion 210 of which the outermost surface is provided by the metal layer.

In FIG. 5A, dissimilarly from FIG. 3A, the transport optical depth $L/l_{AVE}$ is plotted on the horizontal axis. In the aforementioned construction, the thickness L in the direction of the optical axis 206 of the first region 204 shown in FIG. 4 can be clearly measured, and therefore, a more comprehensive evaluation can be achieved as shown in FIG. 5A. It is possible to obtain a scattering cross section and an asymmetry factor g in accordance with the Mie scattering theory from the scatterer parameters and calculate a transport mean free path $l_{AVE}$ from the dispersion density. In FIG. 5A, the feature also seen in FIG. 3A was observed as a more general tendency without depending on the type of the scatterer. That is, if the transport optical depth exceeds one in the first region, which is the multiple scattering region that is brought in contact with the high-power semiconductor laser and is provided so as to surround this, it becomes possible to obtain a near-field pattern in which the speckles are reduced to the level at which the Class 1 level eye safety is satisfied.

However, if the rightward-sloping tendency is pursued, there are also constraints on the range in which the parameters (refractive index difference and particle size) of the scatterer itself can be changed, and eventually, the dispersion density cannot help being increased to, for example, 30 Vol % to 50 Vol %. The tendency that the speckle rather increased in the high-density region with any of the scatterers was evidently observed. If the dispersion gel in this case was observed by an optical microscope, the greater part of the scatterers is often found to be brought in contact with one another into a cluster. Although the upper limit value of the transport optical depth $L/l_{AVE}$ at which the speckles increase again differed depending on the scattering cross-sectional area (i.e., mainly the refractive index difference $\Delta n$) standardized by the geometrical cross-sectional area of each scatterer, it was found to be difficult to stably obtain a multiple scattering region such that the multiple scattering is preferably generated several tens of times or more times with respect to the dimensions of the portions supposed by this invention.

The scatterer species preferably applied to the construction of an optical system in which the geometric optical path length can be clearly defined as the multiple scattering optical system of this invention as in, particularly FIG. 1, 2 or 4 is not required to be limited to those shown in FIGS. 3A and 5A. For example, in the case where the silicone gel (refractive index to the sodium D line is about 1.40) is used as the base material, $CeO_2$ and $ZrO_2$ (refractive index: 2.3) are also suitably used in addition to the styrenic crosslinked polymer (refractive index: 1.59) and $TiO_2$ (refractive index: 2.6). Alternatively, metal oxides such as ZnO (refractive index: 2.0), $Al_2O_3$ (refractive index: 1.77) and the like, hydroxides such as Al(OH)$_3$ (refractive index: 1.6) and the like or various glass beads (refractive index: about 1.5 to 1.6) can also be preferably employed. Furthermore, it is possible to employ hollow particles (refractive index: 1.0) whose outer shell is provided by a variety of materials, calcium carbonate (refractive index: 1.6) used for pigments, a variety of other minerals among coloring agents so long as the minerals do not absorb the laser beam. Moreover, an ultraviolet curing type resin material, which generates perfectly spherical gaps and air bubbles (refractive index: 1.0) according to the curing condition, can be enumerated as a special example of the base material other than the silicone gel. Moreover, the shapes of the above-mentioned various particles are not always required to be perfectly spherical, and a multiple scattering optical system can be roughly satisfactorily constituted also by obtaining the mode Ds by averaging each dimension (size).

In the eye-safe light source device described with reference to FIG. 2 of the first embodiment and FIG. 4 of this second embodiment, the semiconductor laser is provided by the one that has an InGaAs/AlGaAs-based structure of an emission wavelength of 890 nm. That is, the active layer well layer of an ordinary 780-nm band AlGaAs-based laser for the CD-R/RW is changed to an InGaAs strained quantum well layer. It was discovered that a significant difference was generated even in the CW (Continuous Wave) operation in the wavelength spectrum expressed by the stimulated emission after multiple scattering and the wavelength spectrum measured with the single body of the semiconductor laser in the various module states shown in FIG. 3A or 5A. Particularly, an inter-longitudinal-mode contention state during high-power operation was remarkably observed in comparison with the case of a single laser in the module that had undergone comparatively high density dispersion capable of obtaining a satisfactory coherency reducing effect of a volume ratio of about 1 vol % to 30 vol %. In the construction of this invention, the first region of the multiple scattering optical system is formed so as to be adjacent to the semiconductor laser and to surround the laser. Therefore, the coherent backscattering peak component generated by the multiple scattering is fed as the so-called return light back to the output end surface of the semiconductor laser. It is presumed that the effect of increasing the spectral linewidth and the effect of inducing mode contention are generated by this return light (described later), and this can be regarded as the remarkable feature of the multiple scattering optical system of this invention.

The arrangement that the first region is located adjacent to the semiconductor laser is described here. The first region is not always required to be brought in direct contact with the semiconductor laser, and a gap region or a layer that has no scattering function of the first region may be placed between the semiconductor laser and the first region. For example, when the wettability of the semiconductor laser with respect to the base material of the first region is not good, a gap portion is generated at the interface. Moreover, a gap is generated between the semiconductor laser and the first region also in the case where a single-layer or multi-layer dielectric coating on the end surface of the semiconductor laser is formed thick to a thickness of not about a few times the normal wavelength but several tens of times or more times the wavelength. Moreover, it is possibly desired to intentionally avoid the contact between the semiconductor laser and the first region and avoid the close adhesion of the scatterers to the laser end surface. In such a case, the first region can sufficiently obtain its various operations so long as the end surface of the semiconductor laser chip and the first region are located adjacent to each other typically within a distance of about 1 mm. Otherwise, when it is desirable that the coherent backscattering peak is fed back to the laser light output end surface and arranged adjacently to an extent that the light acts as a return light, the action of the return light can be obtained so long as the single surface of the semiconductor laser chip and the first region are located adjacent to each other at a distance within a range of several micrometers to several hundreds of micrometers. Otherwise, it is acceptable to interpose a region containing comparatively large-size powder that individually behaves geometrically optically as a minute micro halfmirror or a microlens between the semiconductor laser and the first region, dissimilarly to the scatterers of the first region. That is, the optical system can be constituted so that the luminous flux from the laser is spatially expanded more effectively and the luminous fluxes divided in the first region subsequently undergoes multiple scattering. According to the construction, it becomes easier to reduce the speckles and expand the apparent light source size. As in the plurality of examples described here, the semiconductor laser and the first region are not always required to be provided in direct contact with each other.

In the eye-safe light source device of the construction of FIG. 2 or 4, the total thickness of the multiple scattering optical system, i.e., the dimension in the optical axis direction is typically required to be not smaller than about 4 mm. It is of course possible to reduce the total thickness of the optical system by providing a seating hole on the resin substrate 203 in FIG. 2 and obtaining a function similar to that of the recess portion 210 of FIG. 4. Moreover, it is possible to use a composite recess portion given by a combination of a seating hole and the aforementioned cylinder.

However, the structural example of FIG. 1, 2 or 4 does not have remarkable operation for reducing the thickness of the multiple scattering optical system. Therefore, it is possibly the case where the apparent light source size cannot be sufficiently expanded and the upper limit value of the optical output cannot help being limited when an extremely small-sized eye-safe light source device is desired to be obtained. Accordingly, an eye-safe light source device that solves such problems and more effectively functions will be described in the following third embodiment.

THIRD EMBODIMENT

Figure 6A:
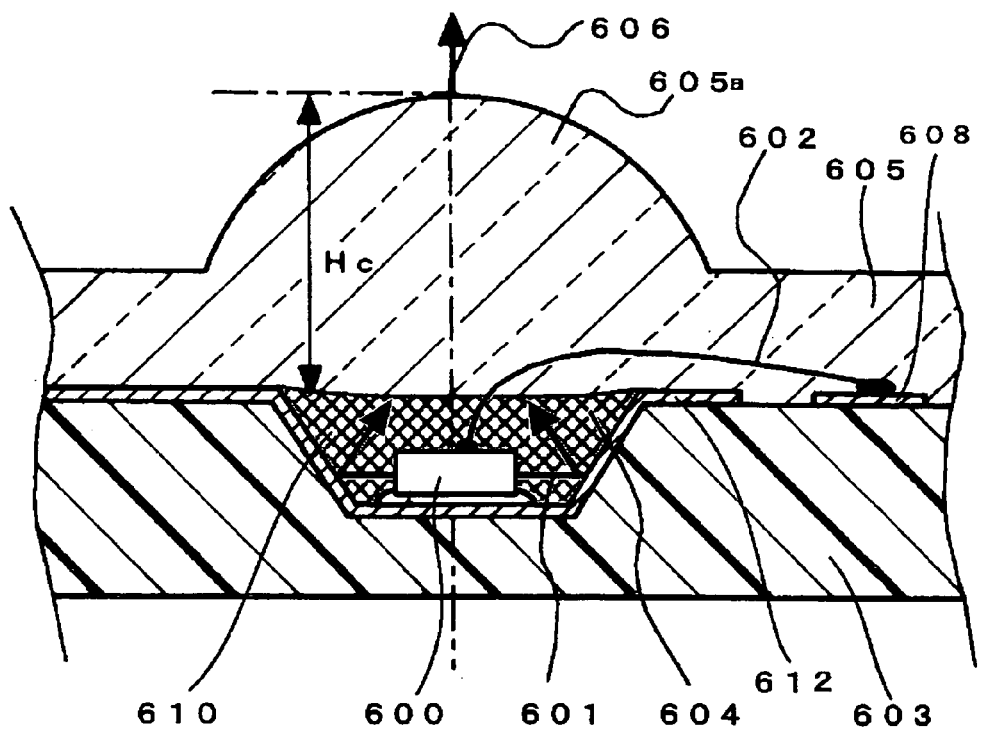
FIG. 6A is a sectional view showing a construction of the eye-safe light source device of a third embodiment of this invention.
Figure 6B:
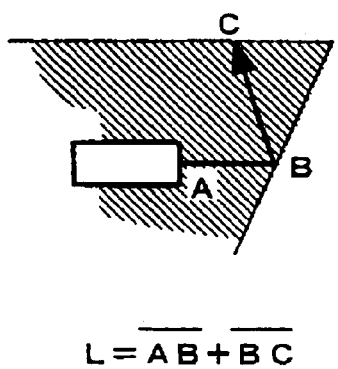
FIG. 6B is a schematic view showing the optical path of a semiconductor laser.
Figure 6C:
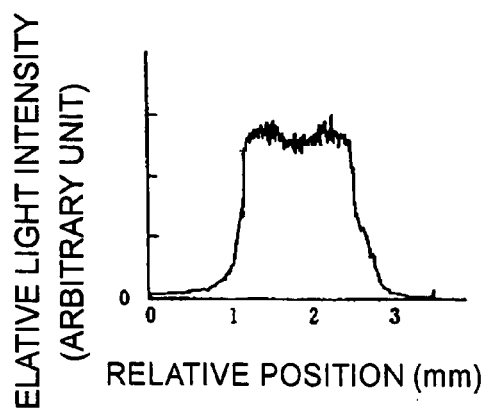
FIG. 6C is a graph showing the relative light intensity distribution of the near-field pattern.

FIG. 6A is a sectional view showing the construction of an eye-safe light source device that is a third embodiment of the light source device of this invention. FIG. 6B is a schematic view showing the optical path of a semiconductor laser. FIG. 6C is a graph showing the relative light intensity distribution of a near-field pattern.

A semiconductor laser 600 employed in the eye-safe light source device of this third embodiment was provided by one whose both end surfaces are half-wavelength coated and had a chip thickness of 100 μm, a chip width of 230 μm, a ridge stripe width of 2.5 μm and a cavity length of 500 μm. In this semiconductor laser 600, an InGaAs MQW active layer and AlGaAs-based barrier/guide/cladding layers as used in ordinary 780-nm band lasers are adjusted so that the emission wavelength becomes 890 nm. The semiconductor laser is quite the same as the semiconductor lasers described with reference to FIGS. 2 through 5A, 5B, 5C and 5D of the first and second embodiments except for the point that an optical output is obtained from both end surfaces by changing the end surface coating from AR/HR to half-wavelength coating. The semiconductor laser of this type, which provides a threshold current of about 10 mA and a COD (Catastrophic Optical Damage) level exceeding 250 mW, is thus a very advantageous device in increasing the output of the transmission means in a transceiver of a low-cost high-speed wireless optical communication system that employs Si as a detector (photodetector).

In FIG. 6A, a recess portion 610, which has a flat portion (bottom surface) of a depth of 350 μm and a cavity direction length of 600 μm and a wall surface (inclined surface) of an inclination angle of about 50°, is formed on the upper surface of a resin substrate 603. A wiring pattern 612 is formed by Au plating on the resin substrate 603 and the outermost surface of the recess portion 610. The lower surface of the semiconductor laser 600 is die-bonded to the bottom surface (wiring pattern 612) of the recess portion 610 by using a silver paste, and the upper surface of the semiconductor laser 600 is wire-bonded (by wire 602) to another wiring pattern 608.

In the above-mentioned eye-safe light source device, for example, a styrenic crosslinked particles that have an average particle size of 0.8 μm (q=4 and g=0.7 in silicone gel) and a particle size accuracy CV value of 50% is employed as a preferable scatterer. A thermosetting type silicone gel in which the styrenic crosslinked particles dispersed as scatterers at a high density of 15 wt % can be employed (refractive index difference Δn is approximately 0.2). The details of various scatterers will be described later.

The silicone gel has a principal ingredient of dimethyl polysiloxane and singly has a comparatively high flowability of a viscosity of 2000 mPa·s (2000 cP). Such the silicone gel main material is subjected to a dispersion process of the scatterers by a kneader and thereafter to a deaerating process in mixture with a hardening agent and injected into the recess portion 610 with a flowability of about 5000 mPa·s maintained. The high-density dispersion gel injected into the recess portion 610 is subjected to a thermosetting process of at least 180° C. for one hour with its configuration defined and maintained by the recess portion 610 and becomes the first region 604 of the multiple scattering optical system of this invention. Subsequently, by transfer-molding a thermosetting type epoxy resin that contains no scatterer, a second region 605 that is put in contact with the first region 604 and reaches a free space is formed, and the entire upper surface of the resin substrate 603 is integrally sealed. The second region 605 includes at least a lens portion 605a that serves as a magnifier having an optical axis 606 constituted by using a portion of a spherical surface of a radius of 1.1 mm. A geometrical distance from the bottom surface of the recess portion 610 to the top of the lens portion 605a is 1.65 mm. A multiple scattering optical system is constituted of the first region 604 and the second region 605.

In the eye-safe light source device of the above-mentioned construction, the direction of the optical axis 601 of the outgoing light from both end surfaces of the semiconductor laser 600 is converted so as to direct approximately the same direction as that of the optical axis 606 of the lens portion 605a of the second region 605 until reaching the interface between the first region 604 and the second region 605.

Furthermore, it is also preferable to combine the construction of the eye-safe light source device of FIG. 6A of this third embodiment with the construction of the eye-safe light source device of FIG. 4 of the second embodiment. Two types of the construction of the eye-safe light source device of such combination are shown in FIGS. 7A and 7C.

Figure 7A:
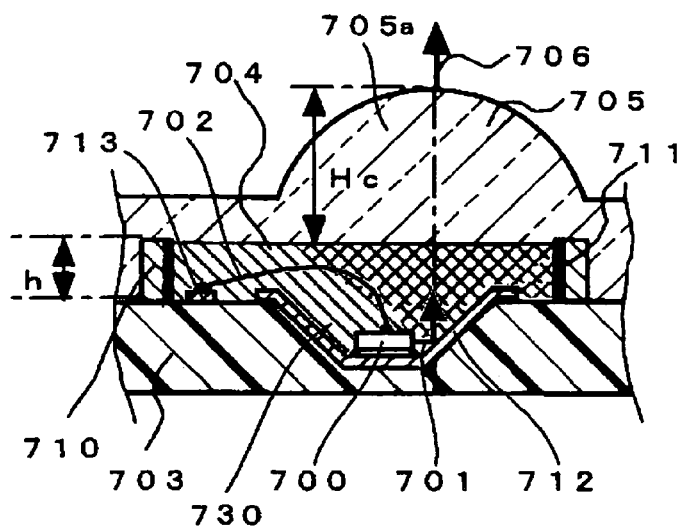
FIG. 7A is a sectional view showing another construction of the eye-safe light source device of the third embodiment.

In the eye-safe light source device shown in FIG. 7A, a truncated-cone-shaped recess portion 730, which extends upwardly of the resin substrate 703, is provided, and a semiconductor laser 700 is arranged inside the recess portion 730. An Au plating wiring pattern 712 is formed on the resin substrate 703 and the recess portion 730, and a lower electrode (not shown) of the semiconductor laser 700 is electrically connected onto the Au plating wiring pattern 712 of the recess portion 730. On the other hand, the upper electrode (not shown) of the semiconductor laser 700 is electrically connected to an electrode 713 provided on the resin substrate 703 and in the vicinity of the recess portion 730 via a wire 702. Further, a cylinder 710 is arranged on the resin substrate 703 so as to surround the recess portion 730. The cylinder 710 is fixed on the resin substrate 703 with a silver paste. Further, by forming a metal layer 711 on the inner wall of the cylinder 710 by Ag plating, the inner surface is served as a reflective surface.

A composite recess portion is defined by the wall surface and the bottom surface of the recess portion 730 and the inner wall surface of the cylinder 710. A first region 704 is formed by filling this composite recess portion with the same high density dispersion gel as that of the eye-safe light source device of FIG. 6A. Then, a second region 705 molded with epoxy resin is formed on the resin substrate 703. The second region 705 has a lens portion 705a that serves as a magnifier. In this case, output light from one end surface of the semiconductor laser 700 provided with the AR/HR coating is utilized, and the wall surfaces of the recess portion 730 are opposed at an angle of 45° in correspondence with this.

Figure 7B:
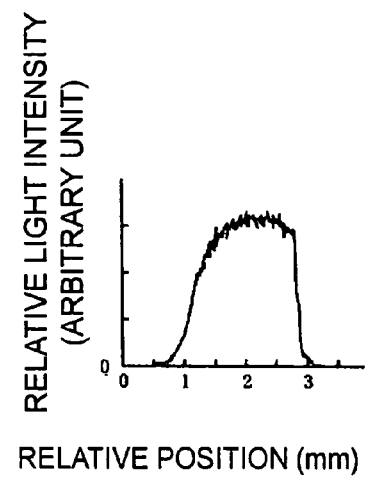
FIG. 7B is a graph showing the relative light intensity distribution of the near-field pattern of the eye-safe light source device shown in FIG. 7A.
Figure 7C:
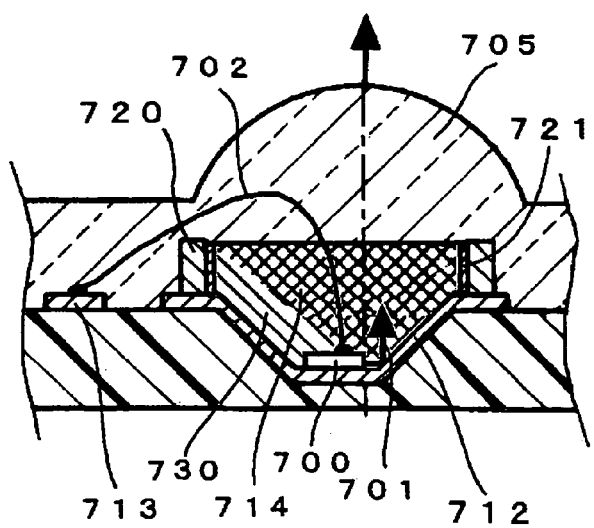
FIG. 7C is a sectional view showing another construction of the eye-safe light source device of the third embodiment.

On the other hand, dissimilarly from the eye-safe light source device shown in FIG. 7A, the eye-safe light source device shown in FIG. 7C employs a cylinder 720 that has a diameter smaller than that of the cylinder 710 and forms a first region 714 by filling a composite recess portion formed of the wall surface and the bottom surface of the recess portion 730 and the inner wall surface of the cylinder 720 with a similar high-density dispersion gel. Moreover, the electrode 713 is located outside the first region 704, and part of the wire 702 connected to this electrode 713 is located in the second region 705. A metal layer 721 is formed on the inner wall of the cylinder 720 by Ag plating. According to the construction of the eye-safe light source device shown in this FIG. 7C, although wire peeling or a defect of short-circuit with the cylinder 720 tends to occur during the transfer-molding, the flatness or symmetricity of the near-field pattern is improved in comparison with FIG. 7A (see FIGS. 7B and 7D). The other constituent elements are the same as those of FIG. 6A.

A structural point that should be noted and its remarkable effects are described here. In the eye-safe light source device of FIG. 6A or 7C, the wires 602 and 702 are extended to the inside of the epoxy resin of the second regions 605 and 705. With this construction, if the molded portions (second regions 605 and 705) damage and peel off during the operation of the eye-safe light source device, the wires 602 and 702 are peeled off together with the molded portions and broken. Consequently, the electrified circuit of the semiconductor laser 600 or 700 enters an open state. That is, in the case of the eye-safe light source device of the specifications that satisfy the safety standard by expanding the light source diameter by the lens gain of the molded portion, i.e., in the case of the eye-safe light source device of which the light source size does not satisfy the safety standard in a state in which the molded portion is peeled off, the electrification of the semiconductor lasers 600 and 700 is interrupted, never exposing the user to a perilous state. It is to be noted that the above-mentioned peril does not always occur in all the eye-safe light source devices of the design specifications that relies on the lens gain as described above. This is because the radiant intensity distribution of the scattered light from the first regions 604 and 704 almost becomes complete Lambertian in the absence of the mold lens, and the radiation angle is widened to totally reduce the radiant intensity per unit solid angle. However, the fact that an eye-safe light source device that secures sufficient safety (apparent light source size) even with no molded portion is desirable remains unchanged.

Furthermore, as a remarkable feature of the eye-safe light source device of FIG. 6A or 7C, the outermost surface metal layer of the recess portion 610 or the outermost surface metal layer 721 of the recess portion 730 is continuous within the range of the expansion of scattered light. On the other hand, for example, in FIG. 7A, an FR4 substrate 703 is exposed between the outermost surface metal layer of a seating hole portion and the inner wall metal layer 711 of the cylinder 710 at the composite recess portion 704 and brought in contact with the first region 704 particularly inside the principal region in which the spatial distribution of scattered light is comparatively intense as shown in the figure. Therefore, in FIG. 7A, when the first region is constituted by using scatterers that have a comparatively small asymmetry factor g of, for example, not greater than about 0.7 or when the geometrical optical path length is comparatively long even in the case of an arbitrary asymmetry factor g or in a similar case, the leakage quantity of the scattered light toward the resin substrate 703 side often becomes unignorable.

Therefore, as shown in FIG. 6A or 7C, a higher light output efficiency can be stably obtained as a light source device by virtue of the provision of the continuous outermost surface metal layer of the principal portion to construct a single or composite recess portion. The provision of the continuous principal metal layers is not always the structural requirement that coincides with the arrangement that the substrate side wire bonding point 608 or 713 is located outside the first region, i.e., the aforementioned feature that the wire is extended in the second region. However, in general, it is needless to say that the construction in which the wire is extended in the second region more easily obtains the continuity of the metal layers.

Moreover, in FIGS. 7A and 7C, the cross-sectional configuration of the cylinders 710 and 720 forming the aforementioned composite recess portion is not always required to be circular. A columnar or conical configuration is most preferable in simplifying the manufacturing processes and reducing the cost. However, polygons inclusive of a square and a rectangle is acceptable, and the configuration should preferably is symmetric with respect to the axis of the semiconductor laser cavity from the viewpoint of the uniformity of the near-field pattern and also the far-field pattern. Moreover, as is apparent from FIG. 4 of the second embodiment and FIGS. 6A, 7A and 7C of this third embodiment, the overall construction of the recess portion has arbitrariness. That is, it is desirable that the entire recess portion has a configuration having an opening toward the second region, and the outermost surface brought in contact with the principal portion of the scattering region is provided by a metal layer.

As in the construction of FIGS. 6A, 7A and 7C, the inclination angle of the principal wall surface of the recess portion 610, 730 is not always required to be set at 45° also in the case of the multiple scattering optical system in which the optical axis of the outgoing beam of the semiconductor laser 600, 700 roughly perpendicularly intersects the optical axis of the lens portion 605a, 705a of the second region 605, 705. That is, it is not required to provide a complete geometrical optical design since the first regions 604 and 704 receive extremely many times of scattering.

Moreover, when the optical output from one end surface of the semiconductor laser 700 is mainly utilized as in the construction of FIGS. 7A and 7C, assuming that no scatterer exists, then it is preferable to shift the center axes of the recess portion 730 and the lens portion 705a of the second region 705 so that the intersection of the interface between the first region 704 and the second region 705 and the optical axis 701 of the laser beam passes through the center point of the secondary planar light source. Moreover, it is needless to say that the peak center of the light intensity distribution on the interface between the first region 704, 714 and the second region 705 should preferably be arranged on the optical axis 706 of the second region 705.

Moreover, in the construction in which the optical outputs from both end surfaces of the semiconductor laser 600 are utilized as in, for example, the eye-safe light source device shown in FIG. 6A, there is a possible modification such that the inclination angle of the wall surface of the recess portion 610 is set large or the inclination angle of the wall surface of the recess portion 610 is conversely set small when the cavity of the semiconductor laser 600 is relatively short. That is, assuming that no scatterer exists in the first region, when the optical axis of the laser beam exists while being multiply divided, it is rather preferable to provide a design of a symmetric and uniform distribution with respect to the center point of the secondary planar light source. Thus improving the flatness of the light intensity distribution of the near-field pattern (uniformity of the averaged light intensity distribution) has the operation of directly reducing the spatial coherency and is also effective for speckle reduction.

Figure 7D:
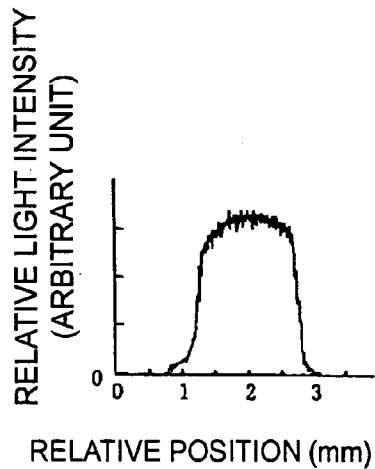
FIG. 7D is a graph showing the relative light intensity distribution of the near-field pattern of the eye-safe light source device shown in FIG. 7C.
Figure 8:
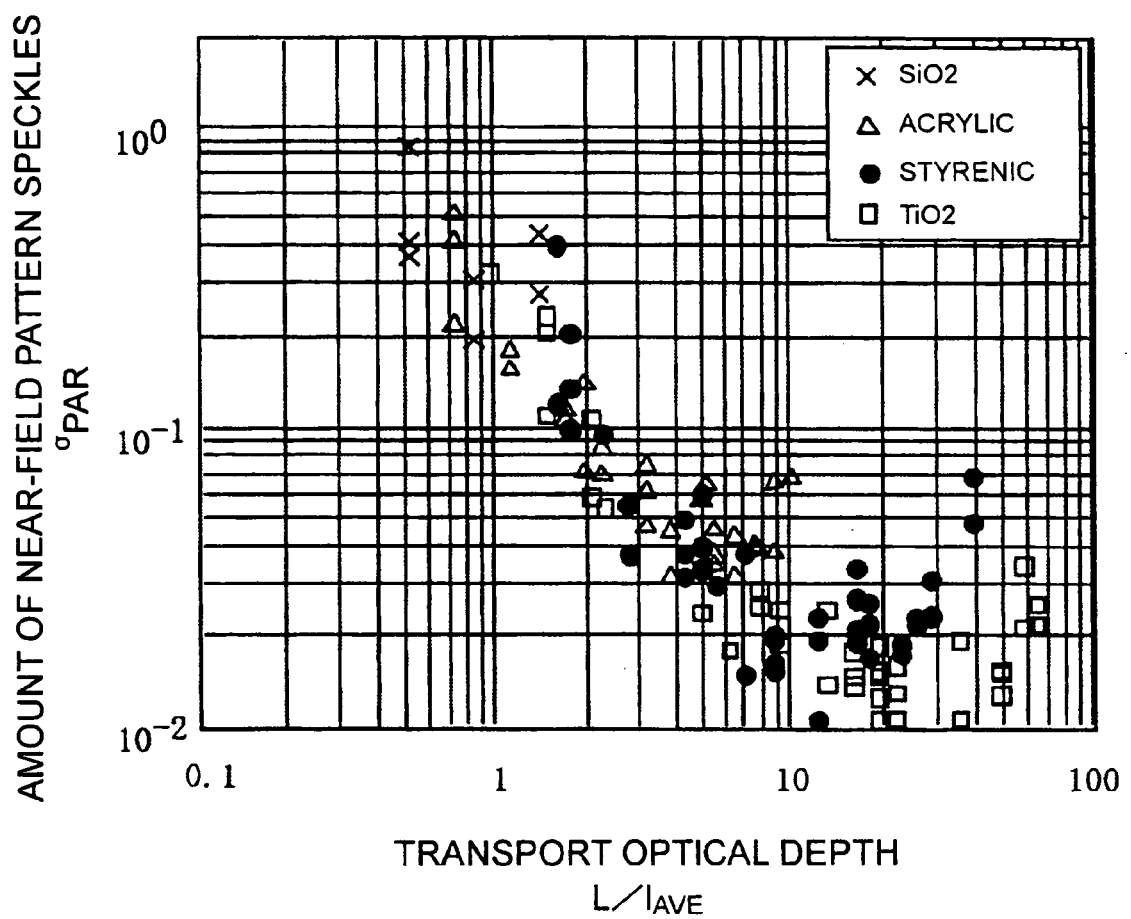
FIG. 8 is a graph showing the results of comprehensively evaluating the near-field pattern in the eye-safe light source devices shown in FIGS. 6A, 7A and 7C.

FIG. 8 shows the results of comprehensively evaluating the near-field pattern in many eye-safe light source devices in which the various scatterers described with reference to FIG. 3A are dispersed in various sizes at various densities in the silicone gel with regard to the construction of the eye-safe light source device shown in FIGS. 6A, 7A and 7C. The horizontal axis of FIG. 8 represents a transport optical depth $L/l_{AVE}$ that is a value obtained by dividing a geometrical distance L (see FIG. 6B) of the length of the optical axis of the laser beam passing through the first region when it is virtually assumed that no scatterer exists, by the transport mean free path $l_{AVE}$ in the first region. The vertical axis of FIG. 8 represents the amount of speckles $\sigma_{PAR}$ of the near-field pattern. The satisfactory relative light intensity distributions of the near-field patterns of the constructions shown in FIGS. 6A, 7A and 7C are shown in FIGS. 6C, 7B and 7D, respectively.

It is evident from comparison of FIG. 8 with FIG. 3A or 5A that the value of the amount of speckles $\sigma_{PAR}$ has been totally reduced. Moreover, according to the constructions of FIGS. 6A, 7A and 7C, it becomes possible to reduce the total thickness of the optical system by effectively increasing the scattering frequency by virtue of the arrangement that the multiple scattering region is surrounded by the recess portion of which the outermost surface is provided by a metal layer even with the same geometrical length. Particularly, there was distinctly confirmed a tendency that the speckles were possibly increased when the transport optical depth exceeded several tens of times by simple conversion due to the increase in the thickness of the first region particularly in the constructions of FIGS. 7A and 7C, the tendency being similar to FIG. 5A of the second embodiment.

Moreover, it was found that a metal oxide such as $TiO_2$, styrenic polymer and so on, in which the size parameter q of the particle size distribution mode Ds was within the range of approximately 1 to 15 and which could take a comparatively large refractive index difference Δn (Δn≧0.15) with respect to the silicone gel were very preferable as a scattering material for the construction of the recess portion in FIG. 6A or FIGS. 7A and 7C, and this tendency is almost similar to FIG. 5A of the second embodiment.

A preferable scattering characteristic was obtained by dispersing these scatterers at a density of typically 0.5 vol % to 30 vol % and more preferably 1 vol % to 15 vol %. The dispersion gel that had the preferable scattering characteristic was observed by an optical microscope using the amount of speckles $\sigma_{PAR} \leq 10^{-1}$ as a criterion, and it was discovered that the scatterers were roughly uniformly distributed and an average value <R> of the nearest neighbor distance consistently satisfied the relation of <R>≦20Ds. Moreover, the amount of speckles $\sigma_{PAR}$ abruptly rose at an average value <R>≧30Ds. Conversely, there was distinctly observed the tendency that the speckle started to increase when the scatterer density was typically increased to 30 vol % or higher. In the dispersion gel in this state, there was often observed the case where a cluster of not smaller than 10 μm was formed and the ratio of a sparse space was extremely increased.

As a new effect of the construction of FIGS. 6A, 7A and 7C, as is evident from the relative light intensity distribution of the near-field pattern of FIGS. 6C, 7B and 7D, the flatness of the entire near-field pattern was improved. As previously described, the aforementioned characteristic produces great effects (described later) since it exerts a direct influence on speckle reduction, narrows the width of the far-field pattern and restrains the useless skirt component trailing. Furthermore, the expansion of the two-dimensional light source formed at the interface between the first region and the second region had a configuration approximately similar to that of the opening of the recess portion, and therefore, an eye-safe light source device that was able to distinctly define the light source size was made manufacturable with a reliable margin and high yield.

Moreover, in comparison with the construction of the eye-safe light source device shown in FIG. 4 of the second embodiment, there are the effects that the geometrical length L is extended by the optical axis conversion by the recess portion wall surface that has an inclined surface as shown in FIG. 6B and light efficiently spreads in the first region as a consequence of the irregular reflection on the roughened surface of the metal layer of the wall surface of the recess portion. Therefore, in comparison with the construction of the eye-safe light source device of FIG. 2 of the first embodiment and the eye-safe light source device of FIG. 4 of the second embodiment, the scatterer density can be reduced, and the dispersion process becomes easy. Moreover, by providing a degree of freedom in the design of the first region as in FIGS. 7A and 7C, the permissible range with respect to the particle size distribution of the scatterers was able to be expanded, and the manufacturing yield of the eye-safe light source device was able to be remarkably improved. Particularly, even in the case of the acrylic crosslinked polymer particles that had a comparatively small refractive index difference Δn of 0.09 with respect to the base material, a desirable scattering characteristic was sometimes found in a comparatively high density range of about 5 vol % to 20 vol %. Such the acrylic particles can be comparatively easily reduced in the particle size among the organic particles, and this is preferable in terms of cost.

Figure 9A:
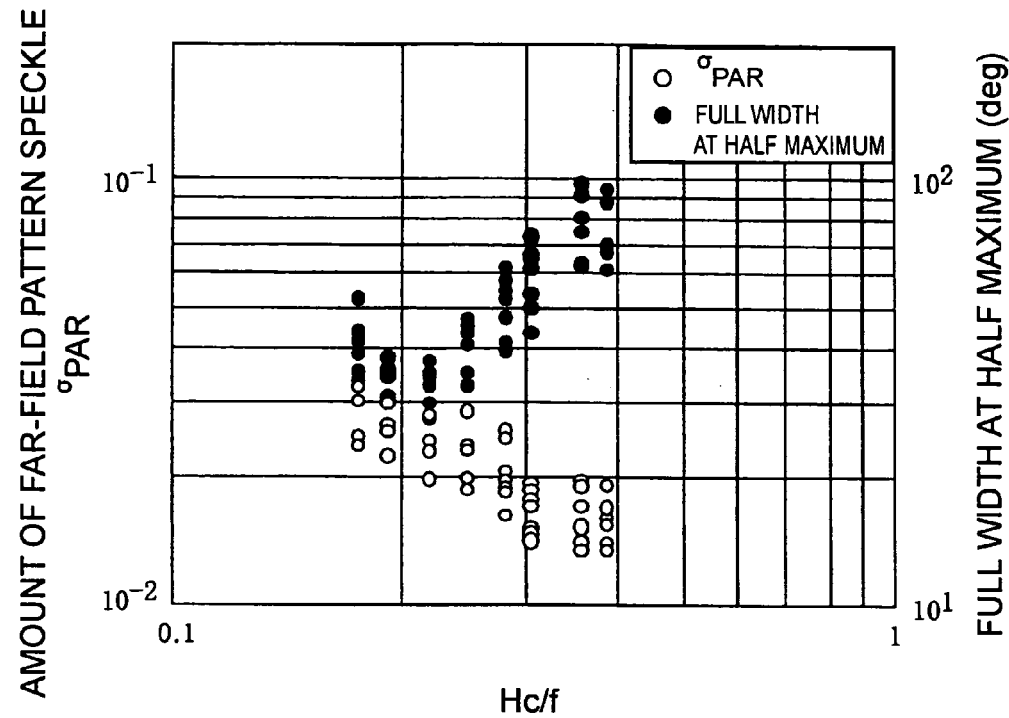
FIGS. 9A, 9B and 9C are graphs showing the results of evaluating the full width at half maximum and the amount of speckles of the far-field pattern in the eye-safe light source devices shown in FIGS. 6A, 7A and 7C.

The far-field pattern will be described next. In contrast to the construction of FIG. 6A, a distance Hc from the interface between the first region 604 and the second region 605 to the top of the lens portion 605a as the magnifier of the second region 605 was changed, and the radius R of the lens portion 605a of the second region 605 was changed from 1.0 mm to 1.5 mm. Moreover, by variously changing the height h of the cylinders 710 and 720 of FIGS. 7A and 7C in the construction of FIGS. 7A and 7C, a distance Hc from the interface between the first region 704, 714 and the second region 705 to the top of the lens portion 705a as the magnifier of the second region 705 was changed, and the radius R of the lens portion 705a of the second region 705 was changed between 1.0 mm and 1.5 mm inclusive. Further, according to the construction of FIG. 6A or FIGS. 7A and 7C, the diameter of the secondary planar light source was also changed within a range of about 0.5 mm to 3 mm. The results of evaluating the full width at half maximum of the far-field pattern and the amount of speckles $\sigma_{PAR}$ regarding the various modules are shown in FIG. 9A. Although the amount of speckles $\sigma_{PAR}$ can be defined regarding the far-field pattern by a method similar to that of the near-field pattern, it is required to pay attention to FOV (viewing angle) of the measurement system in order to perform consistent evaluations. In this case, a specification slightly stricter than IrDA was assumed, and the radiant intensity distribution (FFP) was measured by setting a solid angle of the photodetecting portion of a diameter of 1 mm viewed from a distance of 1 m as a measurement step and fixing the resolving power higher than this.

Figure 9B:
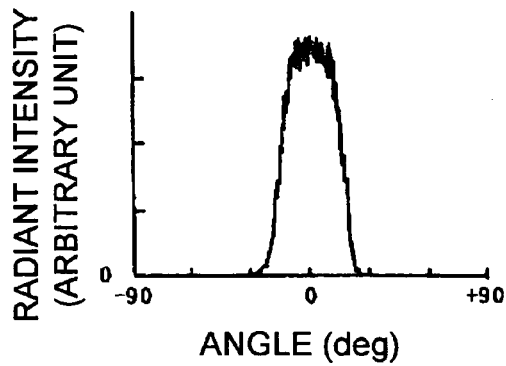
Figure 9C:
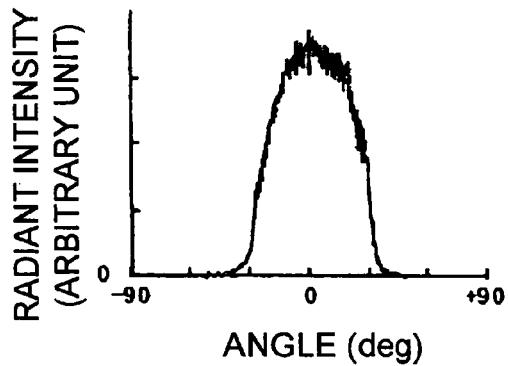

According to the construction of the eye-safe light source device of FIG. 6A, the radius of the spherical lens portion 605a is R=1.1 mm, and the refractive index n of epoxy resin of the material is about 1.5. Therefore, the focal distance f is expressed by:

$$f = R \cdot n / (n-1)$$

and the focal point appears at a distance of approximately 3.3 mm on the resin substrate 603 side away from the top of the lens portion 605a. Since the distance Hc from the top of the lens portion 605a to the interface between the first region 604 and the second region 605 is about 1.3 mm, Hc/f of the horizontal axis is 0.39. By reducing this Hc/f and arranging the focal position deeper on the resin substrate 603 side, the radiant intensity distribution (FFP) is narrowed. In accordance with this, the amount of speckles SPAR of the far-field pattern is also increased. There was found the tendency that the radiant intensity distribution (FFP) started to spread again and the amount of speckles was saturated when the secondary planar light source was located excessively closer to the lens top. In this case, as is evident from FIGS. 9B and 9C, it can be understood that the skirt trailing of the radiant intensity scarcely occurs in a wide-angle region outside the half-value angle both when the full width at half maximum is comparatively narrow (about 20 degrees on FIG. 9B side) and when it is comparatively wide (about 60 degrees on FIG. 9C side), and it can be understood that a radiant intensity distribution (FFP) resembling a rectangle that cannot be expressed by the generalized Lambertian (n-th power of cosine) is obtained.

In the greater part of the region of the data shown in FIG. 9A, the amount of speckles $\sigma_{PAR}$ was reduced in inverse proportion to almost the second power of the full width at half maximum of the radiant intensity distribution (FFP).

This is attributed to the fact that the spatial coherency still remains in the near-field pattern when locally viewed (on the order of the size of the scatterer) although the global coherency of the secondary planar light source is almost lost as a whole. During the process in which the final scattered light from each surface element of the secondary planar light source is radiated at a minute angle with the mutual correlation possessed and converted from the near-field pattern into the far-field pattern in the second region, the probability of re-intersection at a minute angle cannot be rendered zero. In the second region constituted so as to obtain a narrow full width at half maximum, the probability of intersection is relatively increased, and an extremely large number of speckle patterns that individually have no correlation are overlapped with one another in the far-field pattern. Therefore, it is also difficult to make the speckles completely disappear although speckles for extremely reducing the radiant intensity are not generated. Moreover, if the radiation angle of full width at half maximum exceeds 100°, then the correlation between the amount of speckles and the half-value angle is collapsed, and a useless skirt component trailing outwardly of the half-value angle comes to occur in the radiant intensity distribution (FFP) (not shown). With regard to Hc/f of this region, it is difficult to constitute the optical system so as to guide all the quantity of light to the second region, and the optical output or efficiency is also reduced.

However, by constituting the second region of the multiple scattering optical system as described above to reduce the probability of the occurrence of the aforementioned intersection at a low angle, the amount of the far-field pattern speckles was able to be restrained to a nonproblematic value at least in the range of full width at half maximum of a radiation angle of about 20° to 60° practically important for wireless optical communication uses ($\sigma_{PAR} \ll 10^{-1}$). In order to obtain a narrower radiant intensity distribution (FFP), it is proper to provide the second region with, for example, an aspherical lens and arrange the aspherical lens so that the lens operates as a magnifier for the secondary planar light source.

The hiding power, which can become a common problem in the first regions shown in FIG. 4 of the second embodiment and FIGS. 6A, 7A and 7C of this third embodiment, is described here. If the first region is constituted by dispersing scatterers that have a high refractive index difference (refractive index difference Δn>0.5) of a comparatively small diameter (size parameter q is about one to three) in the desirable range of the constructions shown in FIGS. 4 and 6A and FIGS. 7A and 7C at a density of, for example, not smaller than 20 vol %, then there sometimes occurs the case of a module of which the total quantity of output light falls short of the half of the original output of the semiconductor laser although the amount of speckles $\sigma_{PAR}$ can be extremely reduced to an extremely small level ($<10^{-2}$). This is ascribed to a plurality of causes, which principally include the two principal causes of the case where the accumulation of absorption by the metal layer on the outermost surface of the recess portion becomes a problem due to an extremely great scattering frequency and the case where the oscillation characteristic of the semiconductor laser itself is disadvantageously changed by return light due to coherent backscattering from the first region that includes scatterers at a high density.

A modification example the construction of the first region that avoids such problems and is effective in common to FIG. 4 of the second embodiment and FIGS. 6A, 7A and 7C of the third embodiment will be described next. This modification example can be preferably put into practice even in the case where it is difficult to obtain a uniform dispersion of the scatterers of a comparatively small diameter. For example, it is proper to use the aforementioned scatterers as the main (maximum in terms of number density) and mix and disperse scatterers of a relatively large diameter ($q \geq 10$) that deviates from the aforementioned range (size parameter q is one to three) Also, in this case, the dispersion is achieved so that the average nearest neighbor distance including all the scatterers falls within about twenty times the mode, i.e., the mode Ds of the scatterers mainly dispersed. With this arrangement, there is obtained the effect of improving the output efficiency from the second region while sufficiently reducing the amount of speckles. This is achieved by the synergistic effects of the fact that the asymmetry small scattering due to the main scatterers still occurs an extremely large number of times and the fact that the effect of wave front splitting and phase disordering of light can be expected even the subordinate scatterers exhibit a sharp forward scattering characteristic. Typically, there was able to be found a dispersion condition in which the problem of the hiding power was avoided by maintaining the amount of speckles $\sigma_{PAR}$ at $3 \times 10^{-2}$ even when the main-to-sub blend ratio was changed to at least about 9:1 to 8:2, and almost no difference was recognized in the current-to-optical output characteristic between a semiconductor laser in a chip state and the aforementioned various modules. As described above, there was found the condition in which the dispersion process is facilitated by carrying out the mixed dispersion in the first region, and eye safety was satisfied while bringing the scattering characteristic of the first region close to the characteristic supposed with regard to the main scatterers.

It is also acceptable to constitute the first region of a laminate constructed of a plurality of two or more layers by arranging scatterers that have different parameters spatially separately or spatially changing the dispersion density even in the case of the same scatterers in the first region instead of carrying out the mixed dispersion. Such the modification can be extremely easily carried out for the first regions shown in FIG. 4 of the second embodiment and FIGS. 6A, 7A and 7C of the third embodiment.

For example, in a situation that monodispersion of the scatterers having a comparatively smaller particle size of a size parameter q of about 1 to 15 at a density of 15 vol % is difficult and a sufficient scattering characteristic cannot be obtained at a density of 15 vol % even if uniform dispersion is possible, it is acceptable that ninety percent of the region adjacent to the semiconductor laser of the first region is constructed of a 5-vol % monodispersion layer of the scatterers and a thin layer in which the same scatterers are dispersed at a high density of 50 vol % is provided in its uppermost ten percent of the region.

It was possible to obtain a sufficient speckle reducing effect while restraining the hiding power by principally producing the effect of dividing the coherent wave front into a plurality of portions in the region that occupies the greater part of the first region and thereafter generating sufficient multiple scattering in the uppermost layer. By thus forming the first region into a multi-layer, the total cost becomes disadvantageous although the difficulties in optimizing the dispersion process are reduced.

It is to be noted that the effect of the modification example of the first region described here is not limited to the solution of the problem of the hiding power. For example, if the optical system can take a comparatively lose restriction on the size and a long total optical path length, it becomes possible to further facilitate the dispersion process or facilitate the handling by maintaining the viscosity after the dispersion process comparatively low.

In the structural examples described hereinabove, as is apparent from the configuration of the near-field pattern actually described, it is not easy to obtain a constant average intensity distribution, i.e., a near-field pattern resembling a rectangle as an apparent light source. This is not always the necessary condition of eye safety. However, for example, when the width of the near-field pattern of which the light intensity becomes equal to or lower than 1/e is varied every lot due to the fact that the configuration of the light intensity distribution is not simple, the manufacturing yield is worsened, possibly causing a cost increase. Moreover, there is a tendency that the desired multiple scattering characteristic cannot be obtained when the thickness in the optical axis direction of the multiple scattering optical system is extremely thin unless the dispersion is carried out at a density at which the hiding power becomes a problem. Moreover, when an extremely distorted distribution configuration is possessed, it is sometimes the case where the configuration and symmetricity of the radiant intensity distribution (FFP) become impracticable.

Accordingly, an eye-safe light source device capable of solving the aforementioned problems and more effectively reducing speckles with higher manufacturing yield in response to the demands for further reducing the size and thickness will be described next in the following fourth embodiment.

FOURTH EMBODIMENT

Figure 10A:
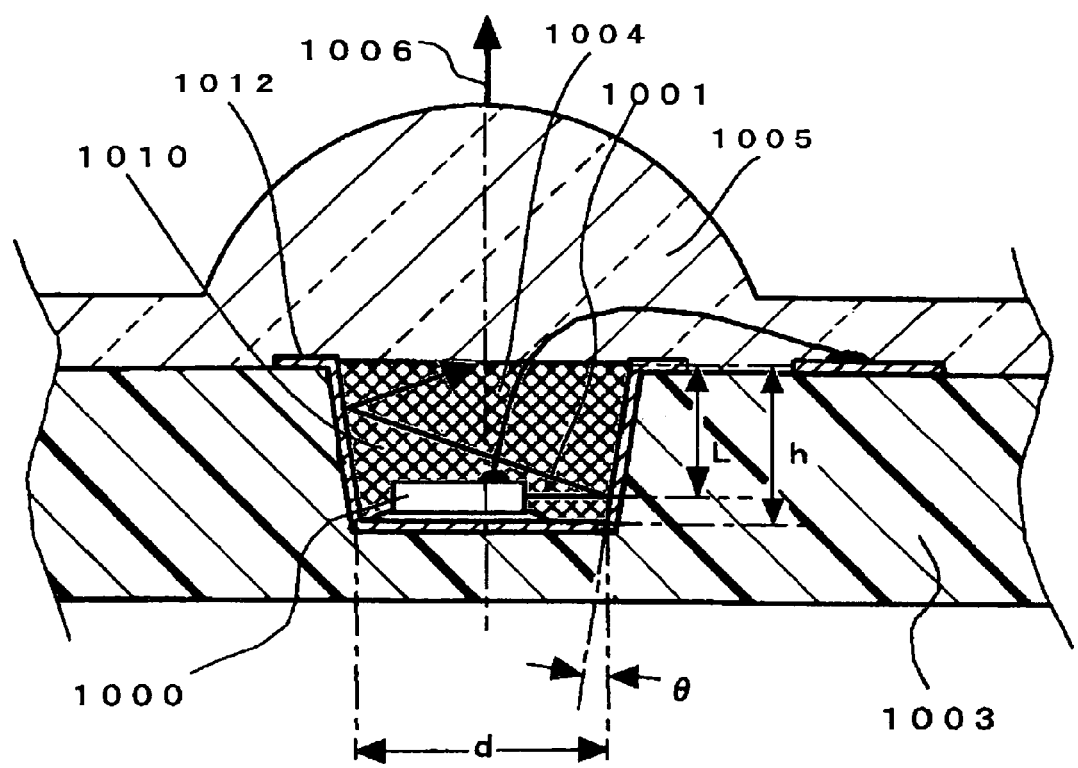
FIG. 10A is a sectional view showing a construction of the eye-safe light source device of a fourth embodiment of this invention.

FIG. 10A is a sectional view showing the construction of an eye-safe light source device as the light source device of the fourth embodiment of this invention. The eye-safe light source device of this fourth embodiment has a construction similar to that of the eye-safe light source device shown in FIG. 3A of the third embodiment except for the configuration of the recess portion.

In FIG. 10A, the principal wall surface portions of a recess portion 1010 formed on a resin substrate 1003 are constituted so that the diameter thereof extends toward its opening and have a depth h=400 μm and a bottom surface diameter d=800 μm, defining an aspect ratio r (=h/d) of 0.5. Moreover, a wiring pattern 1012 is formed on the resin substrate 1003 and the outermost surface of the recess portion 1010 by Au plating. The lower surface of the semiconductor laser 1000 is directly fixed on the bottom surface (wiring pattern 1012) of the recess portion 101 with a silver paste. The wall surface is inclined so that an angle $\theta$ made between the normal line of the wall surface of the recess portion 1010 and the optical axis 1001 of the outgoing beam of the semiconductor laser 1000 becomes $\theta=6°$ in terms of design, and assuming that no scatterer is contained in the first region, the optical axis of the outgoing beam of the semiconductor laser 1000 is converted a plurality of times in the recess portion 1010 as shown in FIG. 10A.

It is proper to form the wall surface of such recess portion 1010 through a process for penetrating, for example, a metal rod (not shown) that has the angle $\theta$ and a bottom surface diameter into the resin substrate 1003 while controlling the penetration depth. Subsequently, the wiring pattern 1012 is formed by carrying out underplating of nickel and copper and a main plating process of silver on the resin substrate 1003 that has the recess portion 1010. Therefore, the metal layer, which constitutes the outermost surface of the recess portion 1010, is silver. Moreover, with this arrangement, the leakage of scattered light on the substrate 1003 side or in the directions other than the optical axis direction 1006 of the second region can be restrained as described with reference to FIGS. 6A, 7A and 7C.

Subsequently, after an InGaAs/AlGaAs-based semiconductor laser 1000 on a GaAs substrate of an emission wavelength of 890 nm is wire bonded to the die bond, acrylic crosslinked polymer particles of a particle size mode Ds=4 μm are dispersed by 3 wt % in a thermosetting type silicone gel, and the resulting gel is injected into the recess portion 1010 and hardened to form a first region 1004 of a multiple scattering optical system. Further, a second region 1005 of the multiple scattering optical system is completed by transfer molding with epoxy resin.

Figure 10B:
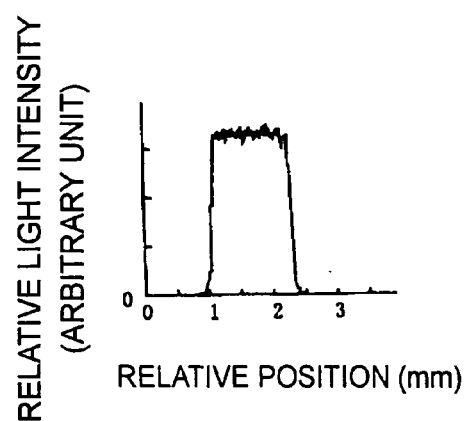
FIG. 10B is a graph showing the relative light intensity distribution of the near-field pattern of the above eye-safe light source device.

FIG. 10B shows the relative light intensity distribution of the comparatively satisfactory near-field pattern actually obtained by the eye-safe light source device of the aforementioned construction. With regard to the construction of the principal wall surface of the recess portion 1010, according to:

$$C_{min} \cdot r = 1 \text{ and}$$

$$C_{max} \cdot r = 20,$$

the inclination angle $\theta$ [deg] satisfies:

$$C_{min} \cdot r \leq 3 \leq \theta \leq C_{max} \cdot r.$$

Even when the thickness in the optical axis direction 1006 of the second region 1005, i.e., the depth h has a small value of 400 μm, the speckles can be reduced by effectively generating the multiple scattering. Moreover, even by comparison with all the structural examples described hereinbefore, it can be understood that the flatness of the intensity distribution of the secondary planar light source formed at the interface between the first region 1004 and the second region 1005 is remarkably improved. With this arrangement, the speckles can be reduced most effectively within a minute volume.

Concurrently with this, a sharp configuration with no skirt trailing was obtained at a radiation angle of a full width at half maximum of about 30° with regard to the far-field pattern. Moreover, an extremely low value of approximately $2 \times 10^{-2}$ was obtained as the amount of speckles $\sigma_{PAR}$ of the near-field pattern, and a value of approximately $1 \times 10^{-2}$ was obtained as the amount of speckles $\sigma_{PAR}$ of the far-field pattern. Furthermore, it was confirmed that the output efficiency was not reduced even when the chip state of the semiconductor laser was compared with the IL characteristic of the eye-safe light source device state by an IL (current-to-optical output) measurement system that was able to receive only the output light within a specified solid angle.

Figure 11A:
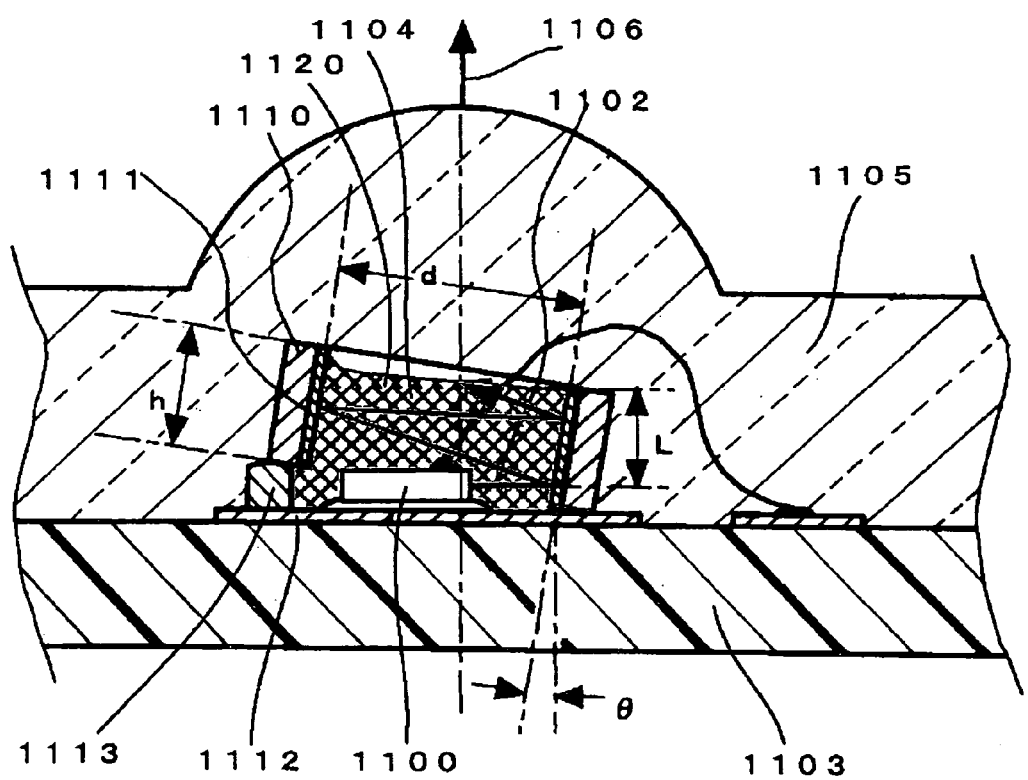
FIG. 11A is a sectional view showing another construction of the eye-safe light source device of the fourth embodiment of this invention.

FIG. 11A shows the construction of another eye-safe light source device that reduces the speckles by effectively uniforming the near-field pattern similarly to the eye-safe light source device shown in FIG. 10A. In this case, the principal portion of the composite recess portion 1120 in the first region is constructed of a cylinder 1110 of which the cross-sectional configurations of the opening portion and the bottom surface portion are almost identical. A metal layer 1111 is formed on the inner peripheral surface of the cylinder 1110 by Ag plating. The entire recess portion 1120 is constructed including an Au plating wiring pattern 1112 and an Au bump 1113 on a resin substrate 1103, and its outermost surface is almost provided by a metal layer.

The cylinder 1110, which is the principal portion of the recess portion 1120, has a height h=350 μm and an inside diameter d=800 μm, defining an aspect ratio r (=h/d) of 0.44.

The cylinder 1110 was placed inclined on the resin substrate 1103 so that an angle θ (inclination angle) made between the normal line of the metal layer 1111 and the optical axis 1102 of the outgoing beam of the semiconductor laser 1100 becomes approximately six degrees. In this case, because $r/5=0.09$, $\tan θ=0.11$, and $r/2=0.22$, the following relation:

$r/5 \leq \tan θ \leq r/2$ is satisfied. The inclination angle θ is relative, and the same effect can be obtained also by making the axis of the principal portion (cylinder 1110) of the recess portion 1120 coincide with the normal line of the resin substrate 1103 and die-bonding the semiconductor laser chip inclined instead. Anyway, it is easier to precedently die-bond the semiconductor laser in terms of the order of mounting.

With regard to the wall surface of the recess portion 1120, the manufacturing processes and the devising for providing the inclination can be more easily carried out by rather subsequently attaching the cylinder 1110 prepared with the metal layer 1111 provided at least on the entire inner wall surface onto the resin substrate 1103 that has undergone a wiring patterning process, dissimilarly to the eye-safe light source device shown in FIG. 10A. In FIG. 11A, the inclination angle θ is accurately secured by arranging the Au bump 1113 of a height of about 80 μm on the Au plating wiring pattern 1112 and fixing the bump with a silver paste interposed between the pattern and the cylinder 1110. Although it is easy to consider other various modification examples with regard to the provision of the inclination angle θ, it is required to form the entire recess portion 1120 without any gap between the portion and the resin substrate 1103 in consideration of the injection of a highly flowable material of gel, elastomer or the like in the subsequent process. Moreover, with this arrangement, the leakage of scattered light on the resin substrate 1103 side or in directions other than the optical axis direction 1106 of the second region can be restrained as described with reference to FIGS. 6A, 7A and 7C.

In the eye-safe light source device of this FIG. 11A, a first region 1104 of a multiple scattering optical system is formed by injecting a thermosetting type silicone gel in which styrenic crosslinked polymer particles of a particle size mode Ds of 6 μm are dispersed by 6 wt % into the recess portion 1120. Further, a second region 1105 of the multiple scattering optical system is formed by transfer molding with epoxy resin.

Figure 11B:
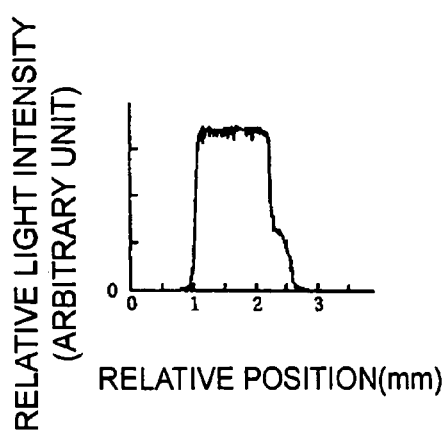
FIG. 11B is a graph showing the relative light intensity distribution of the near-field pattern of the above eye-safe light source device.

FIG. 11B shows the near-field pattern actually obtained by the eye-safe light source device of the above-mentioned construction. In the construction of the principal wall surface of the recess portion 1120, the angle θ [deg] made between the normal line of the wall surface and the optical axis of the outgoing beam of the semiconductor laser satisfies the relation:

$\max\{a \tan(r/5), 3\} \leq θ \leq a \tan(r/2)$.

Therefore, even when the height h of the cylinder 1110 (thickness in the optical axis direction 1106 of the first region) had a short length of 350 μm, the speckles were able to be reduced by effectively generating the multiple scattering. Similarly to the eye-safe light source device of FIG. 10A, it can be understood that the secondary planar light source uniformity is extremely high and the speckles of the near-field pattern and the far-field pattern are extremely small (the amount of speckles $σ_{PAR}$ of the near-field pattern is approximately $8×10^{-3}$, and the amount of speckles $σ_{PAR}$ of the far-field pattern is approximately $1×10^{-2}$). Moreover, it was confirmed that the output efficiency was scarcely reduced when the chip state of the semiconductor laser 1100 was compared with the current-to-optical output characteristic of the eye-safe light source device.

However, if a scatterer that singly had a large standardized scattering cross-sectional area and a high isotropy was employed in the first regions 1004 and 1104 in which multipath reflection and multiple scattering were used together as shown in FIG. 10A or 11A of this fourth embodiment, there were the tendencies that diffusion in the direction perpendicular to the optical axes 1006 and 1106 of the second regions 1005 and 1105 did not sufficiently occur, and it was difficult to obtain a uniform near-field pattern intensity distribution as a secondary planar light source, when the speckles were not sufficiently reduced. Moreover, there was found the tendency that the output efficiency was reduced even a uniform near-field pattern could be obtained, and the influence of the hiding power was actualized. Conversely, it was discovered that excessive speckles (e.g., $σ_{PAR} > 3×10^{-1}$) were possibly generated even though the dimensions of the portions and the type, density and mixture ratio of the scatterers were optimized when the inclination angle θ exceeded about 10° in the construction of FIG. 10A or when the inclination angle θ exceeded about 15° in the construction of FIG. 11A according to the evaluation results of the modules in which preferable scatterers of a comparatively large particle size of a size parameter q of about 10 to 50 were employed and the inclination angle θ was changed.

Furthermore, when a scatterer of a comparatively large particle size of a size parameter q of about 10 to 50 was employed and the inclination angle θ was set to 0°, there were many eye-safe light source devices in which a radiant intensity at a wide angle occurred, and the optical output was reduced by 10% or more through the measurement of total quantity of light by means of an integrating sphere although the full width at half maximum of the far-field pattern was not significantly changed in each of the constructions of FIGS. 10A and 11A. This is mainly ascribed to the fact that the cumulative effect of minute absorption of scattered light incident on the wall surface of the recess portions 1010 and 1120 at an approximately right angle. It was found to be desirable to provide an inclination angle θ of not smaller than at least 3° in order to avoid the problem that the radiant intensity occurred at the wide angle although the inclination angle θ could take a very small value depending on the aspect ratio r of the recess portions 1010 and 1120 and the problem that the optical output was reduced by 10% or more through the measurement of total quantity of light by means of the integrating sphere.

As described above, in the case of the first region of FIG. 10A in which the multipath reflection and the multiple scattering are used, because $C_{min} \cdot r = 1$ and $C_{max} \cdot r = 10$, the principal wall surface of the recess portion 1010 is constituted at an aspect ratio r such that the inclination angle θ satisfies:

$C_{min} \cdot r \leq 3 \leq θ \leq C_{max} \cdot r$.

Moreover, in the case of FIG. 11A, the principal wall surface of the recess portion 1120 is constituted at an aspect ratio r such that the inclination angle θ satisfies:

max{a tan(r/5),3}≦θ≦a tan(r/2).

Further, it was found that the aforementioned plurality of conflicting requirements were able to be satisfied when the scatterers dispersed mainly in the first region were made to have a comparatively large particle size of a size parameter q of about 10 to 50.

Moreover, it is possibly the case where the speckle reducing effect cannot sufficiently be obtained although the light source size is easily enlarged and flattened by employing the scatterers of a comparatively large particle size as described above. In such a case, it is proper to disperse scatterers of a comparatively low refractive index difference like, for example, acrylic particles at a density of mainly 1 vol % to 30 vol %, typically about 10 wt %, further add subordinate particles (e.g., $TiO_2$ particles having an average diameter of 0.3 μm) having high scattering abilities at a ratio of 0.1 vol %, the subordinate particles having a refractive index difference Δn≧0.2 and a size parameter q≦10, and mix and disperse those particles. A condition for solving the aforementioned problem that the speckle reducing effect could not sufficient be obtained was able to be found by setting the volume ratio of the subordinate scatterers to be mixed and dispersed to approximately 0.01 vol % to 0.1 vol % and setting the range up to 1 vol % according to circumstances.

Figure 12:
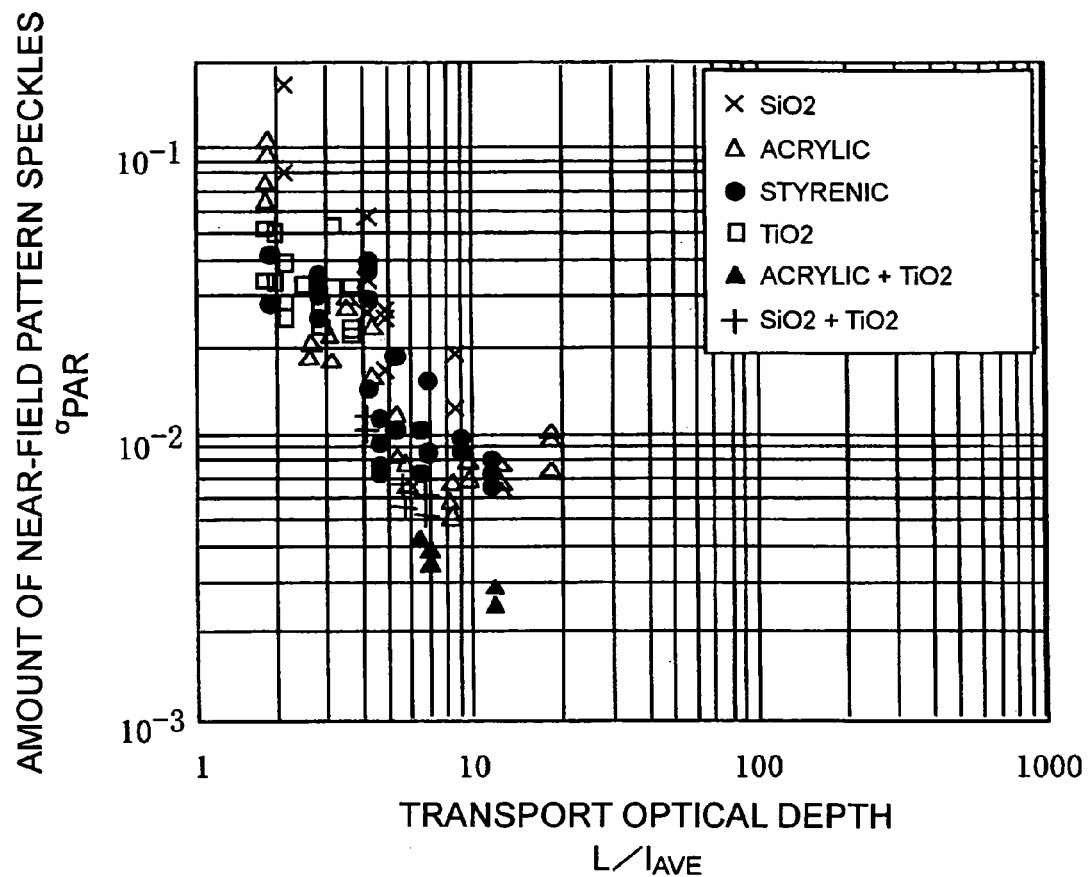
FIG. 12 is a graph comprehensively showing data concerning the near-field pattern of the eye-safe light source device shown in FIG. 11A.

Various scatterers are applied to the constructions of FIGS. 10A and 11A, and the results concerning the near-field patterns that have remarkable differences from particularly the aforementioned other constructions are shown in FIG. 12. In particular, the results concerning the mixed dispersion of the main scatterers of a low refractive index difference and the subordinate scatterers of a high refractive index difference are additionally shown. In this case, the horizontal axis of FIG. 12 represents the transport optical depth $L/l_{AVE}$ similar to that of FIG. 5A or 8, and the plotting of the geometrical dimension L is changed (see FIGS. 10A and 11A). This is because the definition of the length according to the figures is almost meaningless in the actual multiple scattering optical system although FIGS. 10A and 11A schematically show the state in which the optical axis of the outgoing beam of the semiconductor laser is converted assuming that there is no scatterer. Therefore, evaluations were made by setting the thickness of the first regions 1004 and 1104 and the second regions 1005 and 1105 to L in the direction of the optical axes 1006 and 1106.

As the remarkable feature of FIG. 12, it can be enumerated the case where $SiO_2$ and acrylic crosslinked particles of a low refractive index difference Δn might be effective for further reducing the amount of speckles $\sigma_{PAR}$. Typically, a sufficient reduction in the amount of speckles σPAR was achieved within a density range of about 5 vol % to 30 vol %. Moreover, according to the constructions of FIGS. 10A and 11A, the re-increase in the amount of speckles in the case of high density dispersion is not remarkably observed, and a tendency of saturation is exhibited. Such the effect is caused by the flattening of the near-field pattern and the easiness of dispersion uniformity due to the use of the particle that has a comparatively low refractive index difference and a large particle size.

Even in the case of $TiO_2$ and the styrenic particles having a comparatively large refractive index difference, it is possible to secure eye safety by increasing the particle size and applying the same to the construction of this eye-safe light source device. However, in the case of particularly $TiO_2$ particles, the influence of the hiding power was particularly large, and the producible optical output was extremely reduced in a dispersion density range in which the speckles were further reduced according to the results of FIGS. 7B and 7D. Moreover, in contrast to the fact that the amount of speckles $\sigma_{PAR}$ tended to saturate at a density of about $10^{-2}$ in the case of the dispersion of the $SiO_2$ particles (symbol x in FIG. 12) only or the acrylic particles (symbol Δ in FIG. 12) only, a more excellent characteristic was obtained by dispersing the subordinate scatterers of a comparatively small particle size and a high refractive index in mixture at a density of about 0.01 vol % to 0.1 vol % (+: $SiO_2$+$TiO_2$, ▲: acrylic+$TiO_2$), and little influence was received from the hiding power.

As described above, it was found to be preferable to mix and disperse the main scatterers of a comparatively low refractive index difference (typically about 0.05≦Δn≦0.2) and a large particle size (q≧approx. 10) with the subordinate scatterers of a high refractive index difference (Δn≧approx. 0.2) and a small diameter (q≦approx. 10) like the aforementioned $TiO_2$ in the construction that used a combination of the multipath reflection of the wall surface of the recess portion and the multiple scattering of the scatterers. By blending at a comparatively low density within the permissible range from the viewpoint of speckle reduction, a sufficient speckle reducing effect can be obtained by making the operation of uniforming the intensity distribution of the secondary planar light source of the main scatterers compatible with the output efficiency through a simpler dispersion process.

Moreover, it is acceptable to dispersedly arrange different scatterers spatially separated as described above or to constitute the first region of a laminate constructed of two layers or a plurality of layers by changing the dispersion densities of the layers instead of carrying out the aforementioned mixed dispersion. For example, it is acceptable to constitute 90 percent of the region located adjacent to the semiconductor laser out of the first region of a dispersion layer that has the scatterers at a density of 10 vol % and provide a thin layer in which scatterers that have a comparatively small particle size and a high refractive index difference of a size parameter q of about 1 to 10 are dispersed at a density of 1 vol % in the 10 percent of the region in its upper portion when a sufficient multiple scattering characteristic cannot be obtained even if scatterers of a comparatively large particle size of a size parameter q of 10 to 50 are uniformly dispersed at a density of 15 vol %. It is sometimes the case where the preferable multiple scattering characteristic can be found by optimizing the aforementioned conditions (size parameter q and dispersion density) even if the uppermost layer of the multi-layered first region is a polydispersion including agglomerates. By thus forming the first region into a multi-layer, the total cost becomes disadvantageous although the difficulties in optimizing the dispersion process are reduced.

Although the semiconductor lasers that emits light from one end surface are employed for the sake of simplicity in FIGS. 10A and 11A, the uniformity of the near-field pattern can be improved more easily by employing a semiconductor laser of the type that emits light from both end surfaces in each of the constructions. With regard to the speckle reducing effect, there is observed no significant difference between one point light source and the two point light sources although the semiconductor laser of the type that emits light from both end surfaces has a slight superiority. Therefore, it is preferable to employ the high-power semiconductor laser, which emits light from one end surface and of which the mass production technology has been established for optical disc applications and so on in terms of cost. Moreover, as a modification example of the wall surface of the recess portion that forms the first region, the cross-sectional configuration of the cylindrical portion viewed from above in the optical axis direction of the lens portion of the second region is not always required to be circular. It is desirable that the cross-sectional configuration of the cylindrical portion is axially symmetrical to the optical axis of the semiconductor laser. However, the configuration may be an arbitrary configuration such as a polygon, and the spatial coherency can be reduced more effectively by dividing the optical axis of the semiconductor laser into at least three or a plurality of portions with this arrangement.

Although the first region and the second region, which are the constituent elements of the multiple scattering optical system extremely effective for reducing the coherency of the high-power semiconductor laser have been described in detail hereinabove, the characteristics of the semiconductor laser itself of another constituent element has not been described in detail. The characteristics of the semiconductor laser employed in this eye-safe light source device will be described below.

As already described above, the typical spectral linewidth of the single body of a semiconductor laser is about 10 MHz, and the coherence length is at least several meters. The detailed description of the multiple scattering optical system described hereinabove is actually based on the evaluation results of the eye-safe light source device equipped with the semiconductor laser of such characteristics.

Particularly, as a high-power semiconductor laser as a communication light source suitable for an Si detector, the GaAs/AlGaAs-based ridge stripe structure is most common, and the semiconductor laser of the 780-nm band conventionally mass-produced for CD-R/RW has sometimes been used without modification because of an advantage in terms of cost. As a semiconductor laser to be mounted on a light source device for wireless optical communications of high-speed and high-power operation supposed by this invention, the existing 780-nm band lasers for optical discs and the 980-nm band lasers for EDFA (Erbium-Doped Optical Fiber Amplifier) are not always be optimum.

In the wavelength band of 880 nm to 920 nm, the threshold current and the temperature characteristic of the semiconductor laser are remarkably improved in comparison with those of the 780-nm band device in addition to the fact that the wavelength band is close to the peak sensitivity wavelength of Si. Typically, in contrast to the fact that the threshold current of the 780-nm band device of a cavity length of 600 μm is about 35 mA, a current of 15 mA and a temperature characteristic value T0 of not smaller than about 160 K are obtainable at the wavelength of, for example, 890 nm. Such characteristics, which can be theoretically expected from the characteristics of the InGaAs active layer element of the 980-nm band, have been actually scarcely examined in detail for a semiconductor laser. The present inventors conducted examinations for the device structure paying attention to the coherency of the semiconductor laser while attempting a cost reduction by establishing a maximum compatibility with the 780-nm AlGaAs-based semiconductor laser in terms of the manufacturing processes. As a result, it was found that the following prominent operation and effects were able to be obtained by adopting a GaAsP ternary system material or an InGaAsP quaternary system material advantageous to higher output operation with an Al-free arrangement for a quantum well barrier layer or a light guide layer in addition to the use of the active layer including InGaAs.

For example, a light guide layer is provided in the layer structure of a semiconductor laser, and the material of the light guide layer is provided by InGaAsP. In the InGaAsP mixed crystal system serving as the light guide layer on the GaAs substrate, a miscibility gap (growth condition incapable of obtaining a complete mixed crystal) exists. Spatial fluctuations can be generated in the composition of the light guide layer taking advantage of this phenomenon. Timewise fluctuations are generated in the laser emission wavelength by this action, and timewise coherency is reduced. It was found that speckles were able to be reduced extremely effectively by combining such a semiconductor laser with the multiple scattering optical system of this invention.

Typically, if crystal growth is carried out by using the reduced pressure MOCVD (Metal Organic Chemical Vapor Deposition) method, and the photoluminescence of the single body of light guide layer is subjected to mapping in the wafer, it is possible to find a crystal growth condition in which the deviation of the peak wavelength intraplanar distribution becomes about 5 nm to 30 nm and the average size of its spatial distribution becomes about 10 μm. For example, it is proper to reduce a growth temperature Tg by about 50° C. to 200° C. with respect to the normal growth optimum temperature for obtaining a uniform quality thin film. As a result, it was confirmed that the compositional fluctuations were able to be generated without causing a reduction in the crystalline quality to such an extent that optical loss was caused in the light guide layer according to the device characteristics.

In this case, the normal growth optimum temperature (condition) is a condition in which the intraplanar uniformity of photoluminescence and its intensity almost become optimum, and the temperature is generally set higher than the spinodal decomposition temperature by 100° C. to 150° C. Moreover, the temperature is not set higher than the range of 100° C. to 150° C. so as to achieve matching with the growth conditions of other layers and particularly the active layer.

The condition in which the compositional fluctuations are generated is basically found through crystal growth at the spinodal decomposition temperature or a temperature below it. However, there are many parameters such as a flow channel configuration that greatly depend on each individual crystal growth system, and it is difficult to quantify a universal condition including a gas flow rate or the like.

Figure 13A:
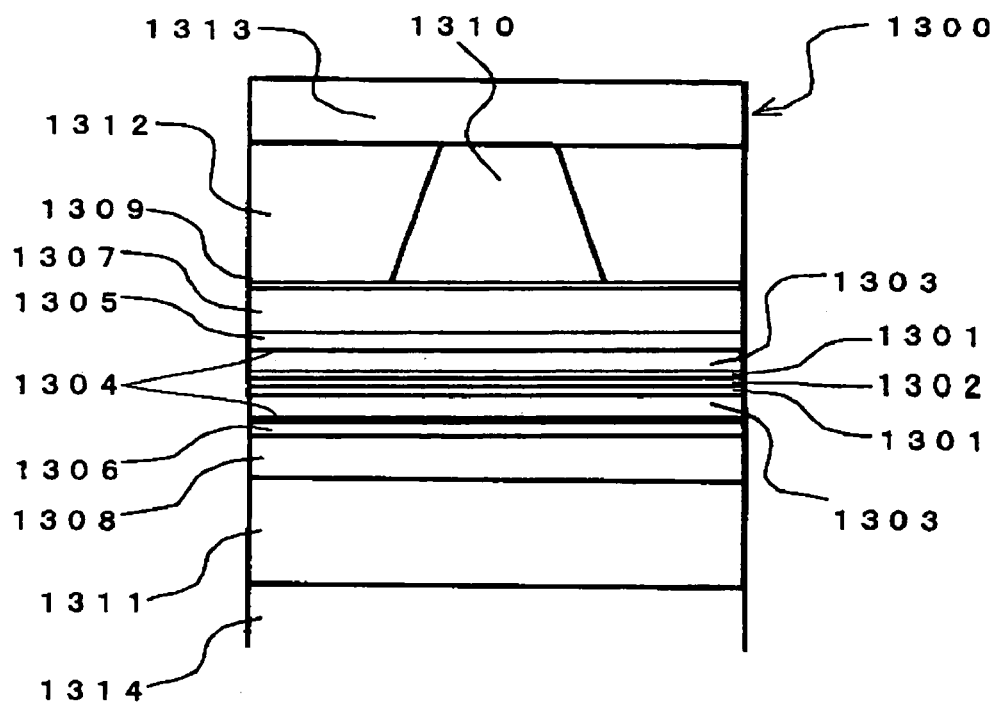
FIGS. 13A and 13B are views showing the structure of a high-power semiconductor laser particularly preferable for the above eye-safe light source device.
Figure 13B:
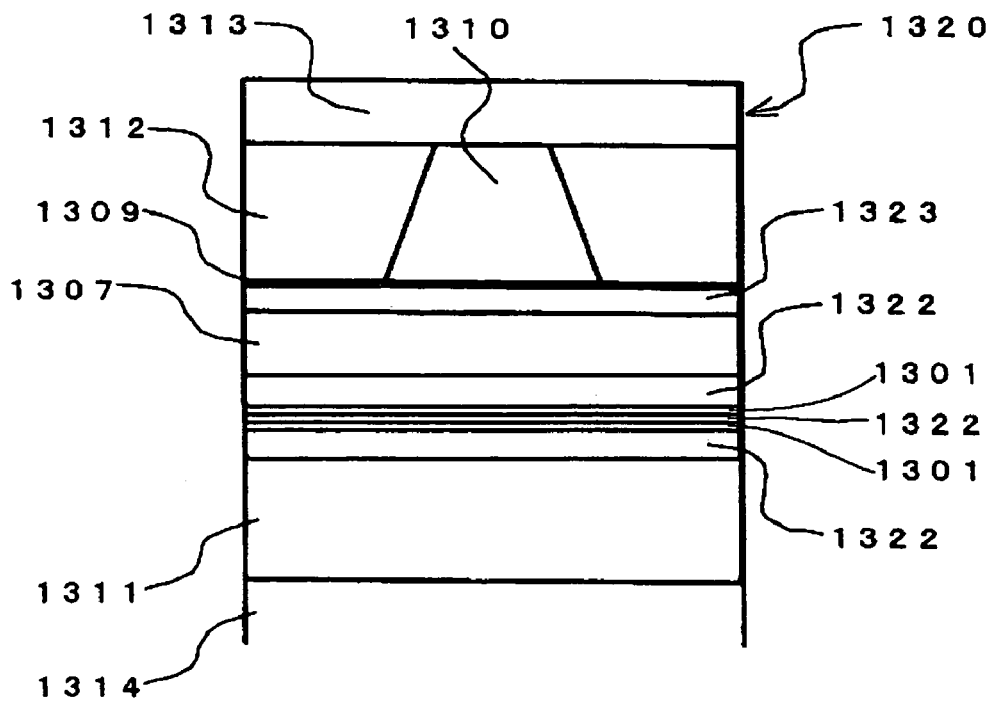

FIGS. 13A and 13B are sectional views showing the concrete structure of a semiconductor laser that has layers as described above. First of all, FIG. 13A will be described in detail.

As shown in FIG. 13A, an undoped DQW (Double Quantum Well) active layer is constructed of a 80-Å thick $In_{0.074}Ga_{0.926}As$ well layer 1301, a 50-Å thick $In_{0.100}Ga_{0.900}As_{0.657}P_{0.344}$ barrier layer 1302 (tensile strain: −0.5%) and a 200-Å thick light guide layer 1303 (tensile strain: −0.5%) having the same composition as that of the barrier layer 1302. In the semiconductor laser of the above-mentioned structure, the InGaAsP light guide layer 1303 mainly provides the action of compositional fluctuations according to the relation of the optical confinement coefficient. Such the active region is wholly grown at a comparatively low temperature of 515° C. The crystal mixture ratio of the light guide layer 1302 is an average value obtained from EPMA (X-ray microanalysis) when the normal crystal growth at a temperature higher than the spinodal temperature at which the compositional fluctuations do not occur is carried out. The energy gap of the barrier layer 1302 corresponds to $Al_{0.23}Ga_{0.77}As$. Moreover, the crystal growth temperature is shifted to the optimum growth temperature of 770° C. of an ordinary AlGaAs-based material in the 30-Å thick undoped $Al_{0.25}Ga_{0.75}As$ second light guide layer 1304 provided on both sides of the undoped DQW active layer.

The following describes the details of the layers optimized to the emission wavelength of 890 nm as an example of the whole device structure. In FIG. 13A, there are shown a 0.1-μm thick p-type $Al_{0.40}Ga_{0.60}As$ third light guide layer 1305, a 0.1-μm thick n-type $Al_{0.40}Ga_{0.60}As$ third light guide layer 1306, a 0.135-μm thick p-type $Al_{0.50}Ga_{0.50}As$ first cladding layer 1307, a 0.20-m thick n-type $Al_{0.50}Ga_{0.50}As$ first cladding layer 1308, a 30-Å thick undoped GaAs etching stop layer 1309, a 1.28-μm thick p-type $Al_{0.478}Ga_{0.522}As$ second cladding layer 1310, a 2.3-μm thick n-type $Al_{0.425}Ga_{0.575}As$ second cladding layer 1311, an n-type $Al_{0.70}Ga_{0.30}As$ block layer 1312, a p++ type GaAs cap layer 1313 and an n-type GaAs layer 1314 as a buffer and a substrate.

The semiconductor laser 1300 was applied to the multiple scattering optical system of which the construction was shown in FIG. 6A of the third embodiment. Styrenic crosslinked particles of an average particle size of 0.8 μm similar to those of FIG. 6A are used as the scatterers, which are dispersed at a density of 10 wt % in a thermosetting type silicone gel used as the dispersion base material. The amount of speckles $\sigma_{PAR}$ of the eye-safe light source device that employs this semiconductor laser 1300 was reduced to approximately ½ to 1/10 (not shown) in comparison with the value obtained with the construction of the eye-safe light source device of FIG. 6A with regard to both the near-field pattern and the far-field pattern. The semiconductor lasers previously shown as the constituent elements of FIGS. 6A, 7A, 7C, 10A and 11A have a structure constructed of only the classic GaAs/AlGaAs for CD-R/RW except for the fact that active layer well layer is the same InGaAs DQW. That is, the device is a laser device in which the compositional fluctuations as in the semiconductor laser 1300 do not exist.

As described above, it was clarified that the semiconductor laser 1300 having the spatial compositional fluctuations of the InGaAsP layer was extremely effective for speckle reduction as the constituent element of the multiple scattering optical system of this invention. The eye-safe light source device equipped with the semiconductor laser 1300 exhibited a spectral band width of about 1.5 nm as a timewise integral value although it was single-humped during the CW operation at 100 mW, and a device lifetime of not shorter than 2000 hours was obtained at least at 70° C. with this characteristic maintained. Moreover, it was also found that the expansion of the spectral linewidth became more remarkable if the injection current was modulated with a large amplitude of 100 $mA_{p-p}$.

Then, the eye-safe light source device of FIG. 6A of the third embodiment, the semiconductor laser 1300 and the eye-safe light source device of FIG. 6A equipped with the semiconductor laser 1300 were each subjected to the measurement of the coherence length Lc by means of a Michelson interferometer through a spatial filter. As a result, it was confirmed that the coherence length Lc was reduced by one or more orders of magnitude in the two devices that employed the semiconductor laser 1300 as a light source element, and the coherence length Lc was shorter in the form of a module between these two devices. That is, it was also confirmed that return light was generated on the optical axis of the semiconductor laser due to the coherent backscattering peak since the first region of the multiple scattering optical system of this invention is located adjacent to the semiconductor laser in addition to the fact that the timewise coherency was significantly reduced in comparison with the normal laser in the semiconductor laser 1300, and this had the effect of reducing the timewise coherency independently of the operation of increasing the spectral linewidth of the semiconductor laser 1300 itself.

As described above, the timewise coherency can be reduced by introducing the light guide layer that has spatially minute compositional fluctuations inside the semiconductor laser and giving dynamic fluctuations to the oscillation frequency (wavelength).

Further, the structure of another semiconductor laser that has a similar operation will be described with reference to FIG. 13B. The same reference numerals are given to the same layers as those of FIG. 13A. In this case, a p-type $In_{0.379}Ga_{0.621}As_{0.251}P_{0.749}$ light guide layer 1323 is newly provided apart from the active region, and the compositional fluctuations are generated only in the light guide layer 1323. In order to secure the optical confinement coefficient and remarkably obtain the effect of reducing the timewise coherency, the light guide layer 1323 is made to have a comparatively great thickness of 450 Å and roughly lattice matched to the GaAs substrate. The growth temperature of the light guide layer 1323 was lowered to 680° C. (spinodal decomposition temperature is about 780° C.). Moreover, changeover of the growth temperature between the above-mentioned layer and the (Al)GaAs layers 1307 and 1309 located on both sides is achieved by providing a waiting time in the crystal growth stage of the (Al)GaAs layers 1307 and 1309. Moreover, the barrier layer 1321 and the first light guide layer 1322 in the active region in this case are made of undoped $Al_{0.25}Ga_{0.75}As$ and grown at the same growth temperature of 650° C. as that of the InGaAs layer 1301.

It was clarified that an almost similar effect of reducing the timewise coherency was obtained by approximately equating the optical confinement coefficient of the light guide layer 1303 and the light guide layer 1323 that had equivalent compositional fluctuations as a result of performing speckle evaluation similar to that of FIG. 13A by means of the semiconductor laser 1320 that had the device structure of FIG. 13B.

The introduction of the InGaAsP layer that has the compositional fluctuations in place of the normal AlGaAs layer in the structure of the semiconductor laser is not limited only to the layer shown in the two semiconductor lasers of FIGS. 13A and 13B. That is, the above-mentioned arrangement can be applied to any one or an arbitrary combination of the quantum well barrier layer 1302, the light guide (SCH) layer 1303 located adjacent to it and the light guide layer 1322 newly provided. Particularly, for the comparatively thin barrier layer 1302 inside the multiquantum well structure or the like, there can be employed a ternary system represented by $Ga_{1-X}As_YP_{1-Y}$ (0<X<1, 0<Y<1) including the lattice mismatch system or a quaternary system represented by $In_XGa_{1-X}As_YP_{1-Y}$ (0<X<1, 0<Y<1). Otherwise, in the laser device that attaches importance to the temperature characteristic rather than a high power, it is effective to add, for example, an AlGaAsSb layer that has a distortion as a layer for blocking the overflow of electrons from the active layer to the inside of the active layer or its neighborhood. Also, in this case, it is needless to say that the effects of the InGaAsP layer on speckle reduction can be obtained quite similarly independently of an improvement in the temperature characteristic. Furthermore, it is possible to generate spatial fluctuations in the layer thickness and the composition also in the aforementioned AlGaAsSb electron blocking layer by devising various crystal growth conditions of MOCVD, MBE (Molecular Beam Epitaxy) or the like.

Further, by intentionally carrying out three-dimensional growth in an island-like configuration and remarkably generating the intraplanar distribution of layer thickness during the crystal growth of the strained quantum well layer 1301 (InGaAs), a pseudo gain grating can be formed. As a result of performing evaluation in a module state similar to the above, there was observed a speckle reducing effect due to the spectral linewidth increase operation similarly to the aforementioned InGaAsP layer. However, there was observed the tendency that the linearity of the IL characteristic was impaired when the pseudo gain grating was employed.

It is needless to say that a further coherency reducing effect can be generated by combining layer structures that have spatial fluctuations in at least one of the composition or layer thickness inside the semiconductor laser. However, from the viewpoint of the reliability of the semiconductor laser, it is rather preferable to obtain the spectral linewidth increasing effect by the InGaAsP light guide layer 1323 or the like located apart from the active region and carry out growth for obtaining the satisfactory crystalline quality of the quantum well layer 1301 itself.

The expansion of the spectral linewidth due to the pseudo grating operation as described above is attributed to the fact that the phase of the structure in the real space is obscure as the whole cavity or the fact that the particle size is typically a few times as large as the wavelength and the Bragg condition is not accurately satisfied as is apparent from its formation method. On the other hand, in comparison with the semiconductor laser constituted of only a layer that has complete smoothness or no (or extremely little) compositional fluctuations, the quantity of overlap of the spatial fluctuations of the gain or equivalent refractive index with the stationary wave severely changes every longitudinal mode. Therefore, the threshold gain becomes minimized in a specified mode, and the tendency of single longitudinal mode oscillation occurs. In fact, according to the measurement example of the single body of the laser chip, the laser chip operated with the single longitudinal and transverse modes maintained up to at least CW 100 mW, and the linearity of the current-to-optical output characteristic was also satisfactory. Although kink or mode hopping sometimes occurs at a high power attributed to the aforementioned effect depending on the device, there is obtained a sufficient characteristic for carrying out intensity modulation with a large amplitude in a binary form like wireless optical communications.

FIFTH EMBODIMENT

This invention is not limited to the molded products that have been concretely described hereinabove and lead frame base products on the resin substrate in using an arbitrary semiconductor laser in combination with the multiple scattering optical system unlimitedly to the semiconductor lasers 1300 and 1320 of which the spectral linewidth are extended as shown in FIGS. 13A and 13B. That is, as shown in FIG. 14, the multiple scattering optical system of this invention can be constituted by employing a small-sized CAN package of a diameter of 3.5 mm and 5.6 mm.

Figure 14:
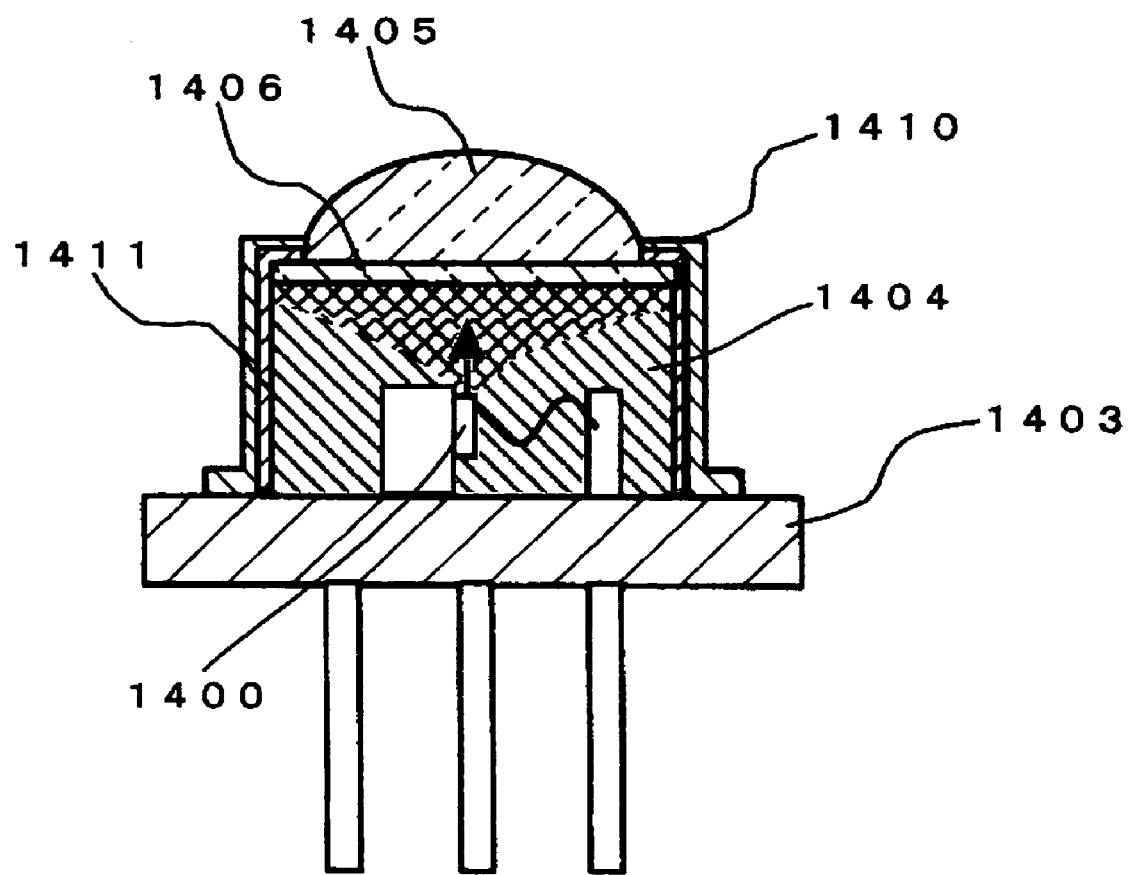
FIG. 14 is a sectional view showing the construction of the eye-safe light source device of a fifth embodiment of this invention.

As shown in FIG. 14, a semiconductor laser 1400 is die-bonded and wire-bonded to a stem 1403 similarly to an ordinary packaging. Further, a first region 1404 of the multiple scattering optical system is formed by internally filling a cap 1410 with a silicone gel in which scatterers are dispersed. Particularly, when the diffused light scatters to the inner wall surface of the cap 1410, it is preferable to avoid the problem of accumulation of photoabsorption by the inner wall portion peculiar to the multiple scattering optical system. That is, it is proper to provide the inner wall of the cap 1410 by a metal layer 1411 that has a high reflectance to incident light at all angles by subjecting the wall to surface processing of Au plating or silver paste coating instead of the normal Ni plating or the like. With this arrangement, a further speckle reducing effect and near-field pattern flatness are remarkably improved as already described.

Moreover, an ordinary cap sealing process is changed to the aforementioned silicone gel hardening process in this case. Further, an epoxy resin layer 1405 having lens operation is formed as the magnifier of the second region of the multiple scattering system on a cap glass 1406. As described with reference to FIGS. 9B and 9C, by adjusting the die-bonding position of the semiconductor laser on the stem, the thickness and the radiuses of curvature of the epoxy layer so that the desired radiant intensity distribution can be obtained, a distance from the secondary planar light source formed at the interface between the first region 1404 and the cap glass 1406 to the top of the epoxy resin layer 1405 that is the lens portion can be set to a preferable value.

The difference of the semiconductor laser structure of the aforementioned multiple scattering optical system was evaluated similarly to the evaluation performed for the mold module as described above. As a result, it was confirmed that the amount of speckles $\sigma_{P4R}$ of the near-field pattern was reduced to the level of at least about ⅓ to ⅒ when the semiconductor laser 1300 (shown in FIG. 13A) was mounted in comparison with the case of an ordinary InGaAs/AlGaAs-based laser free from compositional fluctuations or the like.

In this case, in the construction of the multiple scattering optical system described in FIGS. 2 through 12 of the first through fourth embodiments, the first region and the second region have been brought in direct contact with each other, and the secondary planar light source with effectively reduced coherency has been formed at the interface. In contrast to this, in the eye-safe light source device of FIG. 14, this first region 1404 and the epoxy resin layer 1405 are put in contact with each other with interposition of the cap glass 1406. However, as is apparent from the purport of this invention that has been described hereinabove, the region of the combination of the epoxy resin layer 1405 and the cap glass 1406, which contain no scatterer, operate as the second region of the multiple scattering optical system in this case.

More in detail, the scattered light emitted from the secondary planar light source formed at the interface between the first region 1404 and the cap glass 1406 is incident on the glass layer (1406) of a refractive index of 1.6 from the region in which the silicone gel of a refractive index of 1.4 serves as the base material and further incident on the epoxy resin layer 1405 of a refractive index of 1.5. Although a discontinuous refractive index plane exists at the interface between the glass layer (1406) and the epoxy resin layer 1405, a paraxial focal point is formed of these two layers (cap glass 1406 and epoxy resin layer 1405) on the semiconductor laser 1400 side similarly to the previously described constructions, and the fact that the position is located deeper than the secondary planar light source can easily be shown. Therefore, it is evident that the two layers of the glass layer (1406) and the epoxy resin layer 1405 totally operate as the second region of the multiple scattering optical system of this invention.

As described above, the first region and the second region of the multiple scattering optical system of this invention can be subjected to the modifications of forming the inside of the first and second regions into a multi-layer and so on so long as the regions have the operations described hereinabove. It is to be noted that, when a layer having a refractive index relatively lower than that of another region inside the second region or the base material of the first region and a great refractive index difference of, for example, not smaller than 0.1 is included in the second region, the scattered light incident from the first region is totally reflected at a considerable rate, and the process of re-incident on the first region from the second region becomes remarkable. In this case, the effect of reinforcing the scattering characteristic of the first region is obtained, and the influence of the hiding power is actualized according to circumstances. However, by optimizing the portions in correspondence with this, a preferable multiple scattering optical system can be obtained.

SIXTH EMBODIMENT

Figure 15A:
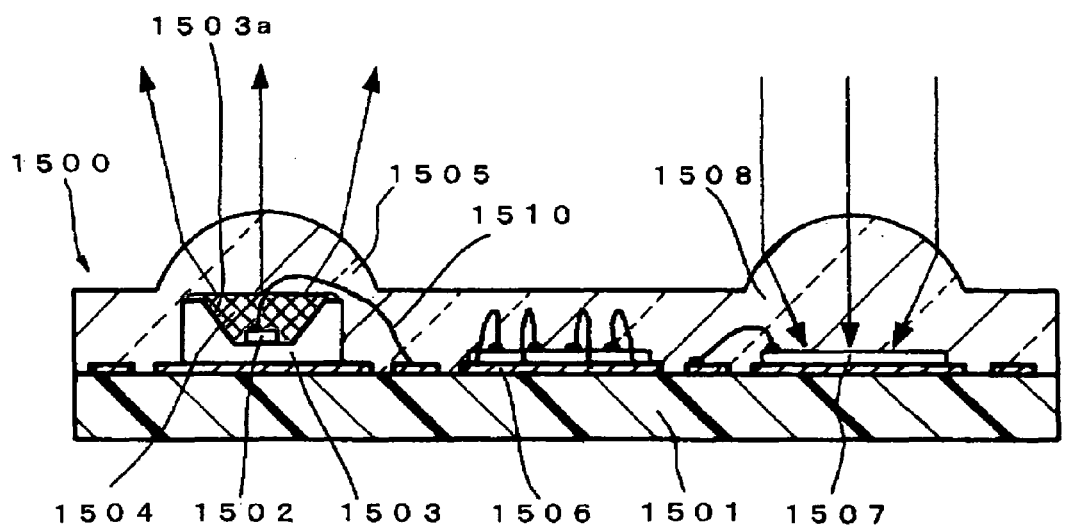
FIG. 15A is a sectional view showing the construction of an optical communication module in which the above eye-safe light source device is employed.

FIG. 15A is a sectional view showing the construction of an optical communication module for wireless optical communications employing the eye-safe light source device of the sixth embodiment of this invention.

First of all, in an embodiment as shown in FIG. 15A, a semiconductor laser 1502 of an emission wavelength of 890 nm, a drive IC (Integrated Circuit) 1506 in which a drive circuit and a reception circuit are integrated and a 250-µm thick Si-pin photodiode 1507 are mounted as active elements on a 500-µm thick FR4 substrate (glass epoxy resin substrate) 1501 that serves as a support of the optical communication module. The semiconductor laser 1502 is provided with the structural features of an average stripe width of 2.5 µm, a cavity length of 500 µm, an AR/HR end surface coating, an InGaAs single quantum well active layer and so on and has a COD level of 280 mW.

The semiconductor laser 1502 is die-bonded to a metal base 1503 on which a recess portion 1503a that has a conical mounting top and a wall surface of an inclination angle of 45° similarly to the aforementioned description is formed. Moreover, the metal base 1503 has a total thickness of 500 µm, the recess portion 1503a has a depth of 300 µm, and smooth Ag plating is provided on its entire outermost surface. Although no description is provided for the details of the overall circuit configuration of the optical communication module, portions are electrically connected via an Au wiring pattern on the FR4 substrate 1501 by wire bonding. Moreover, terminals of Vcc, GND, Tx/Rx and so on are drawn out and arranged for soldering from a side surface to the back surface of the FR4 substrate 1501.

Further, the recess portion 1503a of the metal base 1503 is filled with a silicone gel in which $TiO_2$ of an average particle size mode Ds of 0.3 µm (q=2.1) is dispersed by a percentage by weight of 2 wt %, forming a first region 1504 of the multiple scattering optical system. Particularly, by injecting a dispersion gel (silicone gel) so as to cover also the upper surface of the opening of the recess portion 1503a, the Au wire 1510 and the metal base 1503 are effectively prevented from being short-circuited. Moreover, the entire optical communication module is sealed by transfer-molding an epoxy resin that has not undergone intentional scatterer dispersion. A sufficient number of samples were evaluated, and there were obtained a full width at half maximum of about 1.2 mm and a speckle amount average value $<\sigma_{PAR}>=0.025\pm0.001$ as average values including measurement errors with regard to the near-field pattern. Moreover, the far-field pattern was a sharp cutoff pattern free from a skirt trailing, and there were obtained a full width at half maximum of about 300 and a speckle amount average value $<\sigma_{PAR}>=0.022\pm0.001$.

In this case, the particularly important feature in the embodiment of FIG. 15A is that the first region 1504 is located adjacent to the semiconductor laser 1502 and exists only inside the recess portion 1503a of the metal base 1503. With this arrangement, the second region 1505 of the multiple scattering optical system that is the transmission system lens portion and the aforementioned sealing resin including a reception system lens 1508 can be collectively formed through an identical process in addition to the spatial (or timewise) coherency reducing effect in the first region 1504 as described hereinabove. That is, no scatterer is contained in the sealing resin including the transmission system lens portion (1505) and the reception system lens 1508, and therefore, the configuration of the reception system lens 1508 and a distance to the photodiode 1507 can be optimally designed independently of the multiple scattering optical system on the transmission side.

As described above, it is possible to concurrently provide a transmission section that has a multiple scattering optical system and satisfies the Class 1 eye safety and a reception section that includes no multiple scattering optical system and makes a wider FOV (Field of View) and a high sensitivity compatible. Moreover, it was confirmed that the optical communication module 1500 of FIG. 15A was manufactured with high yield as a subminiature electric component having a total thickness of 1.6 mm including the FR4 substrate and widths of 7 mm×2 mm and sufficient reliability was possessed under the use condition of −40° C. to +85° C.

Figure 15B:
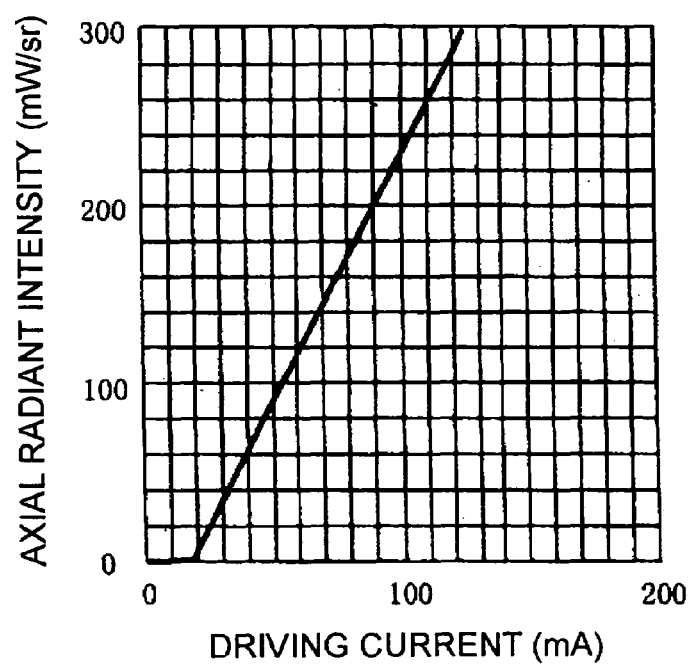
FIG. 15B is a graph showing the current-to-optical output characteristic at the room temperature of the transmission section of the above optical communication module.
Figure 16:
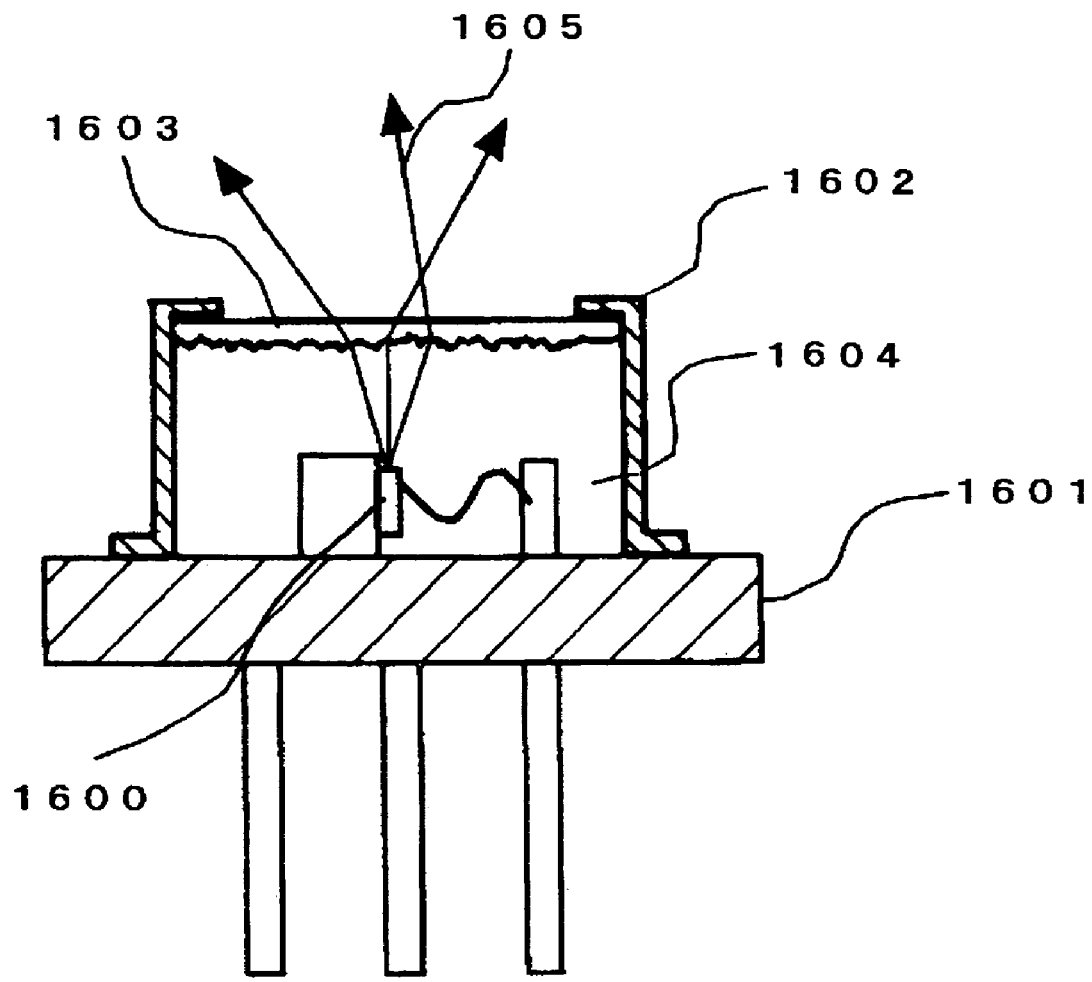
FIG. 16 is a view showing the construction of a conventional light source device in which a diffuser is employed.

FIG. 15B shows a current-to-optical output characteristic at the room temperature in the transmission section of the optical communication module 1500. An operating current was 120 mA and an operating voltage was 1.8 V during the typical 100-mW operation (on-axis radiant intensity: 295 mW/sr). Moreover, the bandwidth of the transmission system was measured directly from a terminal not via the driver IC 1506, and it was confirmed that there was no power penalty up to at least 500 MHz that was the limit of the measurement device, and the speed-up potential was not impaired at all as a light source equipped with a semiconductor laser.

In connection with the first through sixth embodiments, the eye-safe light source devices each of which employs a single narrow-stripe high-power semiconductor laser have been described as a semiconductor light-emitting device. However, the semiconductor light-emitting device that has a superiority in the photoelectric conversion efficiency with respect to LED, is not limited to this, and it is acceptable to apply this invention to light source devices that employ various light source elements of varied timewise and spatial coherencies, such as an array laser of a plurality of stripes, a broad area laser, SLD and so on.

According to the light source device of this invention, by adopting a semiconductor laser of the near infrared region of which the mass production effect is high and the output increase technology is advanced in a small-sized resin-sealed optical communication module equipped with a semiconductor laser, there can be concurrently achieved low-current high-power operation, high-speed operation and the securing of speckle free Class 1 eye safety at a minimum cost. As a result, the key device of an inexpensive, high-speed wireless optical communication system can be provided without sacrificing convenience by controlling the beam emission angle.

Particularly, by adopting a semiconductor laser that has InGaAs provided in the active layer and oscillates within the wavelength range of 880 nm to 920 nm as a semiconductor light-emitting device of the light source device of this invention, the threshold current and the operating current are extremely lowered, and high-power operation is stably carried out with an APC (Automatic Power Control) free or bias free simple circuit. Further, by employing an inexpensive Si photodiode for the photodetector, the cost performance of the wireless optical communication system can be remarkably improved.

The effects obtained by the individual constructions of the multiple scattering optical systems of the light source devices disclosed in this invention are as follows.

The multiple scattering optical system constructed of the first region that contains the scatterers at a relatively high density and is located adjacent to the semiconductor laser and the second region that is located adjacent to the first region and extended to a free space is provided, and the second region is made to operate as a magnifier with respect to at least the principal portion of the secondary planar light source formed at the interface between the first region and the second region. With this arrangement, by effectively generating multiple scattering that reduces spatial coherency of the laser beam in the extremely minute first region and mainly controlling the angular distribution characteristic of the radiant intensity in the second region, the optimization of the portions can be separately achieved. Moreover, by setting the density of the scatterers included in the second region to one tenth or less of that of the first region, the unnecessary skirt trailing outwardly of the half-value angle of the radiant intensity is restrained. Thus, the eye safety of the near-field pattern and the shaping of the far-field pattern can be made compatible with a simple optical system.

Moreover, by undergoing multiple scattering at least a few times as a transport optical depth in the minute first region located adjacent to the semiconductor laser, the single secondary planar light source that has the desired apparent light source size at the interface between the first region and the second region is formed, and the Class 1 eye safety can be secured. That is, the local peak structure of the near-field pattern that has an expansion of about 0.01 mm to 0.1 mm is scaled down in size and made indistinct. Moreover, the probability distribution of the PAR amplitude of the near-field pattern comes to be regarded as a Gaussian distribution, and the amount of speckles $\sigma_{PAR}$ can be reduced to an extremely low level on the order of $10^{-2}$ or below it.

Moreover, the second region operates as the magnifier for at least the principal portion of the secondary planar light source formed at the interface between the first region and the second region, the probability of the occurrence of local overlap of optical paths at a low angle is reduced through the process of conversion from the near-field pattern to the far-field pattern from the second region to the free space while efficiently collecting also the scatter components at a comparatively wide angle. Therefore, a far-field pattern of a high uniformity of radiant intensity and sharp cutoff is formed with the far-field pattern speckles restrained. As described above, it is possible to make a preferable optical characteristic compatible with the securing of eye safety even in the minute multiple scattering optical system.

Moreover, the diameter mode Ds of the scatterer that is the constituent element of the first region has its size parameter q selected from the range of approximately 1 to 50. In the multiple scattering optical system that uses no multipath reflection, the size parameter q is a scatterer that satisfies the range of 1 to 15 and more preferably the range of 1 to 10, and scatterers roughly having a refractive index difference $\Delta n \geq 0.15$ with respect to the dispersive medium are mainly dispersed. Moreover, in the multiple scattering optical system that concurrently uses multiple scattering and multipath reflection, scatterers having a comparatively low refractive index difference of a size parameter q of 10 to 50 are mainly dispersed.

Moreover, a plurality of particle size distribution peaks are possessed within the range of the size parameter, and a plurality of scatterers of the materials of different refractive indexes are dispersed in mixture. With the above arrangement, eye safety is secured by effectively resulting the speckles while solving the problems of the difficulties in monodispersion at a high density, the nonuniformity of the near-field pattern and the skirt trailing of the far-field pattern. With regard to the relation between the size parameter q and the refractive index difference $\Delta n$ of the scatterers mainly dispersed as the base material of the first region, a criterion for selecting the desirable particle species can be obtained by sealing the size parameter q so that a product $\Delta n \cdot q$ falls within a range of approximately two to eight or particularly proximate to three.

By carrying out the high density dispersion so that the average nearest neighbor distance of the scatterers in the first region becomes approximately twenty times or less than the particle size mode Ds, a dispersion condition in which the spatial coherency is reduced extremely efficiently inside a minute volume on the millimeter order, can easily be found. Moreover, frequency fluctuations induced by the return light can be generated in the semiconductor laser itself.

Moreover, by constituting the first region of a gel-like or rubber-like material (elastomer) as the base material, the first region can be stably maintained even through the process like the transfer molding during which a high pressure is applied while obtaining a uniform dispersion at a volume ratio of 0.5 vol % to 30 vol % or particularly at a scatterer density of 1 vol % to 10 vol %. Particularly, a silicone gel of which the viscosity before hardening is not greater than about 6000 mPa·s is suitably used with a simple inexpensive dispersion and kneading device. Furthermore, by dispersing the scatterers in the gel-like or rubber-like base material and providing the first region adjacent to the semiconductor laser, a heat radiation property and a stress alleviating effect are obtained, and the coherent backscattering is generated, allowing the timewise coherency of the semiconductor laser to be reduced.

Moreover, the semiconductor laser is directly or indirectly fixed on the bottom surface of the recess portion constructed of the wall surface and the bottom surface that have a metal layer at least part of the outermost surfaces, and at least part of the wall surface and/or of the bottom surface that constitute the recess portion serves as a reflective surface to the scattered light in the first region and as a retention surface for defining the configuration of the first region. With this arrangement, the dimensions of the multiple scattering region can be clearly defined, and the scatterer density can be controlled. Particularly, due to the arrangement that the metal layer on the outermost surface constitutes the recess portion, the scattered light generated in the first region that is stably formed and retained in the recess portion has its waves guided toward the second region as a whole. Particularly, by using silver for the metal layer on the outermost surface, the reflectance at the interface that has the aforementioned waveguiding effect can be improved, and the problem of the accumulation of photoabsorption peculiar to the multiple scattering can be restrained.

Moreover, the metal layer on the outermost surface is continuously formed so that the substances other than the metal are not exposed at least in the principal portion within a range in which the scattered light spatially distributed in the first region reaches. With this arrangement, the scattered light spatially distributed in the first region can be effectively prevented from leaking in the directions (toward the substrate side and so on) other than the optical axis direction, and this allows the light source size to be definite without causing a loss of the optical output and allows the spatial coherency to be efficiently reduced.

Moreover, by making the surface of the metal layer formed in at least part of the wall surface of the recess portion serve as the reflective surface for changing the optical axis direction of the outgoing beam of the semiconductor laser toward the interface between the first region and the second region, the scattering optical path length is effectively extended, and at least initial scattering (irregular reflection) is generated on the reflective surface obtained through the simple process, allowing a sufficient multiple scattering effect to be obtained even in a small-sized multiple scattering optical system.

In the above-mentioned construction, the size parameter q of the mainly dispersed scatterers should preferably satisfy the range of approximately 1 to 15 and particularly the range of 1 to 10. With this arrangement, the ballistic straight light component is effectively attenuated, and the optical output that can be used as a light source is efficiently obtained. The refractive index difference Δn between the base material and the scatterers of the first region is set not smaller than 0.1 and particularly not smaller than 0.15, and this allows a preferable scattering characteristic to be obtained in the multiple scattering optical system.

Moreover, the aforementioned construction allows a satisfactory optical characteristic free from loss of the optical output to be obtained by constituting the eye-safe minute multiple scattering optical system most easily and alleviating the influence of the hiding power of the scatterers. Moreover, the end surface emitting type semiconductor laser can be mounted in a simple die bonding form so that the optical axis of the outgoing beam of the semiconductor laser becomes approximately parallel to the bottom surface of the recess portion and manufactured at low cost.

By mixing and dispersing the main scatterers that have a comparatively small particle size of a size parameter q of about 1 to 15 with the subordinate scatterers that have a comparatively large particle size of a size parameter q of not greater than about 50, a condition that satisfies eye safety while facilitating the dispersion process is found. Moreover, also by forming the first region into a laminate of the portion mainly constructed of the scatterers of a comparatively small particle size of a size parameter q of about 1 to 15 and the portion mainly constructed of the scatterers of a relatively large particle size identical to or different from the above-mentioned scatterers, the simplification of the dispersion process and the speckle reducing effect can be made compatible.

Moreover, at least the principal part of the wall surface that constitutes the recess portion is served as the reflective surface that converts a plurality of times the optical axis of the output light of the semiconductor laser. Particularly, there is provided a construction in which, when the principal portion of the wall surface is made to have a specified inclination angle and no scatterer is assumed to exist, the light reaches the opening of the recess portion by a reflection frequency of about two times to five times. With this arrangement, even in a multiple scattering optical system in which the thickness of the second region is thin in the optical axis direction, sufficient multiple scattering and light output efficiency can be made compatible, and the speckle reduction can be achieved by remarkably improving the uniformity of the secondary planar light source.

Moreover, the recess portion has its diameter expanding toward the opening, and the aspect ratio r that is the depthwise ratio with respect to the diameter of the bottom surface of the recess portion and the angle θ [deg] between the normal line of the wall surface and the optical axis of the semiconductor laser satisfy the relation:

$\max\{2r,3\} \leq \theta \leq 20r.$

With this arrangement, the preferable optimum conditions concerning the multiple scattering for speckle reduction and the accompanying problem of the accumulation of photoabsorption by the metal layer can be found.

In the above-mentioned construction, the size parameter q of the scatterers mainly dispersed in the first region is set within the range of approximately 10 to 50 and particularly within the range of 15 to 40. With this arrangement, the near-field pattern can be made uniform more effectively, and the size of the apparent light source can easily be extended. Moreover, when the scatterers of a comparatively large particle size are mainly contained, limitations on the combination of the base material and the kneading device in the dispersion process is alleviated. Moreover, an eye-safe light source device can be constituted without adding an extra cost factor by mounting the general end surface emitting type high-power semiconductor laser by simple die bonding.

Moreover, in the first region, the opening portion and the bottom surface portion of the recess portion have almost the same cylindrical cross-sectional configuration, and the aspect ratio r of the recess portion and the angle θ made between the normal line of the wall surface of the recess portion and the optical axis of the semiconductor laser satisfy the relation:

$a \tan(r/5) \leq \theta \leq a \tan(r/2).$

The wall surface of the recess portion is provided inclined relatively to the optical axis of the emission port of the semiconductor laser. With this arrangement, even in a multiple scattering optical system in which the magnifier of the second region has a small thickness in the optical axis direction, sufficient multiple scattering and light output efficiency can be made compatible, and the speckle reduction can be achieved with the uniformity of the secondary planar light source remarkably improved.

In the above-mentioned construction, the size parameter q of the scatterers mainly dispersed in the first region is set within the range of approximately 10 to 50 and particularly within the range of 15 to 40. With this arrangement, the near-field pattern can be made uniform more effectively, and the apparent light source size can easily be enlarged.

In the construction in which the combination of the multipath reflection and the multiple scattering is used, it is proper to mix and disperse the main scatterers of a comparatively low refractive index difference and a large particle size (about $q \geq 10$) with the subordinate scatterers of a comparatively high refractive index difference and a small particle size (about $q \leq 10$). This arrangement facilitates making compatible the speckle reduction of the secondary planar light source and the uniforming of the light intensity distribution with the improvement in the output efficiency of the optical output. Moreover, it is proper to laminate the portion constructed of the main scatterers of a comparatively low refractive index difference (typically about $\Delta n \leq 0.1$) and a large particle size (about $q \geq 10$) and the portion constructed of the subordinate scatterers of a comparatively high refractive index difference (about $\Delta n \geq 0.1$) and a small particle size (about $q \leq 10$) for the formation of the first region. This arrangement facilitates making compatible the speckle reduction of the secondary planar light source and the uniforming of the light intensity distribution with the improvement in the output efficiency of the optical output.

Moreover, by using the light source device employing a semiconductor laser that has the active layer including the InGaAs layer on the GaAs substrate and has an emission wavelength within the range of 880 nm to 920 nm as a transmission means, it becomes possible to perform optical transmission between the device and the Si photodiode that serves as a reception means having a peak sensitivity wavelength in the wavelength band of 880 nm to 920 nm. Therefore, by employing this light source device, an optical communication module, which satisfies the Class 1 eye safety and concurrently has the lowest cost and excellent electrical and optical characteristics, can be constituted for wireless optical communications.

Particularly, by making the other layers that have the active layer including the InGaAs quantum well layer on the GaAs substrate and a relatively high optical density of, for example, the quantum barrier layer and the light guide layer located adjacent to the InGaAs layer and the light guide layers provided besides the active layer and so on Al free by constituting the layers including at least one of a ternary layer and a quaternary layer expressed by $In_xGa_{1-x}As_yP_{1-y}$ ($0 \leq x < 1$, $0 < Y < 1$), it becomes possible to provide an eye-safe light source device that can produce the highest output in the wavelength band of 880 nm to 920 nm. Therefore, by employing this light source device, an optical communication module, which satisfies the Class 1 eye safety and concurrently has the lowest cost and excellent electrical and optical characteristics, can be constituted for wireless optical communications.

Moreover, by forming the layer that intentionally causes the fluctuations in the layer thickness during the crystal growth of the InGaAs quantum well layer, the quantum barrier layer, the light guide layer, the light guide layer provided besides the active layer or the like of the semiconductor laser, the spectral linewidth during the laser operation can be extended. Moreover, by forming the layer that intentionally causes local compositional fluctuations, the spectral linewidth can be extended. By employing the semiconductor laser that has such spatial fluctuations in the composition or layer thickness, the speckles can be further reduced by a synergistic effect with the multiple scattering optical system.

Particularly, when a semiconductor laser that includes a GaAsP ternary system material or an InGaAsP quaternary system material in its layer structure is employed as the quantum well barrier layer and the light guide layer located adjacent to the InGaAs active layer or the light guide layer provided besides the active layer, the pseudo DFB (Distributed Feedback) type laser that has the pseudo grating of obscure phase in the cavity can be constituted by devising the growth condition. With this arrangement, the timewise coherency was able to be reduced by one or more orders of magnitude in comparison with an ordinary high-power semiconductor laser. While extending the spectral linewidth as described above, sufficient reliability of high-power operation is secured. By modulating the injection current with a large amplitude, a further effect of extending the spectral linewidth can be obtained. Therefore, a light source device that has a low operating current characteristic on the highest level as a high-power semiconductor laser can be constituted while obtaining the Class 1 eye safety with the speckles almost completely lost.

Moreover, it is also preferable to include the AlGaAsSb layer that has a distortion as an electron blocking layer inside or in the vicinity of the active layer in the laser device that attaches importance particularly to the temperature characteristic than the high power. It is needless to say that the various effects of the ternary or quaternary layer expressed by InGaAs and $In_xGa_{1-x}As_yP_{1-y}$ can be similarly obtained also in this case. Furthermore, by devising various crystal growth conditions of MOCVD, MBE (Molecular Beam Epitaxy) or the like, the spatial fluctuations in the layer thickness and the composition can be generated also in the AlGaAsSb electron blocking layer.

Moreover, by virtue of the arrangement that at least part of the wire connected directly or indirectly to the semiconductor laser is located in the second region, the wire is peeled off together with the second region and disconnected to interrupt the electrification to the semiconductor laser even if the second region is damaged or peeled off during the electrification to the semiconductor laser. Therefore, the laser beam of high coherency can be prevented from directly entering the user's eyes, and this allows the safety to be further improved.

Moreover, in place of the mold type light source device on the resin substrate or the lead frame, this multiple scattering optical system is also allowed to utilize a CAN package device, which can be utilized as an extremely small-sized eye-safe light source device. Particularly, by forming each of the first region and the second region into a multi-layer, various modification examples can be constituted.

Moreover, it is proper to constitute a light source device in which the semiconductor laser is provided by a material system having an active layer that oscillates in the ultraviolet region, and its output light is subjected to wavelength conversion into white light and multiple scattering particularly in the first region and emitted to the outside. Otherwise, it is proper to constitute a projection type display module including the aforementioned light source device. With this arrangement, a subminiature low-power-consumption projection module that projects letter and image information on a wall surface or a paper surface can be provided at extremely low cost.

In the aforementioned light source device, the first region of the multiple scattering optical system is formed as the minute region located adjacent to the semiconductor laser, and therefore, the reception sensitivity is not deteriorated through integration and integrated module formation with a photodiode. Accordingly, there can be provided an unprecedented wireless optical communication module, which concurrently achieves the reduction in the size and cost on the same level as that of the existing IrDA transceiver and a high speed property and a wide communication area that is equivalent or superior to those of the existing optical wireless LAN products.

What is claimed is:

1. A light source device having a light source element from which output light is emitted to outside via a multiple scattering optical system, wherein
the multiple scattering optical system includes at least a
first region that is located adjacent to the light source element, and a second region that abuts on the first region and reaches the outside, of the first and second regions, at least the first region contains scatterers, and a density of the scatterers in the first region is higher than a density of scatterers in the second region, and the light source device has an amount of near-field pattern speckles $\sigma_{PAR}$ that is within a range of:

$\sigma_{PAR} \geq 8 \times 10^{-3}$.

2. The light source device as claimed in claim 1, wherein the device comprises a recess portion having a wall surface and a bottom surface that define the first region, wherein a metal layer is formed on at least part of the wall surface and/or of the bottom surface, and the light source element is directly or indirectly fixed to the bottom surface, and a surface of the metal layer formed on the at least part of the wall surface and/or of the bottom surface of the recess portion serves as a reflective surface to scattered light of the output light from the light source element.

3. The light source device as claimed in claim 2, wherein the metal layer on the at least part of the wall surface and/or of the bottom surface of the recess portion is continuously formed so that substances other than the metal are not exposed in a principal portion positioned within reach of the scattered light spatially distributed in the first region.

4. The light source device as claimed in claim 2, wherein a surface of a metal layer formed on at least part of a wall surface of a recess portion serves as a reflective surface that changes an optical axis direction of an outgoing beam of the light source element toward an interface between the first and second regions, and assuming that a size parameter q, which represents a relation between a particle size mode Ds of the scatterers and a center wavelength λ in a base material of the first region of the light source element, is expressed by:

$q = (2\pi/\lambda) \cdot (Ds/2)$, then the size parameter q of the first region falls within a range of approximately 1 to 15.

5. The light source device as claimed in claim 2, wherein the surface of the metal layer formed on at least part of the wall surface of the recess portion serves as a reflective surface that changes an optical axis direction of an outgoing beam of the light source element a plurality of times, and assuming that a size parameter q, which represents a relation between a particle size mode Ds of the scatterers and a center wavelength λ in a base material of the first region of the light source element, is expressed by:

$q = (2\pi/\lambda) \cdot (Ds/2)$, then the size parameter q of the first region falls within a range of approximately 10 to 50.

6. The light source device as claimed in claim 5, wherein an opening of the recess portion has a diameter larger than that of the bottom surface, and assuming that a ratio of a depth to the diameter of the bottom surface of the recess portion is given as an aspect ratio, r, and an angle made between a normal line of the wall surface of the recess portion and the optical axis of the outgoing beam of the light source element is θ [deg], then a condition expressed by:

$\max\{2r, 3\} \leq \theta \leq 20r$ is satisfied.

7. The light source device as claimed in claim 5, wherein at least part of the wall surface of the recess portion forms a cylinder whose top and bottom have approximately same sectional configurations, and assuming that a ratio of a depth to a diameter of the cylinder of the recess portion is given as an aspect ratio, r, and an angle made between a normal line of the wall surface of the recess portion and the optical axis of the outgoing beam of the light source element is θ [deg], then a condition expressed by:

$\max\{a \tan(r/5), 3\} \leq \theta \leq a \tan(r/2)$ is satisfied.

8. The light source device as claimed in claim 1, wherein the second region has a lens portion.

9. The light source device as claimed in claim 8, wherein the lens portion serves as a magnifier for at least a principal portion of a secondary planar light source formed at an interface between the first region and the second region.

10. The light source device as claimed in claim 1, wherein, assuming that a size parameter q, which represents a relation between a particle size mode Ds of the scatterers and a center wavelength λ in a base material of the first region of the light source element, is expressed by:

$q = (2\pi/\lambda) \cdot (Ds/2)$, then the particle size mode Ds of the scatterers is within a range that allows the size parameter q to fall within a range of approximately 1-50, and at least the first region includes a portion where the scatterers are dispersed at a high density so that an average nearest neighbor distance of the scatterers becomes equal to or smaller than twenty times the particle size mode Ds of the scatterers.

11. The light source device as claimed in claim 1, wherein the first region employs a gel-like or rubber-like material as the base material.

12. The light source device as claimed in claim 1, wherein the light source element is a semiconductor laser.

13. The light source device as claimed in claim 12, wherein the semiconductor laser has an active layer including an InGaAs layer on a GaAs substrate and an emission wavelength within a range of from 880 nm to 920 nm inclusive.

14. The light source device as claimed in claim 13, wherein the semiconductor laser has the active layer including the InGaAs layer on the GaAs substrate and includes at least one of a ternary layer or a quaternary layer which are expressed by $In_X Ga_{1-X} As_Y P_{1-Y}$ ($0 \leq X < 1$, $0 < Y < 1$).

15. The light source device as claimed in claim 12, wherein the semiconductor laser has spatial fluctuations in at least one of its composition or its layer thickness.

16. The light source device as claimed in claim 15, wherein the semiconductor laser has the active layer including the InGaAs layer on the GaAs substrate and includes at least one of a ternary layer or a quaternary layer expressed by $In_X Ga_{1-X} As_Y P_{1-Y}$ ($0 \leq X < 1$, $0 < Y < 1$) which has spatial fluctuations in its composition.

17. The light source device as claimed in claim 1, wherein at least part of a wire connected directly or indirectly to the light source element exists inside the second region.

18. An optical communication module employing the light source device claimed in claim 1 as a transmission means.

19. The light source device as claimed in claim 1, wherein assuming that a transport mean free path of the scatterers is $l_{AVE}$ and a dimension in the optical axis direction of the first region is L, then a transport optical depth $L/l_{AVE}$ is approximately 1 to 100.

20. The light source device as claimed in claim 1, wherein the amount of near-field pattern speckles $\sigma_{PAR}$ is within a range expressed by:

$$\sigma_{PAR} \leq 3 \times 10^{-1}.$$

21. The light source device as claimed in claim 1, wherein the light source element has an optical waveguide structure.

* * * * *